(12) United States Patent
Blais et al.

(10) Patent No.: US 10,635,989 B2
(45) Date of Patent: Apr. 28, 2020

(54) CONTROLLED-PHASE QUANTUM LOGIC GATE

(71) Applicant: SOCPRA Sciences et Génie S.E.C., Sherbrooke, QC (CA)

(72) Inventors: Alexandre Blais, Sherbrooke (CA); Baptiste Royer, Sherbrooke (CA); Arne Loehre Grimsmo, Sherbrooke (CA)

(73) Assignee: SOCPRA Sciences et Génie s.e.c., Sherbrooke, QC (CA)

(*) Notice: Subject to any disclaimer, the term of this patent is extended or adjusted under 35 U.S.C. 154(b) by 47 days.

(21) Appl. No.: 16/068,199

(22) PCT Filed: Mar. 9, 2017

(86) PCT No.: PCT/CA2017/050316
§ 371 (c)(1),
(2) Date: Jul. 5, 2018

(87) PCT Pub. No.: WO2017/152287
PCT Pub. Date: Sep. 14, 2017

(65) Prior Publication Data
US 2019/0005403 A1    Jan. 3, 2019

Related U.S. Application Data

(63) Continuation of application No. 15/455,105, filed on Mar. 9, 2017, now Pat. No. 10,013,657.
(Continued)

(51) Int. Cl.
*G11C 11/44*    (2006.01)
*G06N 10/00*    (2019.01)
(Continued)

(52) U.S. Cl.
CPC .............. *G06N 10/00* (2019.01); *G11C 11/44* (2013.01); *H01L 39/025* (2013.01); *H01L 39/223* (2013.01)

(58) Field of Classification Search
CPC ...... G11C 11/44; G06N 99/002; H01L 39/025
(Continued)

(56) References Cited

U.S. PATENT DOCUMENTS 7,437,533 B2 * 10/2008 Ichimura ................ B82Y 10/00
250/526
7,779,228 B2 * 8/2010 Ichimura .............. G06N 99/002
250/526
(Continued)

*Primary Examiner* — Harry W Byrne
(74) *Attorney, Agent, or Firm* — Gowling WLG (Canada) LLP; Benoit Yelle

(57) ABSTRACT

A method and circuit QED implementation of a control-phase quantum logic gate $U_{CP}(\theta)=\text{diag}[1,1,1, e^{i\theta}]$. Two qubits $Q_i$, two resonators $R_a$, $R_b$ and a modulator. $Q_1$ and $Q_2$, each has a frequency $\omega_{qi}$ and characterized by $\hat{\sigma}_{zi}$. $R_a$ is associated with $Q_1$ and defined by a quantum non-demolition (QND) longitudinal coupling $g_{1z}\hat{\sigma}_{1z}(\hat{a}\dagger+\hat{a})$. $R_b$ is integrated into $R_a$, the QND second longitudinal coupling is defined by $R_a$ as $g_{2z}\hat{\sigma}_{2z}(\hat{b}\dagger+\hat{b})$ or, when $R_b$ is integrated into $R_a$, the QND second longitudinal coupling is defined by $R_a$ as $g_{2z}\hat{\sigma}_{2z}(\hat{a}\dagger+\hat{a})$ The modulator periodically modulates, at a frequency $\omega_m$ during a time t, the longitudinal coupling strengths $g_{1z}$ and $g_{2z}$ with respective signals of respective amplitudes $\tilde{g}_1$ and $\tilde{g}_2$. Selecting a defined value for each of t, $g_{1z}$ and $g_{2z}$ determines $\theta$ to specify a quantum logical operation performed by the gate. $Q_1$ and $Q_2$ are decoupled when either one of $g_{1z}$ and $g_{2z}$ is to set to 0.

16 Claims, 14 Drawing Sheets

Related U.S. Application Data

(60) Provisional application No. 62/305,778, filed on Mar. 9, 2016.

(51) Int. Cl.
*H01L 39/02* (2006.01)
*H01L 39/22* (2006.01)

(58) Field of Classification Search
USPC .......................................................... 365/162
See application file for complete search history.

(56) References Cited

U.S. PATENT DOCUMENTS

| | | | |
|---|---|---|---|
| 2007/0145348 A1* | 6/2007 | Ichimura ................ | B82Y 10/00 257/9 |
| 2009/0009165 A1* | 1/2009 | Ichimura ................ | B82Y 10/00 324/304 |

* cited by examiner

CONTROLLED-PHASE QUANTUM LOGIC GATE

CROSS REFERENCE TO RELATED APPLICATIONS

The present non-provisional patent application is a U.S. National Phase of International Patent Application PCT/CA2017/050316, filed Mar. 9, 2017, which is hereby incorporated by reference in its entirety and which claims priority based upon the prior U.S. provisional patent application entitled "PARAMETRICALLY MODULATED LONGITUDINAL COUPLING", application No. 62/305,778 filed on 2016 Mar. 9 in the name of "SOCPRA Sciences et Genie S.E.C." and based upon the U.S. non-provisional patent application entitled "PERIODICAL MODULATION OF LONGITUDINAL COUPLING STRENGTH FOR QUANTUM NON-DEMOLITION QUBIT READOUT", application Ser. No. 15/455,105 filed on 2017 Mar. 9 in the name of "SOCPRA Sciences et Genie S.E.C.", which are both incorporated herein in their entirety.

STATEMENT REGARDING U.S. FEDERALLY SPONSORED RESEARCH OR DEVELOPMENT

The invention was made under a contract with an agency of the U.S. Government. The name of the U.S. Government agency and Government contract number are: U.S. Army Research Laboratory, Grant W911NF-14-1-0078.

STATEMENT REGARDING PRIOR DISCLOSURES BY THE INVENTOR OR A JOINT INVENTOR

To the Applicant's knowledge, no public disclosure has been made, by the inventor or joint inventor or by another who obtained the subject matter publicly disclosed directly or indirectly from the inventor or a joint inventor, more than one (1) year before the effective filing date of an invention claimed herein.

TECHNICAL FIELD

The present invention relates to quantum computing and, more particularly, to information unit representation and/or manipulation in quantum computing.

BACKGROUND

Quantum computing is presented as the next computational revolution. Yet, before we get there, different problems need to be resolved. For instance, one needs to reliably store information in the form of a quantum bit (qubit), maintain the information reliably in the qubit and read the stored information reliably and repetitively (i.e., non-destructive readout). Another of the challenges of quantum computing is related to logic treatment of more than one qubit without forcing a defined state (i.e., providing one or more logical gates from different qubits in potentially overlapping states).

The present invention addresses at least partly the need for logic treatment of more than one qubit without forcing a defined state.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with a first set of embodiments, a first aspect of the present invention is directed to a circuit quantum electrodynamics (circuit QED) implementation of a control-phase quantum logic gate $U_{CP}p(\theta)=\text{diag}[1,1,1,e^{i\theta}]$. The circuit QED implementation comprises two qubits $Q_i$, two resonators $R_a$, $R_b$ and a modulator. A first qubit $Q_1$ and a second qubit $Q_2$, each has a frequency $\omega_{q1}$ and being characterized by $\hat{\sigma}_{zi}$. The resonator $R_a$ is associated with the qubit $Q_1$ and defined by a resonator frequency $\omega_{ra}$, a resonator electromagnetic field characterized by $\hat{a}^\dagger$ and $\hat{a}$, a longitudinal coupling strength $g_{1z}$ with the qubit $Q_1$, a first longitudinal coupling $g_{1z}\hat{\sigma}_{1z}(\hat{a}^\dagger+\hat{a})$. The second resonator $R_b$, when independent from $R_a$, is associated with the qubit $Q_2$ and is defined by a longitudinal resonator-resonator coupling $g_{ab}$ with $R_a$ and $R_b$ is further defined by a second resonator frequency $\omega_{rb}$, a second resonator electromagnetic field characterized by $\hat{b}^\dagger$ and $\hat{b}$, a second longitudinal coupling strength $g_{2z}$ with the qubit $Q_2$, a second longitudinal coupling $g_{2z}\hat{\sigma}_{2z}(\hat{b}^\dagger+\hat{b})$. When the second optional resonator $R_b$ is not independent from $R_a$ and integrated into $R_a$, then $R_a$ is associated with the qubit $Q_2$, the longitudinal resonator-resonator coupling $g_{ab}=1$, the second resonator electromagnetic field is characterized by $\hat{a}^\dagger$ and $\hat{a}$ where $\hat{b}^\dagger=\hat{a}^\dagger$ and $\hat{b}=\hat{a}$, the second resonator frequency $\omega_{rb}=\omega_{ra}$, the second longitudinal coupling strength $g_{2z}$ is between the qubit Q2 and $R_a$, the second longitudinal coupling $g_{2z}\hat{\sigma}_{2z}(\hat{b}^\dagger+\hat{b})$ is defined by $R_a$ as $g_{2z}\hat{\sigma}_{2z}(\hat{a}^\dagger+\hat{a})$. The modulator periodically modulates, at a frequency $\omega_m$ during a time t, the longitudinal coupling strengths $g_{1z}$ and $g_{2z}$ with respective signals of respective amplitudes $\tilde{g}_1$ and $\tilde{g}_2$. Selecting a defined value for each of t, $g_{1z}$ and $g_{2z}$ determines $\theta$ to specify a quantum logical operation performed by the control-phase quantum logic gate. The qubit $Q_1$ and the qubit $Q_2$ are decoupled when either one of the defined value of $g_{1z}$ and the defined value of $g_{2z}$ is to set to 0.

The circuit QED implementation may further comprise a transmitter for selectively providing a modulator activation signal to the modulator for activating the modulator for the duration t.

The circuit QED implementation may also further comprise a signal injector providing a squeezed input to diminish a which-qubit-state information. The squeezed input may optionally be a single-mode squeezed input or a two-mode squeezed input. The signal injector may rely on broadband squeezed centered at $\omega_{rb}$ and/or $\omega_{ra}$.

The qubit $Q_1$ and the qubit $Q_2$ may optionally be transmons each comprising two Josephson junctions with respectively substantially equivalent capacitive values and the modulator comprises an inductor-capacitor (LC) oscillator, the longitudinal coupling resulting from mutual inductance between the oscillator and the transmons, the oscillator varying a flux $\Phi_1$ in the qubit $Q_1$ and a flux $\Phi_2$ in the qubit $Q_2$. A 3-Wave mixing Josephson dipole element may optionally be used to couple the qubit $Q_1$ and the resonator $R_a$.

In accordance with the first set of embodiments, a second aspect of the present invention is directed to a method for specifying a quantum logical operation performed by a control-phase quantum logic gate $U_{CP}(\theta)=\text{diag}[1,1,1,e^{i\theta}]$. The circuit QED implementation comprises (I) two qubit $Q_i$, where i=1 corresponds to a first qubit $Q_1$ and i=2 corresponds to a second qubit $Q_2$, each having a frequency $\omega_{qi}$ and being characterized by $\hat{\sigma}_{zi}$; (II) a first resonator $R_a$, associated with the qubit $Q_1$, defined by a first resonator frequency $\omega_{ra}$, a first resonator electromagnetic field characterized by $\hat{a}^\dagger$ and $\hat{a}$, a first longitudinal coupling strength $g_{1z}$ with the qubit $Q_1$ and a first longitudinal coupling $g_{1z}\hat{\sigma}_{1z}$ ($\hat{a}^\dagger+\hat{a}$); (III) a second resonator $R_b$, such that, when the second resonator $R_b$ is independent from $R_a$, $R_b$ is associated with the qubit $Q_2$, a longitudinal resonator-resonator coupling $g_{ab}$ is defined and $R_b$ is further defined by: a second resonator frequency $\omega_{rb}$, a second resonator electromagnetic field characterized by $\hat{b}^\dagger$ and $\hat{b}$, a second longitudinal coupling strength $g_{2z}$ with the qubit $Q_2$, a second longitudinal coupling $g_{2z}\hat{\sigma}_{2z}(\hat{b}^\dagger+\hat{b})$ and (IV), when the second optional resonator $R_b$ is not independent from $R_a$ and integrated into $R_a$, $R_a$ is associated with the qubit $Q_2$, the longitudinal resonator-resonator coupling $g_{ab}=1$, the second resonator electromagnetic field is characterized by $\hat{a}^\dagger$ and $\hat{a}$ where $\hat{b}^\dagger=\hat{a}^\dagger$ and $\hat{b}=\hat{a}$, the second resonator frequency $\omega_{rb}=\omega_{ra}$, the second longitudinal coupling strength $g_{2z}$ is between the qubit $Q_2$ and $R_a$, the second longitudinal coupling $g_{2z}\hat{\sigma}_{2z}(\hat{b}^\dagger+\hat{b})$ is defined by $R_a$ as $g_{2z}\hat{\sigma}_{2z}(\hat{a}^\dagger+\hat{a})$. The method comprises periodically modulating, at a frequency $\omega_m$ during a time t, the longitudinal coupling strengths $g_{1z}$ and $g_{2z}$ with respective signals of respective amplitudes $\tilde{g}_1$ and $\tilde{g}_2$, selecting a defined value for each of t, $g_{1z}$ and $g_{2z}$ thereby fixing $\theta$ to specify the quantum logical operation performed by the control-phase quantum logic gate and setting at least one of the defined value of $g_{1z}$ and the defined value of $g_{2z}$ is to 0 to decouple the qubit $Q_1$ from the qubit $Q_2$.

Selecting the defined value for each of t, $g_{1z}$ and $g_{2z}$ may optionally comprise a selectively providing a modulator activation signal to the modulator for activating the modulator for the duration t.

The method may also further comprise providing a squeezed input to diminish a which-qubit-state information. The squeezed input may be a single-mode squeezed input, a two-mode squeezed input or may rely on broadband squeezed centered at $\omega_{rb}$ and/or $\omega_{ra}$.

The qubit $Q_1$ and the qubit $Q_2$ may optionally be transmons each comprising two Josephson junctions with respectively substantially equivalent capacitive values and modulating may optionally be performed by an inductor-capacitor (LC) oscillator, the longitudinal coupling resulting from mutual inductance between the oscillator and the transmons, the oscillator varying a flux $\Phi_1$ in the qubit $Q_1$ and a flux $\Phi_2$ in the qubit $Q_2$. A 3-Wave mixing Josephson dipole element may optionally be used to couple the qubit $Q_1$ and the resonator $R_a$.

In accordance with a second set of embodiments, a first aspect of the present invention is directed to a circuit quantum electrodynamics (circuit QED) implementation of a quantum information unit (qubit) memory having a qubit frequency $\omega_a$ and holding a value $\hat{\sigma}_z$. The circuit QED implementation comprises a resonator, a modulator and a homodyne detector. The resonator is defined by a resonator damping rate $\kappa$, a resonator frequency $\omega_r$, a resonator electromagnetic field characterized by $\hat{a}^\dagger$ and $\hat{a}$, a longitudinal coupling strength $g_z$, an output $\hat{a}_{out}$ and a quantum non-demolition (QND) longitudinal coupling $g_z\hat{\sigma}_z(\hat{a}^\dagger+\hat{a})$. The modulator periodically modulates the longitudinal coupling strength $g_z$ with a signal of amplitude $\tilde{g}_z$ greater than or equal to the resonator damping rate $\kappa$ and of frequency $\omega_m$ with $\omega_m\pm\kappa$ resonant with $\omega_r\pm$a correction factor. The correction factor is smaller than $|\omega_4/10|$ and the longitudinal coupling strength $g_z$ varies over time (t) in accordance with $g_z(t)=\bar{g}_z+\tilde{g}_z\cos(\omega_m t)$ with $\bar{g}_z$ representing an average value of $g_z$. The homodyne detector for measuring the value $\hat{\sigma}_z$ of the qubit memory from a reading of the output $\hat{a}_{out}$.

Optionally, the correction factor may be between 0 and $|\omega_r/100|$. The homodyne detector may measure the value $\hat{\sigma}_z$ of the qubit memory from a phase reading of the output $\hat{a}_{out}$. The signal amplitude $\tilde{g}_z$ may be at least three (3) times greater than the resonator damping rate $\kappa$ or at least ten (10) times greater than the resonator damping rate $\kappa$.

The circuit QED implementation may optionally further comprise a signal injector providing a single-mode squeezed input on the resonator such that noise on the phase reading from the output $\hat{a}_{out}$ is reduced while noise is left to augment on one or more interrelated characteristics of the output $\hat{a}_{out}$. The average value of $g_z$, $\bar{g}_z$ may be 0 and the single-mode squeezed input may be QND.

The qubit memory may be a transmon comprising two Josephson junctions with substantially equivalent capacitive values and the longitudinal modulator may an inductor-capacitor (LC) oscillator with a phase drop $\delta$ across a coupling inductance placed between the two Josephson junctions. The longitudinal coupling results from mutual inductance between the oscillator and the transmon and the oscillator may vary a flux $\Phi_x$ in the transmon. The transmon may have a flux sweet spot at integer values of a magnetic flux quantum $\Phi_0$, Josephson energy asymmetry of the transmon may be below 0.02 and $\Phi_x$ may vary by $\pm 0.05\Phi_0$ around $\Phi_x=0.9$. A 3-Wave mixing Josephson dipole element may optionally be used to couple the qubit and the resonator. The resonator may further be detuned from the qubit frequency $\omega_a$ by $|\Delta|\geq\tilde{g}_z$. The oscillator inductance may, for instance, be provided by an array of Josephson junctions or by one or more Superconducting Quantum Interference Device (SQUID).

In accordance with the second set of embodiments, a second aspect of the present invention is directed to a method for reading a value $\hat{\sigma}_z$ stored in a quantum information unit (qubit) memory having a qubit frequency $\omega_a$, with a resonator defined by a resonator damping rate $\kappa$, a resonator frequency $\omega_r$, a resonator electromagnetic field characterized by $\hat{a}^\dagger$ and $\hat{a}$, a longitudinal coupling strength $g_z$, an output $\hat{a}_{out}$ and a quantum non-demolition (QND) longitudinal coupling $g_z\hat{\sigma}_z(\hat{a}^\dagger+\hat{a})$. The method comprises, at a modulator, periodically modulating the longitudinal coupling strength $g_z$ with a signal of amplitude $\tilde{g}_z$ greater than or equal to the resonator damping rate $\kappa$ and of frequency $\omega_m$ with $\omega_m\pm\kappa$ resonant with $\omega_r\pm$a correction factor. The correction factor is smaller than $|\omega_r/10|$ and the longitudinal coupling strength $g_z$ varies over time (t) in accordance with $g_z(t)=\bar{g}_z+\tilde{g}_z\cos(\omega_m t)$ with $\bar{g}_z$ representing an average value of $g_z$. The method also comprises, at a homodyne detector, measuring the value $\hat{\sigma}_z$ of the qubit memory from a reading of the output $\hat{a}_{out}$.

Optionally, the signal amplitude $\tilde{g}_z$ may be at least three (3) times greater than the resonator damping rate $\kappa$ or at least ten (10) times greater than the resonator damping rate $\kappa$.

The method may further comprise, from a signal injector, providing a single-mode squeezed input on the resonator such that noise on the phase reading from the output $\hat{a}_{out}$ is reduced while noise is left to augment on one or more interrelated characteristics of the output $\hat{a}_{out}$. The average value of $g_z$, $\bar{g}_z$ may be set to 0 and the single-mode squeezed input may be QND.

Optionally, the qubit memory may be a transmon comprising two Josephson junctions with substantially equivalent capacitive values and the longitudinal modulator comprises an inductor-capacitor (LC) oscillator with a phase drop $\delta$ across a coupling inductance placed between the two Josephson junctions. The longitudinal coupling results from mutual inductance between the oscillator and the transmon and the oscillator varies a flux $\Phi_x$ in the transmon. The transmon may have a flux sweet spot at integer values of a magnetic flux quantum $\Phi_0$, Josephson energy asymmetry of the transmon may be below 0.02 and $\Phi_x$ may vary by $\pm 0.05\Phi_0$ around $\Phi_x=0$.

The method may also further comprise detuning the resonator from the qubit frequency $\omega_a$ by $|\Delta| \geq \tilde{g}_z$. Optionally, the oscillator inductance may be provided by an array of Josephson junctions or by one or more Superconducting Quantum Interference Device (SQUID).

BRIEF DESCRIPTION OF THE DRAWINGS

Further features and exemplary advantages of the present invention will become apparent from the following detailed description, taken in conjunction with the appended drawings, in which.

DETAILED DESCRIPTION

Figure 1:
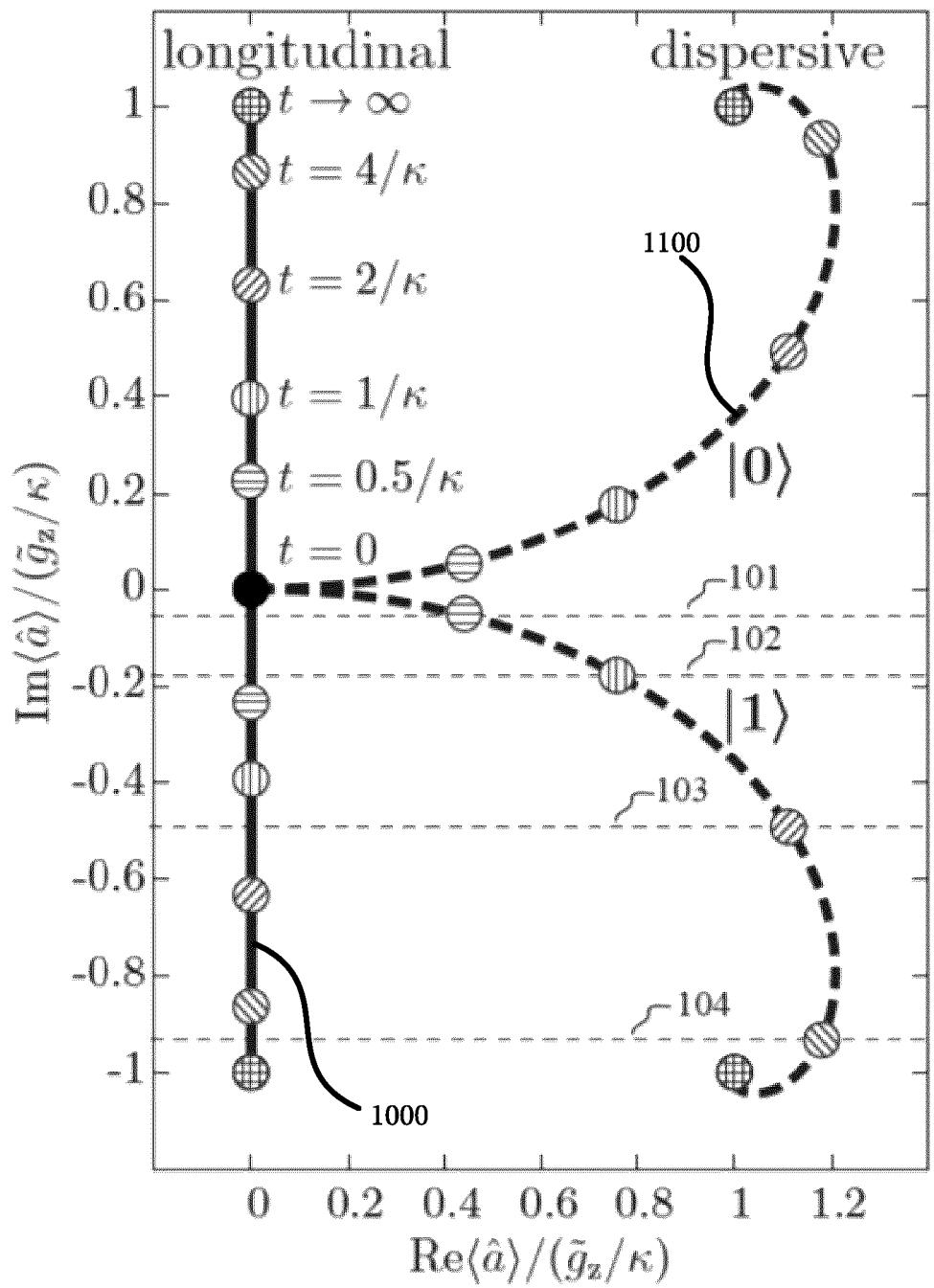
FIG. 1 is schematic representation of pointer state evolution in a phase space from an initial oscillator vacuum state.

In one set of embodiments, a controlled-phase gate based on longitudinal coupling is disclosed. The controlled-phase gate is obtained by simultaneously modulating the longitudinal coupling strength of two qubits to a common resonator or two coupled resonators. The resonator may also be presented equivalently with different terms such as an oscillator, a cavity or qubit-cavity. In contrast to the more common transversal qubit-cavity coupling, the magnitude of the resulting effective qubit-qubit interaction does not rely on a small perturbative parameter. As a result, this interaction strength can be made large, resulting in effective gate times and gate fidelities. The gate fidelity can be exponentially improved by squeezing the resonator field and the approach may be generalized to qubits coupled to separate resonators. The longitudinal coupling strength between a qubit and a resonator may also be referred to as longitudinal qubit-resonator interaction. Reference is made to the drawings throughout the following description.

In another set of embodiments, an effective quantum non-demolition (QND) qubit readout is disclosed by modulating longitudinal coupling strength between a qubit and a resonator. The longitudinal coupling strength between a qubit and a resonator may also be referred to as longitudinal qubit-resonator interaction. In one embodiment, the QND qubit readout is accomplished by modulating longitudinal coupling between a resonator and a qubit at the resonator frequency. The resonator may also be presented as an oscillator, a cavity or qubit cavity. The longitudinal coupling strength then provides a qubit-state dependent signal from the resonator. This situation is fundamentally different from the standard dispersive case. Single-mode squeezing can optionally be exploited to increase the signal-to-noise ratio of the qubit readout protocol. An exemplary implementation of the qubit readout is provided in circuit quantum electrodynamics (circuit QED) and a possible multi-qubit architecture is also exemplified. Reference is made to the drawings throughout the following description.

For quantum information processing, qubit readout is expected to be fast, of high-fidelity and ideally QND. In order to rapidly reuse the measured qubit, fast reset of the measurement pointer states is also needed. Combining these characteristics is essential to meet the stringent requirements of fault-tolerant quantum computation. Dispersive readout relies on coupling the qubit to an oscillator acting as pointer. With the qubit modifying the oscillator frequency in a state-dependent fashion, driving the oscillator displaces its initial vacuum state to qubit-state dependent coherent states. Resolving these pointer states by homodyne detection completes the qubit measurement. The dispersive readout approach is used with superconducting qubits and quantum dots, and is studied in a wide range of systems including donor-based spin qubits and Majorana fermions. The same qubit-oscillator interaction is used to measure the oscillator state in cavity QED with Rydberg atoms.

Embodiments of the present invention provide parametric modulation of longitudinal qubit-resonator interaction for a faster, high-fidelity and ideally QND qubit readout with a reset mechanism. Embodiments of the present invention show that the signal-to-noise ratio (SNR) of the qubit readout can be further improved with a single-mode squeezed input state on the resonator. Like dispersive readout, the approach presented herein is applicable to a wide variety of systems. Skilled people will readily recognize that the modulation principle presented herein could be applied outside of the superconductive context.

A quantum information unit (qubit) memory is provided with a qubit frequency $\omega_a$ characterized by $\hat{\sigma}_z$. A resonator is provided that is defined by a resonator damping rate $\kappa$, a resonator frequency $\omega_r$, a resonator electromagnetic field characterized by $\hat{a}^\dagger$ and $\hat{a}$, a longitudinal coupling strength $g_z$ and an output $\hat{a}_{out}$.

Conventional dispersive readout of $\hat{\sigma}_z$ relies on transversal qubit-resonator coupling defined with a Hamiltonian $H_x=g_x(\hat{a}^\dagger+\hat{a})\hat{\sigma}_z$. Embodiments of the present invention rely on longitudinal coupling (or longitudinal interaction) between the resonator and the qubit memory defined with a Hamiltonian $\hat{H}_z=g_z\hat{\sigma}_z(\hat{a}^\dagger+\hat{a})$. Despite the apparently minimal change, the choice of focusing the qubit readout on longitudinal coupling improves qubit readout. First, longitudinal coupling leads to an efficient separation of the pointer states. Indeed, $\hat{H}_z$ is the generator of displacement of the oscillator field with a qubit-state dependent direction.

Figure 2:
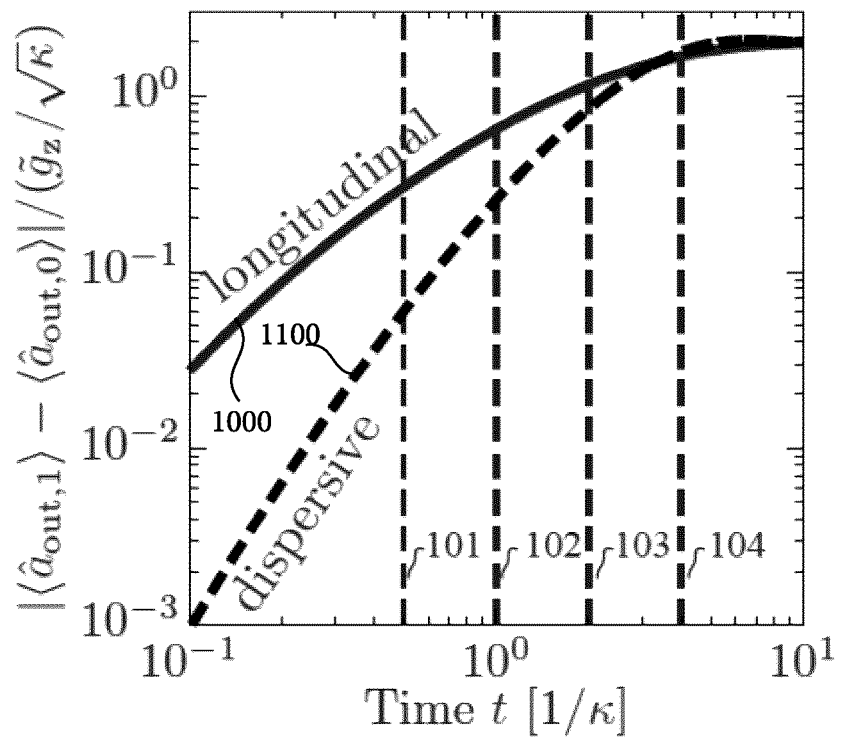
FIG. 2 is graph presenting pointer state separation in a phase space as a function of time.

FIG. 1 of the drawings provides a schematic representation of pointer state evolution of the intra-resonator field â in a phase space from an initial resonator vacuum state. FIG. 2 provides a corresponding graph presenting pointer state separation in a phase space as a function of time (t). Full lines 1000 relate to longitudinal modulation readout while dispersive readout for a dispersive shift $$\chi = \frac{\kappa}{2}$$

is illustrated by the dashed lines 1100. Evolution from the initial resonator vacuum state is illustrated in phase space by lines 1000 and 1100 after a certain time (t). Discrete times and steady-state (t→∞) are provided for illustrative purposes with similar times being depicted using similar hatching patterns on lines 1000 and 1100. Circle size around at each time are used to illustrate uncertainty on the corresponding measured value, but are not drawn to scale on FIG. 1. As can be appreciated, dispersive readout illustrated by the dashed lines 1100 on FIG. 1 provides for complex path in phase space and poor separation of the pointer states at short times. For this reason, even for identical steady-state separation of the pointers, longitudinal readout is significantly faster than its dispersive counterpart. On FIG. 2, pointer state separation is depicted for the resonator output field $\hat{a}_{out}$ as a function of time t. Vertical dashed lines (101 to 104) correspond to the same lines in FIG. 1.

The results depicted on FIG. 1 may be obtained using a modulator periodically modulating the longitudinal coupling strength $g_z$ with a signal of amplitude $\tilde{g}_z$ greater than or equal to the resonator damping rate $\kappa$ and of frequency $\omega_m$ with $\omega_m \pm \kappa$ resonant with $\omega_r \pm$a correction factor. The correction factor is $<\omega_r/10$, and may for instance be between 0 and $\omega_r/100$. In some embodiments, $\tilde{g}_z$ is at least 3 times $\kappa$ or at least 10 times $\kappa$. The longitudinal coupling strength $g_z$ varies over time (t) in accordance with $g_z(t)=\bar{g}_z+\tilde{g}_z \cos(\omega_m t)$ with $\bar{g}_z$ representing an average value of $g_z$. Using a homodyne detector, the value $\hat{\sigma}_z$ of the qubit memory is measured from a phase reading of the output $\hat{a}_{out}$.

Figure 3:
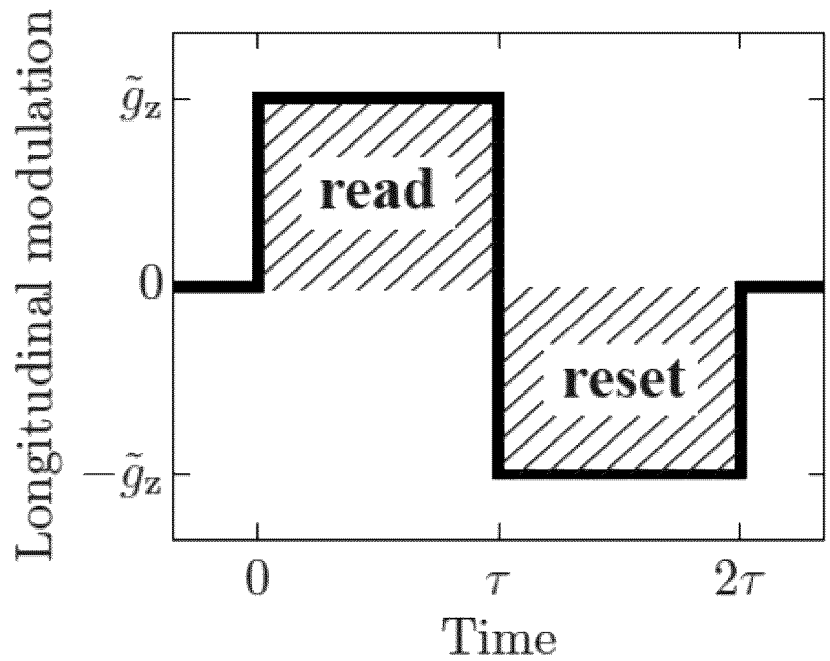
FIG. 3 is a graphical representation of different signal-to-noise ratios versus integration time different couplings.

FIG. 3 shows a logic depiction of an exemplary readout—reset cycle. After a measurement time $\tau$, longitudinal modulation amplitude $\tilde{g}_z$ is reversed (i.e., $-\tilde{g}_z$) during a time $\tau$ to move the pointer state to the origin irrespective of the qubit state.

As can be appreciated, larger pointer state separations is achieved using a longitudinal modulator because $\hat{H}_z$ commutes with the value of the qubit $\hat{\sigma}_z$ (also referred to as the measured qubit observable), resulting in an ideally QND readout. The situation is different from the dispersive case because $(\hat{H}_x|\hat{\sigma}_z)\approx 0$. In the dispersive regime, where the qubit-resonator detuning $\Delta$ is large with respect to $g_x$, non-QNDness manifests itself with Purcell decay and with the experimentally observed measurement-induced qubit transitions. For these reasons, the resonator damping rate $\kappa$ cannot be made arbitrarily large using and the measurement photon number $\bar{n}$ is typically kept well below the critical photon number $n_{crit}=(\Delta/2g_x)^2$. As a result, dispersive readout is typically slow (small $\kappa$) and limited to poor pointer state separation (small $\bar{n}$).

Under longitudinal coupling, the qubit-resonator Hamiltonian reads $(\hbar/2\pi) \hat{H}_z=\omega_r\hat{a}^\dagger\hat{a}+\frac{1}{2}\omega_a\hat{\sigma}z+g_z\hat{\sigma}_z(\hat{a}^\dagger+\hat{a})$ (referred to as Equation 1 hereinafter).

In steady-state, Equation 1 leads to a qubit-state dependent displacement of the resonator field amplitude $$\pm \frac{g_z}{\omega_r + \frac{i\kappa}{2}}.$$

A static longitudinal interaction is therefor of no consequence for the typical case where $\omega_r \ll g_z, \kappa$.

It is proposed herein to render the longitudinal interaction resonant during qubit readout by modulating the longitudinal coupling at the resonator frequency: $g_z(t)=\bar{g}_z+\tilde{g}_z \cos(\omega_m t)$. From the perspective of the longitudinal coupling and neglecting fast-oscillating terms, the following Equation 2 is obtained: $\hat{H}_z=\frac{1}{2}\tilde{g}_z\hat{\sigma}_z(a^\dagger+\hat{a})$ From Equation 2, it can be appreciated that a large qubit-state dependent displacement $$\pm \frac{\tilde{g}_z}{\kappa}$$

is realized. Even with a conservative modulation amplitude $\tilde{g}_z \sim 10\kappa$, the steady-state displacement corresponds to 100 photons and the two qubit states are easily distinguishable by homodyne detection. With this longitudinal coupling, there is no concept of critical photon number and a large photon population is therefore not expected to perturb the qubit. Moreover, as already illustrated in FIG. 1, the pointer states take an improved path in phase space towards their steady-state separation. As shown in FIG. 2, this leads to a large pointer state separation at short times.

The consequences of using longitudinal coupling for qubit measurement can be quantified with the signal-to-noise ratio (SNR). The SNR quantity is evaluated using $\hat{M}(\tau)=\sqrt{\kappa}\int_0^\tau \delta t[\hat{a}^\dagger_{out}(t)+\hat{a}_{out}(t)]$ the measurement operator for homodyne detection of the output signal $\hat{a}_{out}$ with a measurement time $\tau$. The signal is defined as $|\langle \hat{M} \rangle_1 - \langle \hat{M} \rangle_0|$ where $\{0,1\}$ refers to qubit state, while the imprecision noise is $[\langle \hat{M}_{N1}^2(\tau) \rangle \circ \langle \hat{M}_{N0}^2(\tau) \rangle]^{1/2}$ with $\hat{M}_N=\hat{M}-\langle \hat{M} \rangle$.

Combining these expressions, the SNR for the longitudinal case reads in accordance with Equation 3:

$$SNR_z = \sqrt{8}\,\frac{|\tilde{g}_z|}{\kappa}\sqrt{\kappa\tau}\left[1 - \frac{2}{\kappa\tau}\left(1 - e^{-\frac{1}{2}\kappa\tau}\right)\right]$$

This is to be contrasted to $SNR_\chi$ for dispersive readout with drive amplitude $\epsilon$ and optimal dispersive coupling $\chi=g_x^2/\Delta=\kappa/2$ in accordance with Equation 4:

$$SNR_\chi = \sqrt{8}\,\frac{|\epsilon|}{\kappa}\sqrt{\kappa\tau}\left[1 - \frac{2}{\kappa\tau}\left(1 - e^{-\frac{1}{2}\kappa\tau}\cos\frac{1}{2}\kappa\tau\right)\right]$$

Both expressions have a similar structure, making very clear the similar role of $\tilde{g}_z$ and $\epsilon$, except for the cosine in Equation (4) that is a signature of the complex dispersive path in phase space. For short measurement times $\kappa\tau\ll 1$, a favorable scaling is obtained for longitudinal modulation readout with $SNR_z \propto SNR_\chi/\kappa\tau$.

Figure 4:
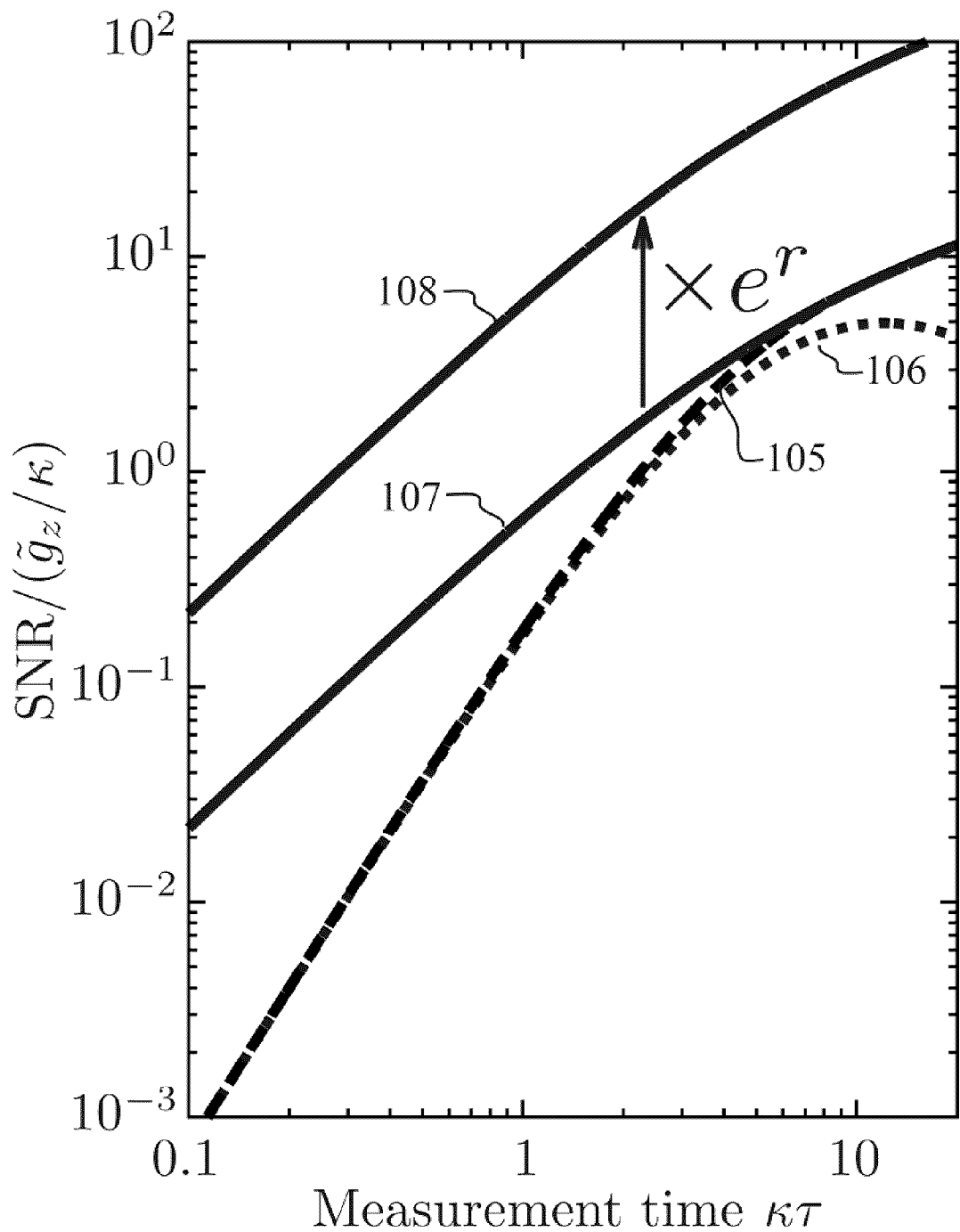
FIG. 4 is a graphical representation of SNR versus integration time for different couplings.

FIG. 4 shows a graphical representation of SNR versus integration time for longitudinal (107) and dispersive without Purcell decay (105) coupling. Even for equal steady-state separation ($\tilde{g}_z = \epsilon$), shorter measurement time are obtained for longitudinal coupling. SNR is shown in units of $\tilde{g}_z/\kappa$ as a function of integration time $\tau$. Longitudinal coupling (107) is compared to dispersive coupling (105) with $\chi=\kappa/2$ for the same steady-state separation, $|\tilde{g}_z|=|\epsilon|$. Line (106) accounts for Purcell decay in dispersive readout. Line (108) shows exponential improvement obtained for when a single-mode squeezed input state with $e^{2r}=100$ (20 dB).

Figure 5:
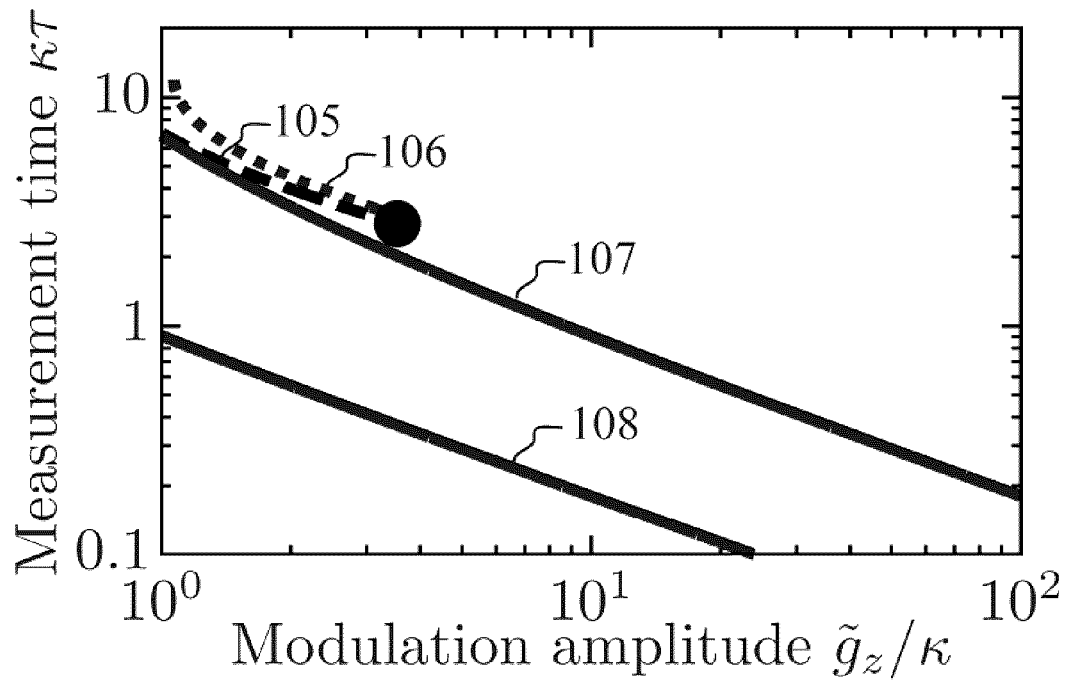
FIG. 5 is a graphical representation of the measurement time T required to reach a fidelity of 99.99%.
Figure 6:
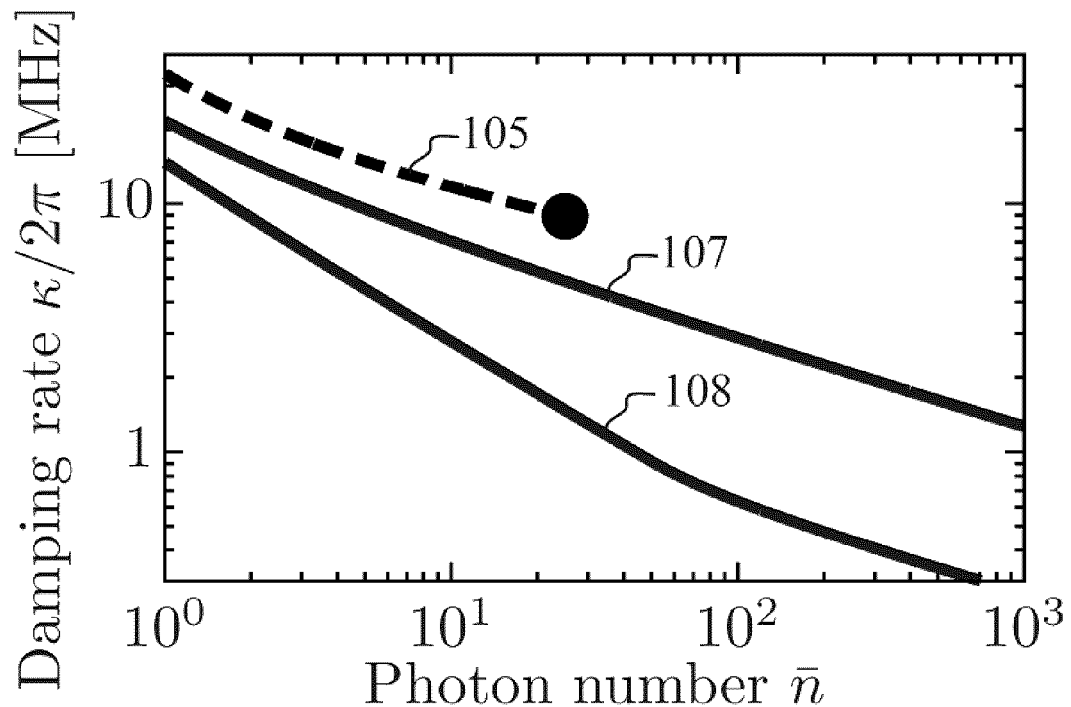
FIG. 6 is a graphical representation of resonator damping rate $\kappa/2\pi$ to reach a fidelity of 99.99% in 50 ns.

FIG. 5 provides a graphical representation of the measurement time $\tau$ required to reach a fidelity of 99.99% as a function of $\tilde{g}_z/\kappa$ (or $\epsilon/\kappa$ for the dispersive case). When taking into account the non-perturbative effects that affect the QNDness of dispersive readout, the potential of the present approach is made even clearer. Line (106) of FIG. 4 and FIG. 5 correspond to the dispersive case with Purcell decay. In this more realistic case, longitudinal readout outperforms its counterpart at all times. FIG. 6 provides a graphical representation of resonator damping rate $\kappa/2\pi$ to reach a fidelity of 99.99% in $\tau$=50 ns versus intra-resonator photon number $\bar{n}=(\tilde{g}_z/\kappa)^2=(\epsilon/\kappa)^2$. Squeezing (108) helps in further reducing the required photon number or resonator damping rate. The squeeze strength is optimized for each $\kappa$, with a maximum set to 20 dB reached close to $\kappa/2\pi=1$ MHz In FIGS. 5 and 6, results for the dispersive readout are stopped at the critical photon number obtained for a drive strength $\epsilon_{crit}=\Delta/\sqrt{8g_x}$ for $g_x/\Delta=1/10$.

Up to this point, equal pointer state separation has been assumed for the longitudinal and the dispersive readouts. As already mentioned, dispersive readout is, however, limited to measurement photon numbers well below $n_{crit}$. This is taken into account in FIGS. 5 and 6 by stopping the dispersive curves at $n_{crit}$ (black circle) assuming the typical value $g_x/\Delta=1/10$. FIG. 5 illustrates that only longitudinal readout allows for measurement times <$1/\kappa$. This is moreover achieved for reasonable modulation amplitudes with respect to the cavity linewidth As illustrated, the longitudinal coupling strength $g_z$ with having a signal of amplitude $\tilde{g}_z$ at least three (3) times greater than the resonator damping rate $\kappa$ still allows for qubit readout. On FIG. 6, the resonator damping rate vs photon number required to reach a fidelity of 99.99% in $\upsilon$=50 ns is illustrated. Note that line (106) corresponding to dispersive with Purcell is absent from this plot. With dispersive readout, it appears impossible to achieve the above target fidelity and measurement time in the very wide range of parameters of FIG. 6. On the other hand, longitudinal readout with quite moderate values of $\kappa$ and $\bar{n}$ provide meaningful results. Further speedups are expected with pulse shaping and machine learning. Because the pointer state separation is significantly improved even at short time, the latter approach should be particularly efficient.

To allow for rapid reuse of the qubit, the resonator should be returned to its grounds state ideally in a time $\ll 1/\kappa$ after readout. A pulse sequence achieving this for dispersive readout has been proposed but is imperfect because of qubit-induced nonlinearity deriving from $\hat{H}_x$.

As illustrated in FIG. 3, with an approach based on longitudinal modulation as proposed herein, resonator reset is realized by inverting the phase of the modulation. Since $\hat{H}_z$ does not lead to qubit-induced nonlinearity, the reset remains ideal. In practice, reset can also be shorter than the integration time. It is also interesting to point out that longitudinal modulation readout saturates the inequality $\Gamma_{\phi m} \geq \Gamma_{meas}$ linking the measurement-induced dephasing rate $\Gamma_{\phi m}$ to the measurement rate $\Gamma_{meas}$ and is therefore quantum limited.

Another optional feature of the longitudinal modulation readout to improve SNR (theoretically exponentially) by providing a single-mode squeezed input state on the resonator. The squeeze axis is chosen to be orthogonal to the qubit-state dependent displacement generated by $g_z(t)$. referring back to the example of FIG. 1, squeezing would provide for a more defined value along the vertical axis. Since the squeeze angle is unchanged under evolution with $\hat{H}_z$, the imprecision noise is exponentially reduced along the vertical axis while the imprecision noise is left to augment along the horizontal axis. The signal-to-noise ratio becomes $e^r SNR_z$, with r the squeeze parameter. This exponential enhancement is apparent from line (108) depicted in FIG. 4 and in the corresponding reduction of the measurement time in FIG. 5. Note that by taking $\bar{g}_z=0$, the resonator field can be squeezed prior to measurement without negatively affecting the qubit.

The exponential improvement is in contrast to standard dispersive readout where single-mode squeezing can lead to an increase of the measurement time. Indeed, under dispersive coupling, the squeeze angle undergoes a qubit-state dependent rotation. As a result, both the squeezed and the anti-squeezed quadrature contributes to the imprecision noise. It is to be noted that the situation can be different in the presence of two-mode squeezing where an exponential increase in SNR can be recovered by engineering the dispersive coupling of the qubit to two cavities.

Figure 7:
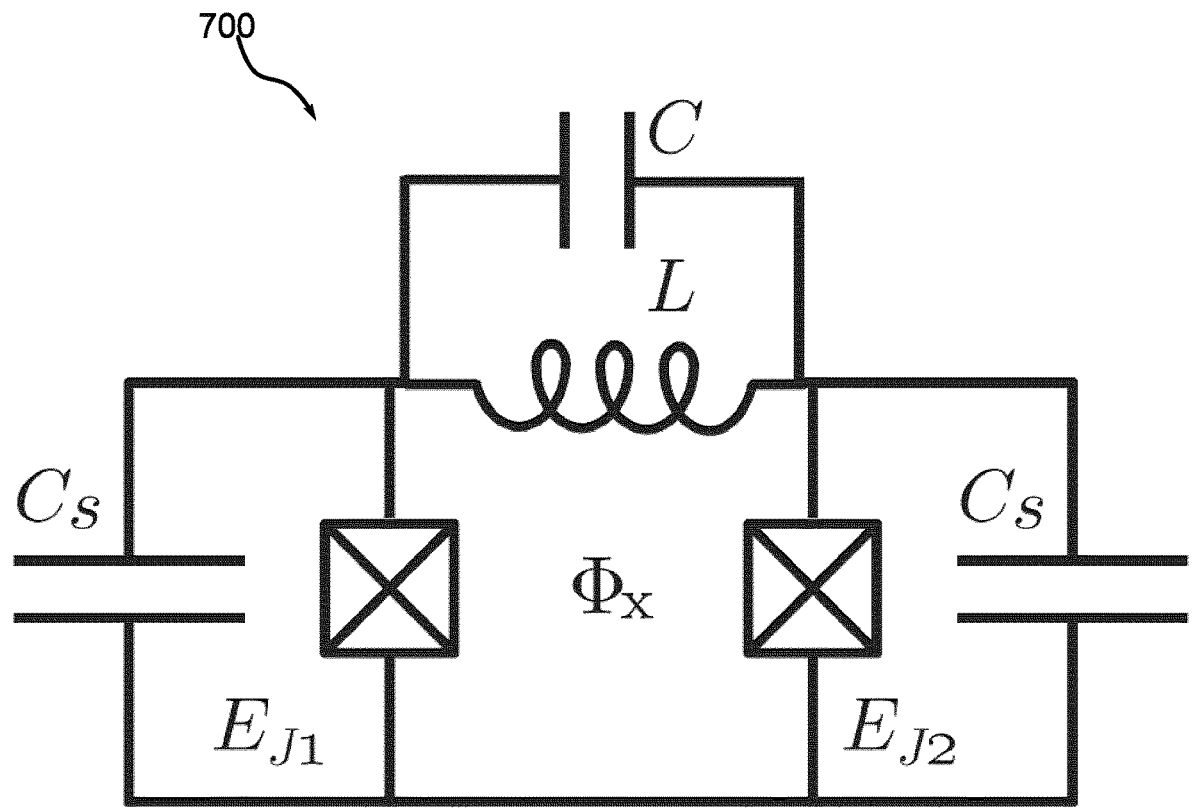
FIG. 7 is a logical representation of a circuit QED implementation of the longitudinal coupling modulation.

While the longitudinal modulation approach is very general, a circuit QED implementation 700 is discussed in greater details hereinafter with reference to FIG. 7. Longitudinal coupling of a flux or transmon qubit to a resonator of the LC oscillator type may result from the mutual inductance between a flux-tunable qubit and the resonator. Another example focuses on a transmon qubit phase-biased by the oscillator. FIG. 7 shows a schematically lumped version of an exemplary circuit QED implementation 700 considering the teachings of the present disclosure. In practice, the inductor L can be replaced by a Josephson junction array, both to increase the coupling and to reduce the qubit's flux-biased loop size. Alternatives (e.g., based on a transmission-line resonator) may also be realized as it is explored with respect to other embodiments described hereinbelow.

The Hamiltonian of the circuit of FIG. 7 is similar to that of a flux-tunable transmon, but where the external flux $\Phi_x$ is replaced by $\Phi_x+\delta$ with $\delta$ the phase drop at the oscillator. Taking the junction capacitances $C_s$ to be equal and assuming for simplicity that $Z_0/R_K \ll 1$, with $Z_0=\sqrt{L/C}$ and $R_K$ the resistance quantum, the Hamiltonian of the circuit QED 700 may be expressed as $\hat{H}=\hat{H}_r+\hat{H}_q+\hat{H}_{qr}$, with $H_r=\omega_r\hat{a}^\dagger\hat{a}$ resenting the oscillator Hamiltonian and $\hat{H}_q=\frac{1}{2}\omega_a\hat{\sigma}_z$ presenting the Hamiltonian of a flux transmon written here in its two-level approximation.

The Hamiltonian of the qubit-oscillator interaction (or longitudinal coupling strength) takes the form $\hat{H}_{qr}=g_x\hat{\sigma}_x(\hat{a}^\dagger+\hat{a})+g_z\hat{\sigma}_z(\hat{a}^\dagger+\hat{a})$ when Equation 5 and Equation 6 are satisfied:

$$g_z = -\frac{E_J}{2}\left(\frac{2E_C}{E_J}\right)^{1/2}\sqrt{\frac{\pi Z_0}{R_K}}\sin\left(\frac{\pi\Phi_x}{\Phi_0}\right),$$

-continued $$g_x = dE_J \left(\frac{2E_C}{E_J}\right)^{1/4} \sqrt{\frac{\pi Z_0}{R_K}} \cos\left(\frac{\pi \Phi_x}{\Phi_0}\right)$$

where $E_J$ is the mean Josephson energy, d the Josephson energy asymmetry and $E_C$ the qubit's charging energy. Skilled person will readily be able to locate expressions for these quantities in terms of the elementary circuit parameters. In the circuit QED implementation 700, $E_{J1}=E_J(1+d)/2$ and $E_{J2}=E_J(1-d)/2$ with d∈[0,1]. As purposely pursued, the transverse coupling $g_x$ vanishes exactly for d=0, leaving only longitudinal coupling $g_z$. Because longitudinal coupling is related to the phase bias rather than inductive coupling, $g_z$ can be made large.

Figure 9:
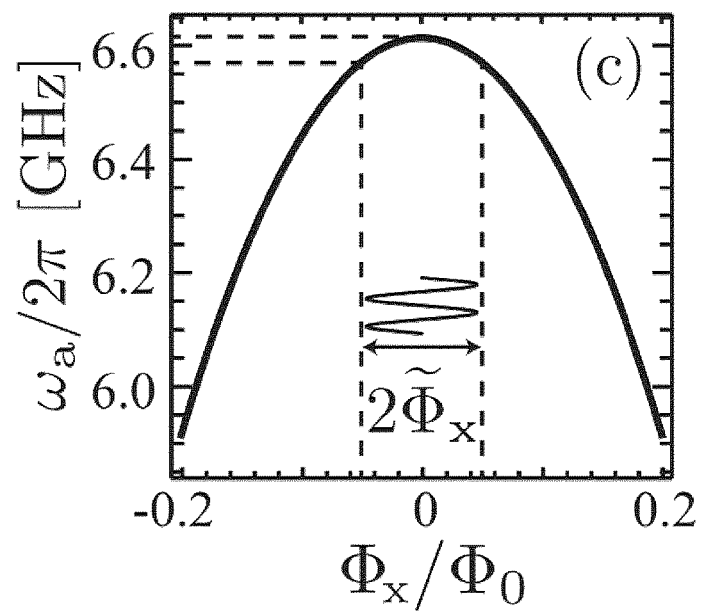
FIG. 9 is a graphical representation of transmon frequency versus flux.
Figure 8:
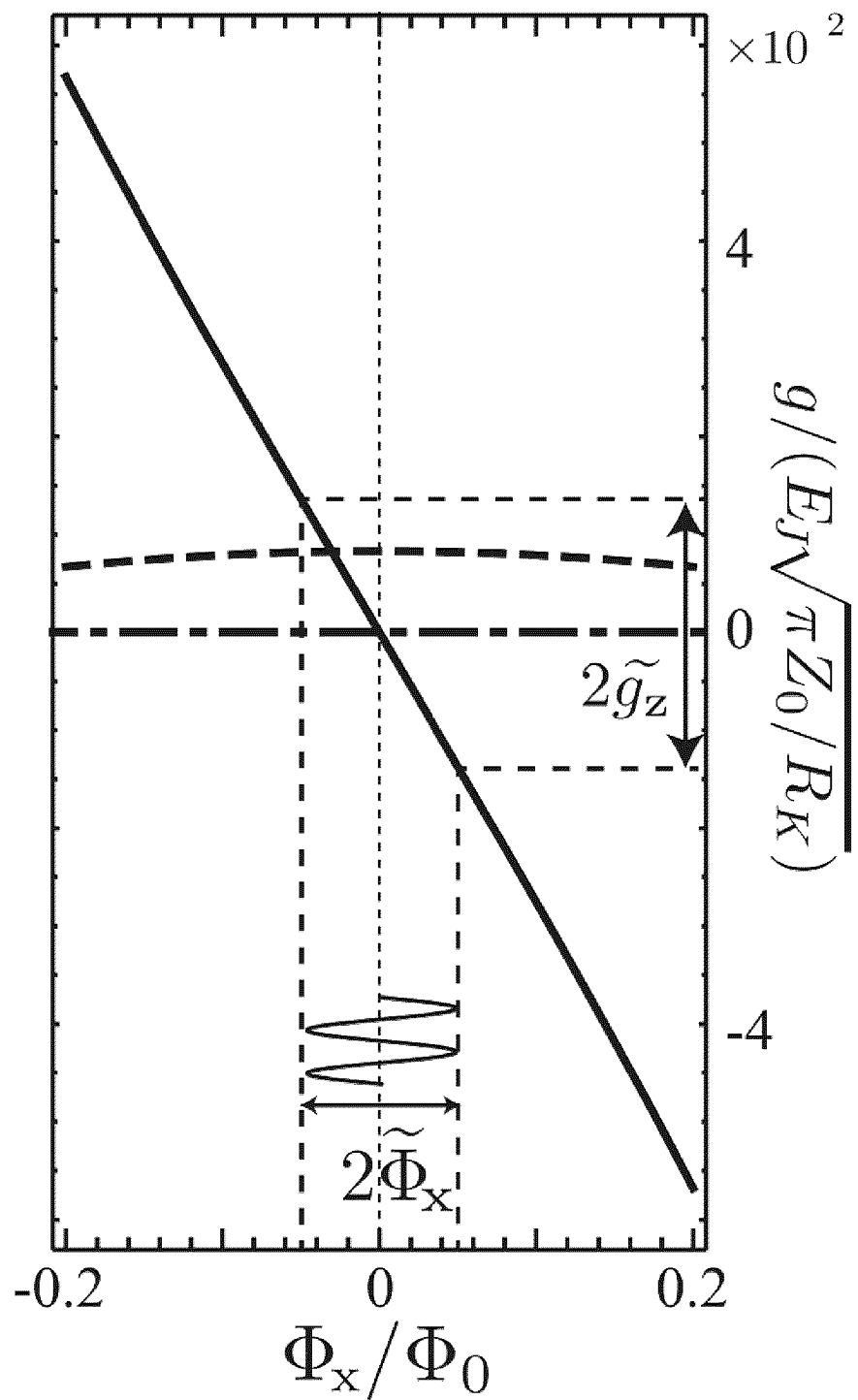
FIG. 8 is a graphical representation of flux $\Phi_x/\Phi_0$ dependence of both $g_z$ and $g_x$.

For example, with the realistic values $E_J/h=20$ GHz, $E_J/E_C=67$ and $Z_0=50\Omega$, $g_z/2\pi\approx r=135$ MHz×sin $(\pi\Phi_x/\Phi_0)$ where $\Phi_0$ represents the magnetic flux quantum. FIG. 8 shows a graphical representation of flux $\Phi_x/\Phi_0$ dependence of both $g_z$ (full line) and $g_x$ with d=0 (dash-dotted line) and d=0.02 (dashed line). Modulating the flux by $0.05\Phi_0$ around $\Phi_x=0$, it follows that $\bar{g}_z=0$ and $\tilde{g}_z/2\pi\sim 21$ MHz Conversely, only a small change of the qubit frequency of ~40 MHz is affected, as can be appreciated from FIG. 9 showing transmon frequency versus flux in accordance with the preceding exemplary parameters. Importantly, this does not affect the SNR.

As can be appreciated, a finite $g_x$ for d≠0. On FIG. 8, a realistic value of d=0.02 and the above parameters, $g_x/2\pi\approx 13$ MHz×cos $(\pi\Phi_x/\Phi_0)$. The effect of this unwanted coupling can be mitigated by working at large qubit-resonator detuning $\Delta$ where the resulting dispersive interaction $\chi=g_x^2/2\Delta$ can be made very small. For example, the above numbers correspond to a detuning of $\Delta/2\pi=3$ GHz where $\chi/2\pi\sim 5.6$ kHz. It is important to emphasize that, contrary to dispersive readout, the longitudinal modulation approach is not negatively affected by a large detuning.

When considering higher-order terms in $Z_0/R_K$, the Hamiltonian of the circuit QED 700 exemplified in FIG. 7 contains a dispersive-like interaction $\chi_z \hat{a}^\dagger \hat{a} \hat{\sigma}_z$ even at d=0. For the parameters already used above, $\chi_z/2\pi\sim 5.3$ MHz, a value that is not made smaller by detuning the qubit from the resonator. However since it is not derived from a transverse coupling, $\chi_z$ is not linked to any Purcell decay. Moreover, it does not affect $SNR_z$ at small measurement times.

In the absence of measurement, $\bar{g}_z=\hat{g}_z=0$ and the qubit may advantageously be parked at its flux sweet spot (e.g., integer values of $\Phi_0$). Dephasing due to photon shot noise or to low-frequency flux noise is therefore expected to be minimal. Because of the longitudinal coupling, another potential source of dephasing is flux noise at the resonator frequency which will mimic qubit measurement. However, given that the spectral density of flux noise is proportional to 1/f even at high frequency, this contribution is negligible.

In the circuit QED implementation, the longitudinal readout can also be realized with a coherent voltage drive of amplitude $\epsilon(t)$ applied directly on the resonator, in place of a flux modulation on the qubit. Taking into account higher-order terms in the qubit-resonator interaction, the full circuit Hamiltonian without flux modulation can be approximated to ($g_z=0$)

$$\hat{H}=\omega_r \hat{a}^\dagger \hat{a}+\tfrac{1}{2}\omega_a \hat{\sigma}_z + \chi_z \hat{a}^\dagger \hat{a} \hat{\sigma}_z + i\gamma(t)(\hat{a}^\dagger - \hat{a})$$

the well-known driven dispersive Hamiltonian where the AC-Stark shift interaction originating from the higher-order longitudinal interaction is given by $$\chi_z = -\frac{\sqrt{E_J E_C}}{h} \frac{\pi Z_r}{R_K}$$

Assuming a drive resonant with the resonator frequency $\omega_r$ with phase $\varphi=0$ for simplicity, in the rotating frame the system Hamiltonian becomes (neglecting fast-rotating terms)

$$\hat{H} + \chi_z \hat{a}^\dagger \hat{a} \hat{\sigma}_z + i\frac{\epsilon}{2}(\hat{a}^\dagger - \hat{a})$$

Under a displacement transformation $D(\alpha)\hat{a}D^\dagger(\alpha)\to \hat{a}-\alpha$ and including the resonator dissipation, the following is obtained:

$$\hat{H} + \chi(\hat{a}^\dagger - \alpha^*)(\hat{a}-\alpha)\hat{\sigma}_z + i\frac{\epsilon}{2}(\hat{a}^\dagger - \hat{a}) + i\frac{\kappa}{2}(\alpha \hat{a}^\dagger - \alpha^* \hat{a})$$

Finally, choosing $\alpha=\epsilon/\kappa$, the system is now simplifed to $$\hat{H}=\chi_z \hat{a}^\dagger \hat{a} \hat{\sigma}_z + g'_z(\hat{a}^\dagger + \hat{a})\hat{\sigma}_z$$

with an effective (driven) longitudinal interaction with strength $g'_z=\chi_z \epsilon/\kappa$. In a regime of large voltage drive amplitudes with $\epsilon/\kappa \gg 1$, the voltage drive performs the ideal longitudinal readout as the residual dispersive effects are mitigated $g'_z \gg \chi_z$. As mentioned earlier, the absence of Purcell decay and of any critical number of photons in the system allows to push the standard dispersive readout mechanism towards the ideal limit of the longitudinal readout.

A possible multi-qubit architecture consists of qubits longitudinally coupled to a readout resonator (of annihilation operator $\hat{a}_z$) and transversally coupled to a high-Q bus resonator ($\hat{a}_x$). The Hamiltonian describing this system is provided by Equation 7:

$$\hat{H} = \omega_{rz}\hat{a}_z^\dagger \hat{a}_z + \omega_{rx}\hat{a}_x^\dagger \hat{a}_x + \sum_j \frac{1}{2}\omega_{aj}\hat{\sigma}_{zj} + \sum_j g_{zj}\hat{\sigma}_{zj}(\hat{a}_z^\dagger + \hat{a}_z) + \sum_j g_{xj}\hat{\sigma}_{xj}(\hat{a}_x^\dagger + \hat{a}_x)$$

Readout can be realized using longitudinal coupling while logical operations via the bus resonator. Alternative architectures, e.g., taking advantage of longitudinal coupling may also be proposed. Here for instance, taking $g_{zj}(t)=\bar{g}_z+\tilde{g}_z \cos(\omega_r t+\varphi_j)$, the longitudinal coupling, from the perspective of the longitudinal interaction and neglecting fast-oscillating terms, is represented by Equation 8: $\hat{H}_z=(\tfrac{1}{2}\bar{g}_z \Sigma_j \hat{\sigma}_{zj} e^{-i\varphi_j})\hat{a}_z + H.c.$ This effective resonator drive displaces the field to multi-qubit-state dependent coherent states. For two qubits and taking $\varphi_j=j\pi/2$ leads to the four pointer states separated by 90° from each other or, in other words, to an optimal separation even at short times. Other choices of phase lead to overlapping pointer states corresponding to different multi-qubit states. Examples are $\varphi_j=0$ for which $|01\rangle$ and $|10\rangle$ are indistinguishable, and $\varphi_j=j\pi$ where $|00\rangle$ and $|11\rangle$ are indistinguishable. However, these properties may be exploited to create entanglement by measurement. As another example, with 3 qubits the GHZ state may be obtained with $\varphi_j=j2\pi/3$.

In the following pages, additional sets of embodiments are presented. In a first additional set of exemplary embodiments, longitudinal coupling is considered (A). In a second additional set of exemplary embodiments, longitudinal coupling with single-mode squeezed states is presented (B). Standard dispersive coupling (C) as well as innovative longitudinal coupling in presence of transverse coupling in the dispersive regime (D) are also considered.

A. Longitudinal Coupling

1. Modulation at the Resonator Frequency

The first set of embodiments (A) considers a qubit longitudinally coupled to a resonator with the Hamiltonian:

$$\hat{H} = \omega_r \hat{a}^\dagger \hat{a} + \frac{1}{2}\omega_a \hat{\sigma}_z + [g_z(t)\hat{a}^\dagger + g_z^*(t)\hat{a}]\hat{\sigma}_z. \tag{S1}$$

In this expression, $\omega_r$ is the resonator frequency, $\omega_a$ the qubit frequency and $g_z$ is the longitudinal coupling that is modulated at the resonator frequency:

$$g_z(t) = \bar{g}_z + |\tilde{g}_z|\cos(\omega_r t + \varphi). \tag{S2}$$

In the interaction picture and using the Rotating-Wave Approximation (RWA), the above Hamiltonian simplifies to $$\hat{H} = \frac{1}{2}[\tilde{g}_z \hat{a}^\dagger + \tilde{g}_z^* \hat{a}]\hat{\sigma}_z, \tag{S3}$$

where $\tilde{g}_z = |\tilde{g}_z|e^{i\varphi}$ is the modulation amplitude. From Equation (S3), it is clear that the modulated longitudinal coupling plays the role of a qubit-state dependent drive. The Langevin equation of the cavity field simply reads $$\dot{\hat{a}} = -i\frac{1}{2}\tilde{g}_z\hat{\sigma}_z - \frac{1}{2}\kappa\hat{a} - \sqrt{\kappa}\hat{a}_{in}, \tag{S4}$$

where $\hat{a}_{in}$ is the input field. Taking this input to be the vacuum, the input correlations are then defined by:

Using the input-output boundary $\hat{a}_{out} = \hat{a}_{in} + \sqrt{\kappa}\hat{a}$, it integration of the Langevin equation leads to $\langle \hat{a}_{in}(t)\hat{a}_{in}^\dagger(t')\rangle = [\hat{a}_{in}(t), \hat{a}_{in}^\dagger(t')] = \delta(t-t')$ $$\alpha_{out}(t) = -\frac{i\tilde{g}_z}{\sqrt{\kappa}}\langle\hat{\sigma}_z\rangle\left[1 - e^{-\frac{1}{2}\kappa t}\right], \tag{S5}$$

$$\hat{d}_{out}(t) = \hat{a}_{in}(t) - \kappa \int_{-\infty}^{t} dt' e^{-\frac{1}{2}\kappa(t-t')}\hat{a}_{in}(t'),$$

where $\alpha_{out} = \langle \hat{a}_{out} \rangle$ stands for the output field mean value and $\hat{d}_{out} = \hat{a}_{out} - \alpha_{out}$ its fluctuations. Because here the qubit-dependent drive comes from modulations of the coupling, and not from an external coherent drive, there is no interference between the outgoing and the input fields. As a result, $\alpha = \alpha_{out}/\sqrt{\kappa}$ and the intracavity photon number evolves as $$\langle \hat{a}^\dagger \hat{a} \rangle = \frac{|\tilde{g}_z|^2}{\kappa^2}\left[1 - e^{-\frac{1}{2}\kappa t}\right]^2. \tag{S6}$$

The measurement operator corresponding to homodyne detection of the output signal with an integration time $\tau$ and homodyne angle $\varphi_h$ is $$\hat{M}(\tau) = \sqrt{\kappa}\int_0^\tau dt[\hat{a}_{out}^\dagger(t)e^{i\varphi_h} + \hat{a}_{out}(t)e^{-i\varphi_h}]. \tag{S7}$$

The signal for such a measurement is $\langle M \rangle$ while the noise operator is $\hat{M}_N = \hat{M} - \langle \hat{M}\rangle$ In the presence of a qubit, the measurement signal is then $$\langle \hat{M}\rangle_1 - \langle \hat{M}\rangle_0 = 4|\tilde{g}_z|\sin(\varphi - \phi_h)\tau\left[1 - \frac{2}{\kappa\tau}\left(1 - e^{-\frac{1}{2}\kappa\tau}\right)\right]. \tag{S8}$$

On the other hand, the measurement noise is equal to $\langle \hat{M}_N^2(\tau)\rangle = \kappa\tau$. Combining these two expressions, the signal-to-noise ratio (SNR) then reads $$SNR^2 \equiv \frac{|\langle\hat{M}\rangle_1 - \langle\hat{M}\rangle_0|^2}{\langle\hat{M}_{N1}^2(\tau)\rangle + \langle\hat{M}_{N0}^2(\tau)\rangle} \tag{S9}$$

$$= \frac{8|\tilde{g}_z|^2}{\kappa^2}\sin^2(\varphi - \phi_h)\kappa\tau\left[1 - \frac{2}{\kappa\tau}\left(1 - e^{-\frac{1}{2}\kappa\tau}\right)\right]^2. \tag{S10}$$

The SNR is optimized by choosing the modulation phase $\varphi$ and the homodyne angle such that $\varphi - \varphi h = \mod \pi$. With this choice, the optimized SNR finally reads:

$$SNR = \sqrt{8}\frac{|\tilde{g}_z|}{\kappa}\sqrt{\kappa\tau}\left[1 - \frac{2}{\kappa\tau}\left(1 - e^{-\frac{1}{2}\kappa\tau}\right)\right]. \tag{S11}$$

At long measurement times ($\tau \gg 1/\kappa$), the signal-to-noise ratio evolves as $$SNR = \sqrt{8}\frac{|\tilde{g}_z|}{\kappa}\sqrt{\kappa\tau}$$

while in the more experimentally interesting case of short measurement times leads to $$SNR = \frac{1}{\sqrt{2}}\frac{|\tilde{g}_z|}{\kappa}(\kappa\tau)^{3/2}.$$

In short, the SNR increases as $\tau^{3/2}$, much faster than in the dispersive regime where the SNR rather increases as $\tau^{5/2}$, as will become apparent in (C) below.

2. Measurement and Dephasing Rates

To evaluate the measurement-induced dephasing rate, a polaron-type transformation is applied on Hamiltonian from (S3) consisting of a displacement of a $\hat{a}$ by $-i\tilde{g}_z\hat{\sigma}_z/\kappa$. Under this transformation, the cavity decay Lindbladian $\kappa\mathcal{D}[\hat{a}]\hat{\rho} = \mathcal{D}[\hat{a}]\rho = \hat{a}\rho\hat{a}^\dagger - \frac{1}{2}\{\hat{a}^\dagger\hat{a}, \rho\}$, leads to $\frac{1}{2}\Gamma_{\varphi m}\mathcal{D}[\hat{\sigma}_z]\hat{\rho}$ where $\Gamma_{\varphi m} = 2[\tilde{g}_z]^2/\kappa$ is the measurement-induced dephasing. On the other hand, the measurement rate is obtained from the SNR as $\Gamma_{meas} = SNR^2/(4\tau) = 2[\tilde{g}_z]^2/\kappa$.

The relation between the dephasing and the measurement rate is then $\Gamma_{meas} = \Gamma_{\varphi m}$. This is the bound reached for a quantum limited measurement.

3. Modulation Bandwidth

A situation where the longitudinal coupling is modulated at a frequency $\omega_m \neq \omega_r$ is now considered. That is, $g_z(t) = \bar{g}_z + |\tilde{g}_z|\cos(\omega_m t + \varphi)$. Assuming that the detuning $\Delta m = \omega_m - \omega_r$ is small with respect to the modulation amplitude $\tilde{g}_z$, the Hamiltonian in a frame rotating at the modulation frequency now reads under the RWA as:

$$\hat{H} = -\Delta_m \hat{a}^\dagger \hat{a} + \frac{1}{2}[\tilde{g}_z \hat{a}^\dagger + \tilde{g}_z \hat{a}]\hat{\sigma}_a, \tag{S12}$$

The corresponding Langevin equation is then $$\dot{\hat{a}} = -i\frac{1}{2}\tilde{g}_z\hat{\sigma}_a - i\Delta_m\hat{a} - \frac{1}{2}\kappa\hat{a} - \sqrt{\kappa}\hat{a}_{in}, \tag{S13}$$

yielding for the output field, $$\alpha_{out}(t) = -\frac{i\tilde{g}_z\sqrt{\kappa}}{\kappa - 2i\Delta_m}\langle\hat{\sigma}_z\rangle\left[1 - e^{(i\Delta_m - \frac{1}{2}\kappa)\tau}\right], \quad (S14)$$

$$\hat{d}_{out}(t) = \hat{d}_{in}(t) - \kappa\int_{-\infty}^{t}dt'\, e^{(i\Delta_m - \frac{1}{2}\kappa)(t-t')}\hat{d}_{in}(t').$$

From these expressions, the measurement signal is then $$\langle\hat{M}\rangle_1 - \langle\hat{M}\rangle_0 = \frac{4|\tilde{g}_z|}{\sqrt{1+\left(\frac{2\Delta_m}{\kappa}\right)^2}}\sin[\varphi - \phi_h + \arctan(2\Delta_m/\kappa)]\tau - \quad (S15)$$

$$\frac{8|\tilde{g}_z|/\kappa}{1+\left(\frac{2\Delta_m}{\kappa}\right)^2}\sin[\varphi - \phi_h + 2\arctan(2\Delta_m/\kappa)] +$$

$$\frac{8|\tilde{g}_z|/\kappa}{1+\left(\frac{2\Delta_m}{\kappa}\right)^2}\sin[\varphi - \phi_h + 2\arctan(2\Delta_m/\kappa) + \Delta_m\tau]e^{-\frac{1}{2}\kappa\tau}.$$

While the signal is changed, the noise is however not modified by the detuning. From the above expression, given a detuning $\Delta m$ and a measurement time $\tau$, there is an optimal angle $\varphi$ that maximizes the SNR.

B. Longitudinal Coupling with Squeezing

In the second set of exemplary embodiments (B), a situation where the modulation detuning is zero and where the input field is in a single-mode squeezed vacuum is now considered. This leaves the signal unchanged, but as will be appreciated, leads to an exponential increase of the SNR with the squeeze parameter r. Indeed, in the frame of the resonator, the correlations of the bath fluctuations are now $$\begin{pmatrix}\langle\hat{d}_{in}^\dagger(t)\hat{d}_{in}(t')\rangle & \langle\hat{d}_{in}(t)\hat{d}_{in}(t')\rangle \\ \langle\hat{d}_{in}^\dagger(t)\hat{d}_{in}^\dagger(t')\rangle & \langle\hat{d}_{in}(t)\hat{d}_{in}^\dagger(t')\rangle\end{pmatrix} = \quad (S16)$$

$$\begin{pmatrix}\sinh^2 r & \frac{1}{2}\sinh 2r\, e^{2i\theta} \\ \frac{1}{2}\sinh 2r\, e^{-2i\theta} & \cosh^2 r\end{pmatrix}\delta(t-t').$$

where is has been assumed broadband squeezing with a squeeze angle $\theta$. The measurement noise is then $$\langle\hat{M}_N^2(\tau)\rangle = \quad (S17)$$

$$\kappa\int_0^\tau dt\int_0^\tau dt'\left[\langle\hat{d}_{out}^\dagger(t)\hat{d}_{out}(t')\rangle + \langle\hat{d}_{out}(t)\hat{d}_{out}^\dagger(t')\rangle + \langle\hat{d}_{out}(t)\hat{d}_{out}(t')\rangle e^{-2i\phi_h} + \langle\hat{d}_{out}^\dagger(t)\hat{d}_{out}^\dagger(t')\rangle e^{2i\theta_h}\right].$$

The output-field correlations are easily obtained from $$\begin{pmatrix}\langle\hat{d}_{out}^\dagger(t)\hat{d}_{out}(t')\rangle & \langle\hat{d}_{out}(t)\hat{d}_{out}(t')\rangle \\ \langle\hat{d}_{out}^\dagger(t)\hat{d}_{out}^\dagger(t')\rangle & \langle\hat{d}_{out}(t)\hat{d}_{out}^\dagger(t')\rangle\end{pmatrix} = \quad (S18)$$

$$\begin{pmatrix}\langle\hat{d}_{in}^\dagger(t)\hat{d}_{in}(t')\rangle & \langle\hat{d}_{in}(t)\hat{d}_{in}(t')\rangle \\ \langle\hat{d}_{in}^\dagger(t)\hat{d}_{in}^\dagger(t')\rangle & \langle\hat{d}_{in}(t)\hat{d}_{in}^\dagger(t')\rangle\end{pmatrix}$$

which holds here since the drive is 'internal' to the cavity. As a result))

$$\langle\hat{M}_N^2(\tau)\rangle = \{\cos h(2r) - \sin h(2r)\cos[2(\varphi_h - \theta)]\}\kappa\tau. \quad (S19)$$

The noise is minimized by choosing $\theta$ according to $$\theta - \phi h = \frac{\pi}{2}\bmod\pi.$$

With this choice, the SNR reads $$\text{SNR}(r) = e^r \text{SNR}(r=0). \quad (S20)$$

The SNR is thus exponentially enhanced, leading to Heisenberg-limited scaling.

A source of broadband $\Gamma$ pure squeezing is assumed to be available. The effect of a field squeezing bandwidth r was already studied elsewhere, it only leads to a small reduction of the SNR for $\Gamma\gg\kappa$. On the other hand, deviation from unity of the squeezing purity P leads to a reduction of the SNR by $1/\sqrt{P}$. The SNR being decoupled from the anti-squeezed quadrature, the purity simply renormalizes the squeeze parameter.

C. Dispersive Coupling

For completeness, the SNR for dispersive readout is also provided, even though corresponding result may be found in the literature. In the dispersive regime, the qubit-cavity Hamiltonian reads $$\hat{H} = \Phi_r\hat{a}^\dagger\hat{a} + \frac{1}{2}\omega_a\hat{\sigma}_z + \chi\hat{a}^\dagger\hat{a}\hat{\sigma}_z, \quad (S21)$$

where $\chi = g_x^2/\Delta$ is the dispersive shift. The Langevin equation of the cavity field in the interaction picture then reads $$\dot{\hat{a}} = -i\chi\hat{\sigma}_z\hat{a} - \frac{1}{2}\kappa\hat{a} - \sqrt{\kappa}\hat{a}_{in}. \quad (S22)$$

With a drive of amplitude $\epsilon = |\epsilon|e^{-i\varphi_d}$ on the cavity at resonance, the input field is defined by its mean $a_{in} = \langle\hat{a}_{in}\rangle = -\epsilon/\sqrt{\kappa}$ and fluctuations $\hat{d}_{in} = \hat{a}_{in} - \alpha_{in}$. Integrating the Langevin equation yields $$\alpha_{out}(t) = \frac{\epsilon}{\sqrt{\kappa}}e^{-i\varphi_{qb}\langle\hat{\sigma}_z\rangle}\left[1 - 2\cos\left(\frac{1}{2}\varphi_{qb}\right)e^{-(i\chi\langle\hat{\sigma}_z\rangle+\frac{1}{2}\kappa)t+\frac{1}{2}i\varphi_{qb}\langle\hat{\sigma}_z\rangle}\right], \quad (S23)$$

$$\hat{d}_{out}(t) = \hat{d}_{in}(t) - \kappa\int_{-\infty}^{t}dt'\, e^{-(i\chi\langle\hat{\sigma}_z\rangle-\frac{1}{2}\kappa)(t-t')}\hat{d}_{in}(t'). \quad (S24)$$

where $\varphi_{qb} = 2\arctan(2\chi/\kappa)$ is the qubit-induced phase of the output field. Moreover, the intracavity photon number is as $$\langle\hat{a}^\dagger\hat{a}\rangle = \left(\frac{2|\epsilon|}{\kappa}\right)^2\cos^2\left(\frac{1}{2}\varphi_{qb}\right)\left[1 - 2\cos(\chi t)e^{-\frac{1}{2}\kappa t} + e^{-\kappa t}\right]. \quad (S25)$$

From the above expressions, the measurement signal is $$M_{S|1\rangle} - M_{S|0\rangle} = 4|\epsilon|\sin(\varphi_{qb})\sin(\varphi_d - \phi_h) \quad (S26)$$

-continued $$\tau\left\{1 - \frac{4}{\kappa\tau}\cos^2\left(\frac{1}{2}\varphi_{qb}\right)\left[1 - \frac{\sin(\chi\tau + \varphi_{qb})}{\sin(\varphi_{qb})}e^{-\frac{1}{2}\kappa\tau}\right]\right\}$$

On the other hand, the measurement noise is simply equal to $\langle \hat{M}_N^2(T) \rangle = \kappa T$. The measurement signal is optimized for $$\varphi_d - \phi_h = \frac{\pi}{2}\bmod \pi$$

and at long integration times by $$\varphi_{qb} = \frac{\pi}{2},$$

or equivalently $\chi = \kappa/2$. For this optimal choice, the SNR then reads

At long measurement times, the SNR evolves as $$SNR = \sqrt{8}\frac{|\epsilon|}{\kappa}\sqrt{\kappa\tau}$$

and at short measurement times it starts as:

$$SNR = \frac{1}{\sqrt{18}}\frac{|\epsilon|}{\kappa}(\kappa\tau)^{5/2} \qquad (S27)$$

$$SNR = \sqrt{8}\frac{|\epsilon|}{\kappa}\sqrt{\kappa\tau}\left[1 - \frac{2}{\kappa\tau}\left(1 - e^{-\frac{1}{2}\kappa\tau}\cos\frac{1}{2}\kappa\tau\right)\right].$$

The presence of Purcell decay $\gamma_\kappa = (g/\Delta)^2\kappa$ is taken into account using the expression of $\langle\hat{\sigma}_z\rangle(t)$ for a Purcell-limited qubit, i.e., $\langle\hat{\sigma}_z\rangle(t) = (1+\langle\hat{\sigma}_z\rangle(0))e^{-\gamma_\kappa t}-1$. The $$SNR = \sqrt{2}\frac{|\epsilon|}{\kappa}\sqrt{\kappa\tau}\left\{1 - \frac{2}{\kappa\tau}\left(1 - e^{-\frac{1}{2}\kappa\tau}\cos\frac{1}{2}\kappa\tau\right) - \qquad (S28)\right.$$
$$\left.\frac{\kappa}{\tau}\int_0^\tau dt\int_0^t dt' e^{-\frac{1}{2}\kappa(t-t')}\sin\left[\frac{1}{2}\kappa(t-t') - \frac{\kappa}{\gamma_\kappa}\left(e^{-\gamma_\kappa t'} - e^{-\gamma_\kappa t}\right)\right]\right\}.$$

corresponding SNR is then, for $\chi = \kappa/2$,

D. Effect of a Residual Transverse Coupling

In the fourth set of exemplary embodiments (D), presence of a spurious transverse coupling $g_x$ in addition to the longitudinal coupling $g_z$ is considered whereby:

$$\hat{H} = \omega_r \hat{a}^\dagger \hat{a} + \omega_q \hat{\sigma}_z + \{[g_x + \tilde{g}_x \cos(\omega_r t + \varphi_x)]\hat{\sigma}_x + [g_z + \tilde{g}_z \cos(\omega_r t + \varphi)]\hat{\sigma}_z\}(\hat{a}^\dagger + \hat{a}). \qquad (S29)$$

It is now assumed that $g_x \ll \Delta$ and we follow the standard approach to eliminate the transverse coupling. To leading order in $g_x/\Delta$ and under the RWA, the interaction picture is defined as:

$$\tilde{H} = \frac{1}{2}(\chi_x - 2\chi_{xz})\hat{\sigma}_z + \chi \hat{a}^\dagger \hat{a}\hat{\sigma}_z + \frac{1}{2}[\tilde{g}_z \hat{a}^\dagger + \tilde{g}_z^* \hat{a}]\hat{\sigma}_z, \qquad (S30)$$

with the dispersive shifts $\chi = \chi_x - 4\chi_{xz}\cdot\chi_x = g_x^{-2}/\Delta$ and $\chi_{xz} = \tilde{g}_x \tilde{g}_z/\Delta$.

Going to an interaction picture also with respect to the first term of Equation (S30), the starting point is $$\hat{H} = \chi \hat{a}^\dagger \hat{a}\hat{\sigma}_z + \frac{1}{2}[\tilde{g}_z \hat{a}^\dagger + \tilde{g}_z^* \hat{a}]\hat{\sigma}_z. \qquad (S31)$$

This leads to the Langevin equation $$\dot{\hat{a}} = -i\frac{1}{2}\tilde{g}_z\hat{\sigma}_z - (i\chi + \frac{1}{2}\kappa)\hat{a} - \sqrt{\kappa}\hat{a}_{in}. \qquad (S32)$$

In accordance with previously presented results in (A), the measurement signal is $$\langle\hat{M}\rangle_1 - \langle\hat{M}\rangle_0 = 4|\tilde{g}_z|\sin(\varphi - \phi_h)\tau\cos^2\left(\frac{1}{2}\varphi_{gb}\right) \qquad (S33)$$
$$\left\{1 - \frac{2}{\kappa\tau}\left[\cos(\varphi_{qb}) - \cos(\varphi_{qb} + \chi\tau)e^{-\frac{1}{2}\kappa\tau}\right]\right\}.$$

where as before it is noted that the dispersive-coupling-induced rotation $\varphi_{qb} = 2\arctan(2\chi/\kappa)$. Again as above, the measurement noise is not changed by the dispersive shift. Choosing $$\varphi - \phi_h = \frac{\pi}{2}\bmod \pi,$$

the SNR finally reads $$SNR(\chi) = \qquad (S34)$$
$$\sqrt{8}\frac{|\tilde{g}_z|}{\kappa}\sqrt{\kappa\tau}\cos^2\left(\frac{1}{2}\varphi_{qb}\right)\left\{1 - \frac{2}{\kappa\tau}\left[\cos(\varphi_{qb}) - \cos(\varphi_{qb} + \chi\tau)e^{-\frac{1}{2}\kappa\tau}\right]\right\}.$$

The residual dispersive coupling reduces the value of the SNR, with the decrease behaving differently at long and short measurement times. At long measurement times, the dispersive coupling reduces the SNR by $$SNR(\chi) \simeq \cos^2\left(\frac{1}{2}\varphi_{qb}\right)SNR(\chi = 0) = \frac{\kappa^2}{\kappa^2 + 4\chi^2}SNR(\chi = 0), \qquad (S35)$$

for $\tau \gg 1/\kappa$.

The SNR is not affected for $\chi \ll \kappa/2$. Interestingly, at short measurement times the SNR is completely independent of the spurious dispersive shift to leading orders $$SNR(\chi) \simeq \frac{1}{\sqrt{2}}\frac{\tilde{g}_z}{\kappa}(\kappa\tau)^{3/2}\left(1 - \frac{1}{6}\kappa\tau\right), \text{ for } \tau \ll 1/\kappa. \qquad (S36)$$

In short, the SNR is not affected by a spurious transverse coupling for short measurement times $\tau \ll 1/\kappa$.

II. Circuit QED Realization

An exemplary realization of longitudinal coupling in circuit QED is now addressed. While a lumped circuit QED implementation 700 is presented in FIG. 7, focus is on put a transmon qubit that is phase-biased by a coplanar waveguide resonator. The lumped element results are recovered in the appropriate limit. Emphasis is put on numerical results obtained for this coplanar realization. For this reason these numerical values differ from, but are compatible with, what is found with reference to FIGS. 1 to 9.

Figure 10:
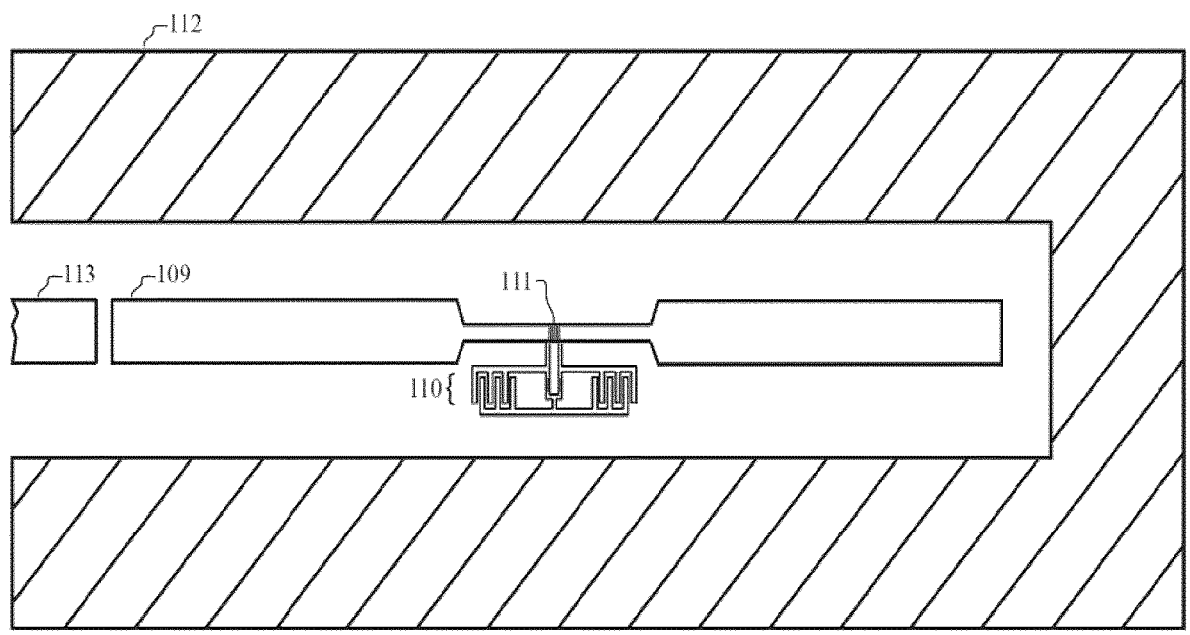
FIG. 10 is a logical representation of physical characteristics of a transmon qubit coupling longitudinally to a resonator.
Figure 11:
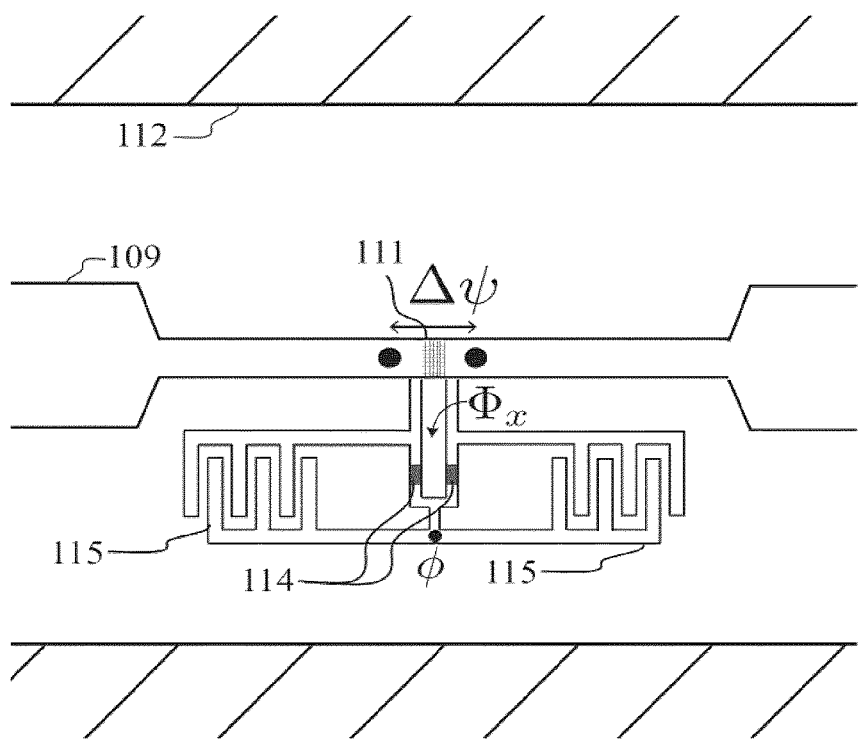
FIG. 11 is a close-up logical representation of physical characteristics of the transmon qubit.

As illustrated in FIG. 10, a transmon qubit (110) coupled at middle of the center conductor of a $\lambda/2$ resonator (109). To increase the longitudinal coupling strength, a Josephson junction can be inserted in the center conductor of the resonator at the location of the qubit (111). FIG. 10 shows a logical representation of physical characteristics of a transmon qubit coupling longitudinally to a resonator. The coplanar waveguide resonator is composed of a central electrode (109) surrounded by a ground plane (112). A coupling inductance (111) mediates the longitudinal coupling to the transmon qubit (110). A capacitively coupled transmission line (113) allows to send and retrieve input and output signals to and from the resonator. FIG. 11 shows a close-up of the transmon qubit with the definitions of the branch fluxes used herein. The qubit is composed of nominally identical Josephson junctions (114) and large shunting capacitances (115). Additional control lines are needed to modulate the flux through the loop $\varphi_x$ and to perform single-qubit operations (not shown on FIG. 10 and FIG. 11). Ultrastrong transverse coupling of a flux qubit to a resonator has been presented by Bourassa, J. et. al. in "*Ultrastrong coupling regime of cavity QED with phase-biased flux qubits*", which involve at least some inventors also involved in an invention claimed herein. The modelling of the present circuit closely follows Bourassa, J. et. al. and relevant details are provided herein for completeness.

The Lagrangian of this circuit, $\mathcal{L} = \mathcal{L}_r + \mathcal{L}_q + \mathcal{L}_{qr}$, is composed of three parts consisting of the bare resonator $\mathcal{L}_r$, qubit $\mathcal{L}_q$ and interaction $\mathcal{L}_{qr}$ Lagrangians. From standard quantum circuit theory, the resonator Lagrangian takes the form $$\left(\frac{2\pi}{\Phi_0}\right)^2 \mathcal{L}_r = \int_{-L/2}^{L/2} \left(\frac{C^0}{2}\dot{\psi}^2(x,t) - \frac{1}{2L^0}(\partial_x \psi(x,t))^2\right)dx + \left(\frac{2\pi}{\Phi_0}\right)^2 E_{Jr}\cos[\Delta\psi] + \frac{C_{Jr}}{2}\Delta\dot{\psi}. \quad (S37)$$

where $\psi(x)$ is the position-dependant field amplitude inside the resonator and $\Delta\psi = \psi(x_a + \Delta x/2) - \psi(x_a + \Delta x/2)$ is the phase bias across the junction of width $\Delta x$ at position $x_a$. In this expression, it is assumed that the resonator has total length L with capacitance $C^0$ and inductance $L^0$ per unit length. In the single mode limit, $\psi(x,t) = \psi(t)u(x)$ where $u(x)$ is the mode envelope. The Josephson junction in the resonator's center conductor has energy $E_{Jr}$ and capacitance $C_{Jr}$. This junction creates a discontinuity $\Delta\psi \neq 0$ in the resonator field that will provide the desired longitudinal interaction. The coupling inductance can be replaced by a SQUID, or SQUID array, without significant change to the treatment. This Lagrangian was already studied in the context of strong transverse coupling flux qubits to transmission-line resonators and for non-linear resonators.

The transmon qubit is composed of a capacitor to ground $C_b$ and two capacitively shunted Josephson junctions of energies $E_{J1}$ and $E_{J2}$, and total capacitances $C_{q1} = C_{j1} + C_{s1}$ and $C_{q2} = C_{j2} + C_{s2}$ respectively. In terms of the branch fluxes defined on FIG. 11, the qubit Lagrangian taking into account the coupling to the resonator is $$\mathcal{L}_q + \mathcal{L}_{qr} = \left(\frac{\Phi_0}{2\pi}\right)^2 \left[\frac{C_{q1}}{2}(\dot{\psi}_1 - \dot{\phi} - \dot{\Phi}_x)^2 + \frac{C_{q2}}{2}(\dot{\psi}_2 - \dot{\phi})^2 + \frac{C_b}{2}\dot{\phi}^2\right] + \quad (S38)$$
$$E_{J1}\cos[\psi_1 - \phi - \Phi_x] + E_{J2}\cos[\psi_2].$$

Here $\psi_{1(2)} = \psi(x_a \mp \Delta x/2)$ is defined for simplicity and the qubit capacitances $C_q = C_j + C_s$ for each arm. Defining new variables $\theta = (\psi_1 + \psi_2 - 2\varphi)/2$ and $\delta = (\psi_1 + \psi_2 + 2\varphi)/2$, the above is obtained $$\mathcal{L}_q + \mathcal{L}_{qr} = \quad (S39)$$
$$\left(\frac{\Phi_0}{2\pi}\right)^2 \left[\frac{C_{q1} + C_{q2}}{2}(\dot{\theta}^2 + \Delta\dot{\psi}^2/4) + \frac{C_b}{8}(\dot{\delta} - \dot{\theta})^2 + \frac{(C_{q1} - C_{q2})}{2}\dot{\theta}\Delta\dot{\psi}\right] +$$
$$E_{J1}\cos[\theta - \Delta\psi/2 + \Phi_x] + E_{J2}\cos[\theta + \Delta\psi/2].$$

Shifting the variable $\theta \to \theta + \varphi_x/2$, a more symmetrical Lagrangian is obtained with respect to the external flux $$\mathcal{L}_q + \mathcal{L}_{qr} = \quad (S40)$$
$$\left(\frac{\Phi_0}{2\pi}\right)^2 \left[\frac{C_{q1} + C_{q2}}{2}\left(\dot{\theta}^2 + \frac{\Delta\dot{\psi}^2 + \dot{\Phi}_x^2}{4}\right) + \frac{C_b}{8}(\dot{\delta} - \dot{\theta} - \dot{\Phi}_x/2)^2 + \right.$$
$$\left. \frac{(C_{q1} - C_{q2})}{2}\dot{\theta}(\dot{\Phi}_x - \Delta\dot{\psi}) + \frac{C_{q1} + C_{q2}}{4}\Delta\dot{\psi}\dot{\Phi}_x\right] +$$
$$E_{J1}\cos[\theta - \Delta\psi/2 - \Phi_x/2] + E_{J2}\cos[\theta + \Delta\psi/2 + \Phi_x/2].$$

The equation of motion for $\delta$ being $\ddot{\delta} - \ddot{\theta} + \ddot{\Phi}_x/2 = 0$, the term involving the capacitance to ground $C_b$ is thus a constant and can be ignored. Assuming the resonator phase-bias to be small $\Delta\psi \ll 1$ and a DC-flux bias ($\dot{\Phi}_x = 0$), we find to zeroth-order in $\Delta\psi$ the usual Lagrangian of an asymmetric fluxbiased transmon qubit $$\mathcal{L}_q = \left(\frac{\Phi_0}{2\pi}\right)^2 \frac{C_{q1} + C_{q2}}{2}\dot{\theta}^2 + E_{J\Sigma}[\cos(\Phi_x/2)\cos\theta - d\sin(\Phi_x/2)\sin\theta], \quad (S41)$$

where $E_{J\Sigma} = E_{J1} + E_{J2}$ and $d = (E_{J2} - E_{J1})/E_{J\Sigma}$ is the junction asymmetry. Defining $\hat{n}$ to be the conjugate charge to $\hat{\theta}$, the corresponding Hamiltonian is $$\hat{H}_q = 4E_C\hat{n}^2 - E_{J\Sigma}[\cos(\Phi_x/2)\cos\hat{\theta} - d\sin(\Phi_x/2)\sin\hat{\theta}]. \quad (S12)$$

with the charging energy $E_C = e^2/2(C_{q1} + C_{q2})$.

For clarity, projection is made on the qubit subspace {|0>, |1>} where the total Hamiltonian takes the form $$\hat{H} = \omega_r \hat{a}^\dagger \hat{a} + K(\hat{a}^\dagger \hat{a})^2 + \frac{\omega_a}{2}\hat{\sigma}_z + \hat{H}_{qr}. \quad (S43)$$

In this expression, $\omega_a$ is the qubit transition frequency and K the Kerr non-linearity. The latter can be made small and in particular negligible with respect to the photon decay rate $\kappa$. To first order in $\Delta\hat{\psi}$ and in the same two-level approximation, the interaction Hamiltonian reads $$\hat{H}_{qr} = E_{J\Sigma}\frac{\Delta\hat{\psi}}{2}[\sin(\Phi_x/2)\cos\hat{\theta} + d\cos(\Phi_x/2)\sin\hat{\theta}] \quad (S44)$$
$$= g_z(\hat{a}^\dagger + \hat{a})\hat{\sigma}_z + g_x(\hat{a}^\dagger + \hat{a})\hat{\sigma}_x,$$

where $$g_z(\Phi_x) = -\psi_{rms}\Delta u \frac{E_{J\Sigma}}{4}[m_{11}(\Phi_x) - m_{00}(\Phi_x)], \quad (S45)$$

$$g_x(\Phi_x) = \psi_{rms}\Delta u \frac{E_{J\Sigma}}{2}m_{01}(\Phi_x). \quad (S46)$$

To obtain these expressions, $\Delta\hat{\psi} = \Delta u\psi_{rms}(\hat{a}^\dagger + \hat{a})$ is used, with $\psi_{rms} = \sqrt{4\pi Z_r/R_K}$. Here $Z_r$ is the resonator mode impedance and $R_K = h/e^2$ the quantum of resistance. The mode gap $\Delta u$ is found to be optimal for a junction placed in the center of the resonator center (see Bourassa, J. et. al.). At that location, $\Delta u$ can be related to the participation ratio of the coupling inductance $L_J^{-1} = E_{J_r}(2\pi/\varphi_0)^2$ to the effective inductance of the resonator mode $L_r$ as $\Delta u \approx 2\eta = 2L_J/L_r$. The factor of two originates from the fact that both resonator halves bias equally the qubit. The lumped element limit discussed in the previous discussion is obtained for $\eta \to 1/2$. Moreover, it has been defined that $m_{ij} = \langle i| \sin(\Phi_x/2)\cos\hat{\theta} + d\cos(\Phi_x/2)\sin\hat{\theta}|j\rangle$. Equations (S46) and (S45) are calculated numerically by diagonalizing the transmon Hamiltonian.

B. Numerical Evaluation of the Coupling Strength

A set of possible parameters is presented for this circuit. It is very important to emphasize that these numbers relate to the coplanar architecture discussed here and not to the lumped-element example described in relation to FIGS. 7 to 9. A $\lambda/2$ resonator is used of characteristic impedance $Z^0 \sim 50\Omega$, total length 7.6 mm and capacitance per unit length $C^0 = 0.111$ nF/m and inductance per unit length $L^0 = 0.278$ µH/m. The coupling inductance consists of an array of 13 Josephson Junctions with a total Josephson energy $E_{J_r}/h = 420$ GHz. Following the standard procedure, the first resonator mode is determined to be at frequency $\omega_r/2\pi = 10.02$ GHz, with a characteristic mode impedance $Z_r = 18.8\Omega$. The participation ratio of the array is found to be $\eta \sim 0.3$. With these parameters, the resonator bias on the qubit is $\psi_{rms} \approx 0.096$.

The transmon Josephson and charging energies are $E_{J\Sigma}/h = 20$ GHz and $E_C/h = 0.3$ GHz respectively, and the asymmetry $d = 0.02$. These parameters yield $\omega_a/2\pi = 6.6$ GHz when evaluated at the flux sweet-spot $\Phi_x = 0$. The magnetic flux is modulated around this flux value with a maximum excursion of $\tilde{\Phi}_z/2\pi = 0.1$. At the sweet-spot, the qubit-resonator is $\Delta = \omega_n(0) - \omega_r \approx 2\pi \times 3.4$ GHz. The longitudinal coupling $\tilde{g}_z$ the various spurious interactions found numerically using these numbers are summarized in Table I, which provides longitudinal coupling rate $\tilde{g}_z$ and spurious leading-order and second-order couplings for a transmon coupled to a $\lambda/2$ resonator with a coupling inductance consisting of an array of 13 Josephson junctions as discussed herein above with reference to the coplanar architecture (i.e., not in relation to the lumped element version discussion in FIGS. 7 to 9).

| Couplings | | Rates ($2\pi \times$ MHz) |
|---|---|---|
| Longitudinal [Eq. (S48)] | $\tilde{g}_z$ | 26.3 |
| Transverse [Eq. (S49)] | $g_x$ | 7.89 |
| Dispersive | $g_x^2/\Delta$ | 0.018 |
| Non-linear dispersive [Eq. (S56)] | $2\tilde{\lambda}_z$ | 3.97 |
| Non-linear transverse [Eq. (S57)] | $\tilde{\lambda}_x$ | 0 |
| Kerr nonlinearity | K | 0.007 |
| Qubit frequency shift (from flux-drive) [Eq. (S54)] | $\epsilon_q^2/\Delta$ | $4.4 \times 10^{-5}$ |

In particular, $\tilde{g}_z/2\pi = 26.3$ MHz and a small transverse coupling resulting in a negligible dispersive shift $\chi_x = g_x^2/\Delta \sim 18$ kHz. The maximum change in qubit frequency is $$\omega_a(0) - \omega_a(\tilde{\Phi}_x) \sim 2\pi \times 170 \text{ MHz}.$$

The array of N junctions allows for strong longitudinal coupling while reducing the resonator nonlinearity. Compared to a single junction of equal energy, the non-linear Kerr effectively decreases as $K = K_1/N^2$ and from the parameters above $K/2\pi = 7$ kHz using 13 junctions is obtained.

C. Asymptotic Expression for the Coupling Strengths

To obtain asymptotic expressions for the qubit-resonator coupling, the transmon is considered as a weakly anharmonic oscillator. In this situation, $$\hat{\theta} \approx \left[\frac{2E_C}{E_J(\Phi_s)}\right]^{1/4}(\hat{b}^\dagger + \hat{b}) \text{ and} \quad (S47)$$

$$n_{i,j\neq i} \approx d\left(\frac{2E_C}{E_J(\Phi_x)}\right)^{1/4}\cos(\Phi_x/2)\langle i|(\hat{b}^\dagger + \hat{b})|j\rangle,$$

$$m_{ii} \approx -\left(\frac{2E_C}{E_J(\Phi_x)}\right)^{1/2}\frac{\sin(\Phi_x/2)}{2}\langle i|(\hat{b}^\dagger + \hat{b})^2|i\rangle$$

Restricting to the $\{|0\rangle, |1\rangle\}$ subspace and using Equations (S46) and (S45), the asymptotic expressions obtained are $$g_z \approx -\frac{E_{J\Sigma}}{2}\left[\frac{2E_C}{E_J(\Phi_x)}\right]^{1/2}\sqrt{\frac{\pi Z_r}{R_K}}\sin(\Phi_x/2)2\eta, \quad (S48)$$

$$g_x \approx dE_{J\Sigma}\left[\frac{2E_C}{E_J(\Phi_x)}\right]^{1/4}\sqrt{\frac{\pi Z_r}{R_K}}\cos(\Phi_x/2)2\eta. \quad (S49)$$

These correspond to Equations 5 and 6 previously discussed where $\eta \to \frac{1}{2}$.

D. Upper Bounds on the Coupling Strength

An upper bounds for the longitudinal coupling is obtained by expressing $g_z$ in units of the qubit frequency. Using Equation S48:

$$\frac{g_z}{\omega_a} \approx \frac{\Phi_x}{8}\sqrt{\frac{\pi Z_r}{R_K}}2\eta. \quad (S50)$$

For $Z_r \sim 50\Omega$ resonator, maximal coupling is reached in the lumped-element limit of the oscillator where $\eta \to 1/2$ and we get $g_z/\omega_a \sim 0.006$, or about twice the coupling obtained in the previous example giving $g_z/2\pi \sim 42.4$ MHz.

Even larger values of $g_z$ can be achieved by using lumped LC-circuit comprises of a superinductance of large impedance $Z_r \sim R_K/4$. For participation ratios in the range $2\eta \sim [10^{-2}, 1]$, the coupling is enhanced by a factor of ~10 to $g_z/\omega_a = \Phi \times \eta\sqrt{\pi}/8 \sim [7 \times 10^{-4}, 7 \times 10^{-2}]$. While the previous circuit model would have to be redefined to take the large bias $\Delta\psi$ into account, it is safe to say that the larger and more compact coupling inductance is, the stronger the longitudinal coupling will be.

III. Spurious Couplings and Imperfections

From the first term in Equation (S39), an oscillating external magnetic flux $\Phi_x(t) = \tilde{\Phi}_x \cos(\omega_d t + \varphi)$ at frequency $\omega_d$ leads to an effective voltage driver on the resonator $$\mathcal{L}_{r,drive} = \left(\frac{\Phi_0}{2\pi}\right)^2 \frac{C_{q1}+C_{q2}}{2} \dot{\Phi}_x \dot{\psi}(0). \tag{S51}$$

$$\epsilon_r = \frac{\hbar\omega_r}{16 E_{CJ}} \psi_{rms} \Phi_x \omega_d, \tag{S52}$$

This term leads to an effective driver on the resonator $\hat{H}_{r,d} = \epsilon_r e^{-i(\omega_r t + \varphi)}\hat{a}^\dagger + H.c.$ of drive amplitude $\epsilon_r$,
where $E_{CJ} = e^2/[2(C_{q1}+C_{q2})]$. With the above circuit parameters, $\epsilon_r/2\pi \sim 5$ MHz is obtained. If desired, the effect of this drive can be cancelled by an additional drive on the input port of the resonator. Otherwise, this simply leads to an additional qbit-state independent displacement of the cavity field that does not affect the SNR.

In the same way, flux modulation also directly drives the qubit. This is caused by the last charging energy term of Equation (S39) and yields $$\hat{H}_{q,d} = \left(\frac{\Phi_0}{2\pi}\right)^2 \frac{C_{q2}-C_{q1}}{2} \dot{\Phi}_x \hat{q}, \tag{S53}$$

From the asymptotic expression $\hat{q} \approx i(E_J/32E_C)^{1/4}(b^\dagger - b)$, $\hat{H}_{q,d} = \epsilon_q e^{-k(\omega_r t + \varphi)} \hat{b}^\dagger + H.C.$ is obtained where $$\epsilon_q \approx \frac{d}{8} \frac{C_J}{C_\Sigma} \left(\frac{E_J}{32 E_C}\right)^{1/4} \dot{\Phi}_x \omega_r \tag{S54}$$

is identically zero for symmetric junctions (d=0). With the above parameters and $C_J/C_\Sigma = 0.01$, then $\epsilon_q/2\pi \sim 0.18$ MHz. Given the strong qubit-resonator detuning of several GHz, this is however of no consequences.

B. Higher-Order Interaction Terms

To second order in $\Delta\psi$ in Equation (S39) yields the additional interactions $$\hat{H}_{qr}^{(2)} = (\hat{a}^\dagger + \hat{a})^2 (\Lambda_x \hat{\sigma}_x + \Lambda_z \hat{\sigma}_z). \tag{S55}$$

where $$\Lambda_z = \psi_{rms}^2 \frac{E_{J\Sigma}}{16} (\langle 0|\hat{c}c - d\,\hat{s}s|0\rangle - \langle 1|\hat{c}c - d\,\hat{s}s|1\rangle), \tag{S56}$$

$$\Lambda_x = \psi_{rms}^2 \frac{E_{J\Sigma}}{8} \langle 1|[\hat{c}c - d\,\hat{s}s]|0\rangle. \tag{S57}$$

and where have been defined $\hat{c}c = \cos(\Phi_x/2)\cos\hat{\theta}$ and $\hat{s}s = \sin(\Phi_x/2)\sin\hat{\theta}$.

Under flux modulation, $\Lambda_k(t) = \overline{\Lambda}_k + \tilde{\Lambda}_k \cos(\omega_r t + \varphi_r)$ with $k=x,z$. With the RWA this leads to $$\hat{H}_{qr}^{(2)} \approx (2\hat{a}^\dagger \hat{a}+1)(\tilde{\Lambda}_x \hat{\sigma}_x + \tilde{\Lambda}_x \hat{\sigma}_z). \tag{S58}$$

For d small and flux modulations around $\Phi_x = 0$ then $\overline{\Lambda}_x = 0$. On the other hand, the dispersive-like interaction of amplitude $\chi_z = 2\tilde{\Lambda}_z$ has a magnitude of $\chi_z/2\pi \approx 3.97$ MHz for the above circuit parameters. In the lumped-element limit with $Z_r = 50\Omega$, the result is $\chi_z/2\pi = 5.3$ MHz. Since this dispersive-like interaction originates from a second-order correction, it is always found that $g_z/\chi_z \approx 10$. In practice, choosing $\chi_z < \kappa$ will allow this spurious coupling will not affect the SNR at short integration times.

IV. Multiple Qubit Read-Out in (X+Z) Circuit QED

Figure 12:
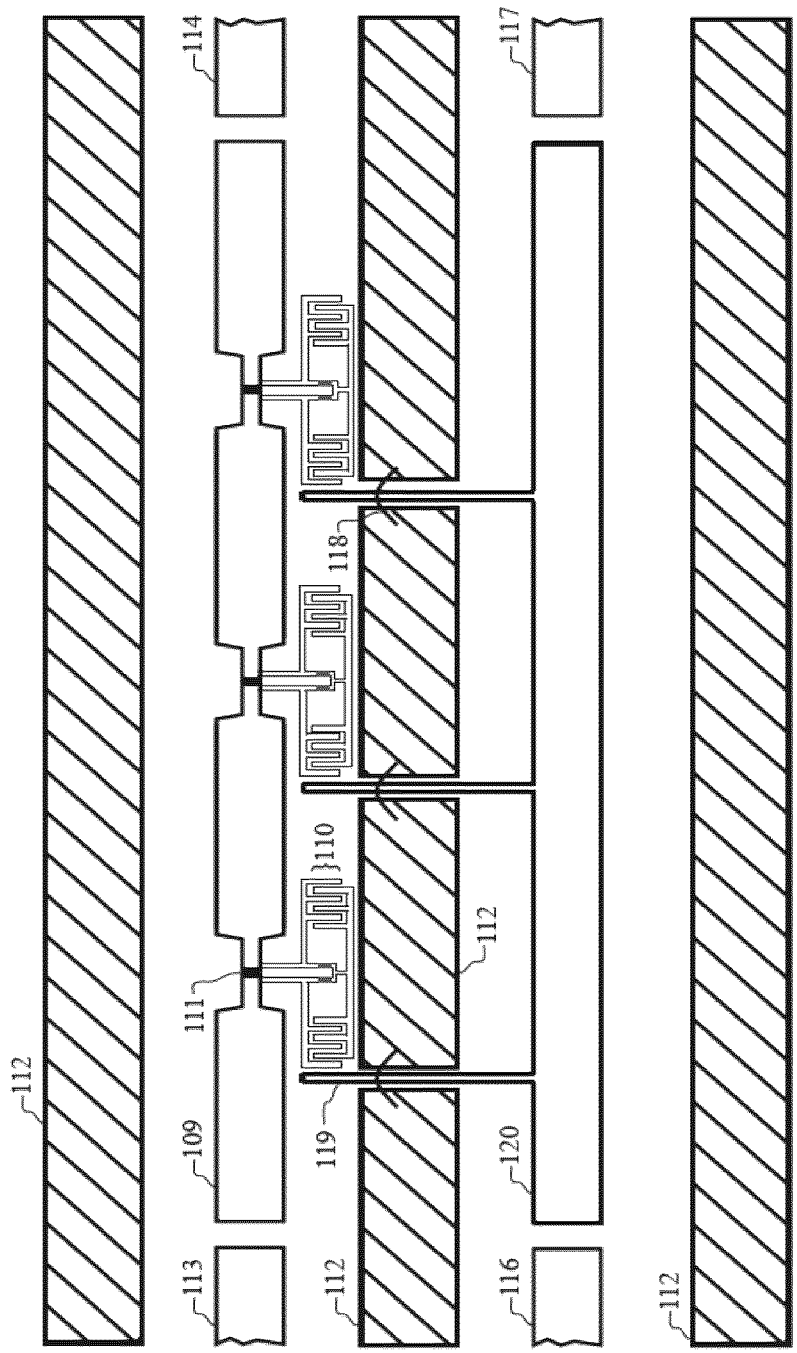
FIG. 12 is a logical representation of physical characteristics of a multi-qubit architecture.
Figure 13A:
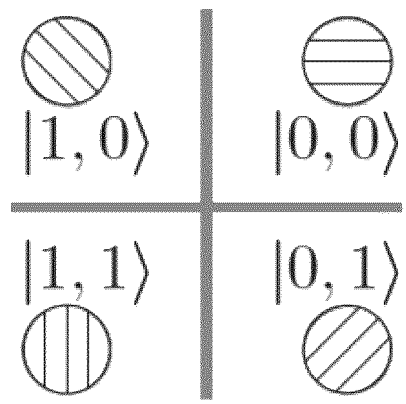
FIGS. 13A, 13B, 13C and 13D are phase space representation of pointer states for multiple qubits.
Figure 13B:
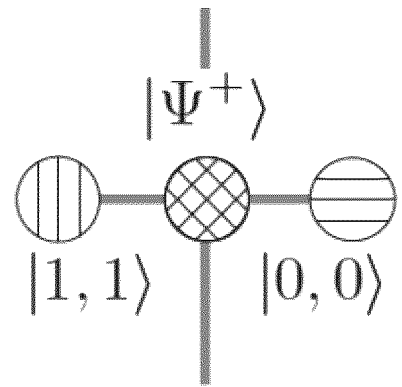
Figure 13C:
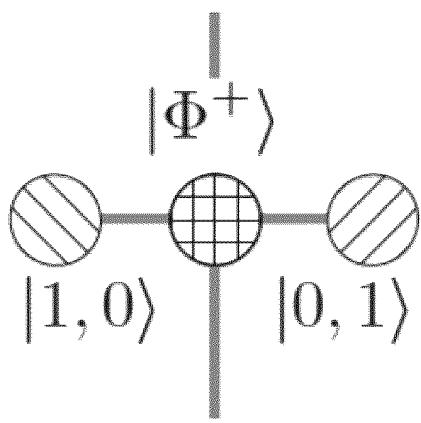
Figure 13D:
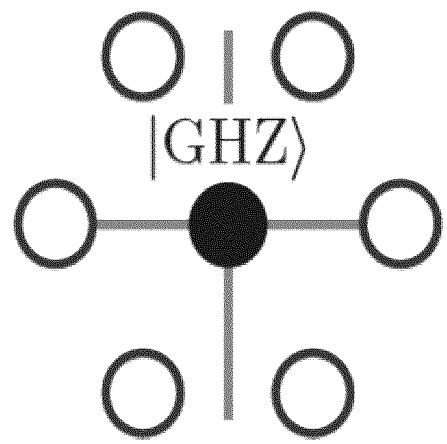

FIG. 12 illustrates a possible multi-qubit architecture: qubits (110) are longitudinally coupled to a readout resonator (109) and transversally coupled to a bus resonator (120). The readout resonator is used only when the longitudinal couplings are modulated and individual flux control for each qubit is possible with separated flux lines. The system Hamiltonian reads $$\hat{H} = \omega_{rz}\hat{a}_z^\dagger \hat{a}_z + \omega_{rx}\hat{a}_x^\dagger \hat{a}_x + \sum_j \frac{1}{2}\omega_{qj}\hat{\sigma}_{zj} + \sum_j g_{zj}\hat{\sigma}_{zj}(\hat{a}_z^\dagger + \hat{a}_z) + \sum_j g_{xj}\hat{\sigma}_{xj}(\hat{a}_x^\dagger + \hat{a}_x). \tag{S59}$$

In the interaction picture and neglecting fast-oscillating terms, the longitudinal coupling becomes $$\tilde{H}_z = \left(\frac{1}{2}\tilde{g}_z \sum_j \hat{\sigma}_{zj} e^{-i\varphi_{,i}}\right)\hat{a}_z + H.c. \tag{S60}$$

The position of the qubits and the coupling inductances can be adjusted to get equal longitudinal coupling strengths $|g_{zj}|$. By properly choosing the phases $\varphi_j$, it is possible to operate in the joint qubit readout mode or in the entanglement by measurement mode. Examples for 2 and 3 qubits are shown in FIGS. 13A, 13B, 13C and 13D (joint measurement of two qubits, synthesis of Bell states and 3-qubit GHZ state by measurement).

FIG. 12 shows a multi-qubit architecture consisting of qubits (110) longitudinally coupled to a readout resonator (109) and transversally coupled to a bus resonator (120) by way of bus-resonator fingers (119) capacitively coupled to the qubits. As in FIG. 10, the read-out resonator is coupled to an input transmission-line (113) but also to and output transmission-line (114). Similarly, the bus resonator is connected to both an input (116) and output (117) transmission-line for control. The ground plane (112) is placed on both sides of the resonators. Between the qubits (110), the pieces of ground planes are interconnected with air bridges (118). Flux control lines and qubit controls lines for each qubit are absent in this figure. FIGS. 13A, 13B, 13C and 13D show phase space representation of the pointer states for two and three qubits. On FIG. 13A, two-qubit joint readout ($\varphi_j = j\pi/2$). On FIGS. 13B and 13C, two-qubit entanglement by measurement is depicted. The double-hatched circles centered at the origin circles correspond to the Bell states $$|\Psi^-\rangle = \frac{1}{\sqrt{2}}[|0,1\rangle + |1,0\rangle]$$

and $$|\Phi^-\rangle = \frac{1}{\sqrt{2}}[|0,0\rangle + |1,1\rangle],$$

obtained for $\varphi_j = 0$ and $\varphi_j = j\pi$, respectively. On FIG. 13D, the centered at the origin circle corresponds to the GHZ state $$|GHZ\rangle = \frac{1}{\sqrt{2}}[|0,0,0\rangle + |1,1,1\rangle].$$

This configuration is obtained for $\varphi_j = j2\pi/3$

V. Qubit Dephasing

When not measuring the qubit, coupling to the resonator is turned off and the qubit is not dephased by photon shot noise or residual thermal population. In the superconducting qubit architecture studied in the previous section, another potential source of dephasing is flux noise. The influence of low-frequency flux noise on the transmon was already studied. Since the qubit is operated at its flux sweet spot, the effect of this noise can be negligible.

More interesting here is the contribution opened by the longitudinal coupling, that is flux noise at the resonator frequency which will effectively 'measure' the qubit. Following the standard procedure and using Equation (5) previously defined, in the presence of flux noise, longitudinal coupling leads to a decay of the qubit's off-diagonal density matrix element with $$\rho_{01}(t) = \tag{S61}$$

$$\rho_{01}(0)e^{i\omega_n t}\exp\left\{\frac{-\lambda^2}{2}\int_{-\infty}^{+\infty}\frac{d\omega}{2\pi}S_\Phi(\omega+\omega_r)\left[(2\bar{n}+1)\frac{\sin^2(\omega t/2)}{\omega^2} + 2\bar{m}\cos(\omega_r t - \theta)\frac{\sin(\omega t/2)\sin((\omega+2\omega_r)t/2)}{\omega(\omega+2\omega_r)}\right]\right\}.$$

In this expression, $S_{101}(\omega)$ is the spectral density of flux noise, $\bar{n} = \langle \hat{a}^\dagger \hat{a} \rangle$, $\bar{m}e^{i\theta} = \langle \hat{a}^2 \rangle$ and $$\lambda = \frac{\partial g_z}{\partial \Phi_x}\bigg|_{\Phi_x=0} = -\frac{\pi}{\Phi_0}\frac{E_J}{2}\left(\frac{2E_C}{E_J}\right)^{1/2}\sqrt{\frac{\pi Z_0}{R_K}}. \tag{S62}$$

The term in $\rho_{01}(t)$ not proportional to $\bar{n}$ or $\bar{m}$ takes the standard form, with the crucial difference that here the noise spectral density is evaluated at $\omega+\omega_r$ rather than at $\omega$. With $S_\Phi(\omega) = 2\pi A^2/|\omega|^\alpha$ even at large frequencies, dephasing caused by longitudinal coupling is therefore expected to be negligible. In practice, the terms proportional to $\bar{n}$ or $\bar{m}$ are expected to contribute only in the situation where the intra-cavity field would be squeezed prior to the qubit measurement. In this situation, $\bar{n}=\sin h^2 r$ and $\bar{m}=-\sin h(2r)/2$ with r the squeeze parameter.

Although decay is not exponential, the dephasing time can be estimated from the above expression by using the 1/e threshold as an estimate. For this an infrared cutoff must be introduced. Fortunately, the end result is only weakly dependent on this cutoff. For simplicity $\alpha=1$ is taken in the noise spectral density with $A=10^{-5}\Phi_0$. Using the parameters given in the text, in the absence of squeezing but with a large spurious photon number $\bar{n}=0.1$ a very large dephasing time of $\sim 10^2$ seconds is found. For a squeezed state of 20 dB a dephasing time larger than a second is found. This mechanism is clearly not limiting the qubit dephasing time.

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities. The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

We investigate an approach to universal quantum computation based on the modulation of longitudinal qubit-oscillator coupling. We show how to realize a controlled-phase gate by simultaneously modulating the longitudinal coupling of two qubits to a common oscillator mode. In contrast to the more familiar transversal qubit-oscillator coupling, the magnitude of the effective qubit-qubit interaction does not rely on a small perturbative parameter. As a result, this effective interaction strength can be made large, leading to short gate times and high gate fidelities. We moreover show how the gate fidelity can be exponentially improved with squeezing and how the entangling gate can be generalized to qubits coupled to separate oscillators. Our proposal can be realized in multiple physical platforms for quantum computing, including superconducting and spin qubits.

Introduction.—A widespread strategy for quantum information processing is to couple the dipole moment of multiple qubits to common oscillator modes, the latter being used to measure the qubits and to mediate long-range interactions. Realizations of this idea are found in Rydberg atoms, superconducting qubits and quantum dots amongst others. With the dipole moment operator being off-diagonal in the qubit's eigenbasis, this type of transversal qubit-oscillator coupling leads to hybridization of the qubit and oscillator degrees of freedom. In turn, this results in qubit Purcell decay and to qubit readout that is not truly quantum non-demolition (QND). To minimize these problems, the qubit can be operated at a frequency detuning from the oscillator that is large with respect to the transverse coupling strength $g_x$. This interaction then only acts perturbatively, taking a dispersive character. While it has advantages, this perturbative character also results in slow oscillator-mediated qubit entangling gates.

Rather than relying on the standard transversal coupling, $H_x = g_x(\hat{a}^\dagger + \hat{a})\hat{\sigma}_x$, an alternative approach is to use a longitudinal interaction, $H_z = g_z(\hat{a}^\dagger + \hat{a})\hat{\sigma}_z$. Since $H_z$ commutes with the qubit's bare Hamiltonian the qubit is not dressed by the oscillator. Purcell decay is therefore absent and qubit readout is truly QND. The absence of qubit dressing also allows for scaling up to a lattice of arbitrary size with strictly local interactions.

By itself, longitudinal interaction however only leads to a vanishingly small qubit state-dependent displacement of the oscillator field of amplitude $g_z/\omega_r \ll 1$, with $\omega_r$ the oscillator frequency. In Paper A, it was shown that modulating $g_z$ at the oscillator frequency $\omega_r$ activates this interaction leading to a large qubit state-dependent oscillator displacement and to fast QND qubit readout. In this Letter, we show how the same approach can be used, together with single qubit rotations, for universal quantum computing by introducing a fast and high-fidelity controlled-phase gate based on longitudinal coupling. The two-qubit logical operation relies on parametric modulation of a longitudinal qubit-oscillator coupling, inducing an effective $\hat{\sigma}_z\hat{\sigma}_z$ interaction between qubits coupled to the same mode. We show that, with a purely longitudinal interaction, the gate fidelity can be improved exponentially using squeezing, and that the gate can be performed remotely on qubits coupled to separate but interacting oscillators. The latter allows for a modular architecture that relaxes design constraints and avoids spurious interactions while maintaining minimal circuit complexity.

In contrast to two-qubit gates based on a transversal interaction, this proposal does not rely on strong qubit-oscillator detuning and is not based on a perturbative argument. As a result, the longitudinally mediated $\hat{\sigma}_z\hat{\sigma}_z$ interaction is valid for all qubit, oscillator and modulation parameters and does not result in unwanted residual terms in the Hamiltonian. For this reason, in the ideal case where the interaction is purely longitudinal (i.e. described by $H_z$), there are no fundamental bounds on gate infidelity or gate time and both can in principle be made arbitrarily small simultaneously.

Similarly to other oscillator-mediated gates, loss from the oscillator during the gate leads to gate infidelity. This can be minimized by working with high-Q oscillators something that is, however, in contradiction with the requirements for fast qubit readout. We solve this dilemma by exploiting quantum bath engineering, using squeezing at the oscillator input. By appropriately choosing the squeezed quadrature, we show how 'which-qubit-state' information carried by the photons leaving the oscillator can be erased. This leads to an exponential improvement in gate fidelity with squeezing strength.

Oscillator mediated qubit-qubit interaction.—Following Paper A, we consider two qubits coupled to a single harmonic mode via their $\hat{\sigma}_z$ degree of freedom. Allowing for a time-dependent coupling, the Hamiltonian reads (h=1)

$$\hat{H}(t) = \omega_r \hat{a}^\dagger \hat{a} + \frac{1}{2}\omega_{a1}\hat{\sigma}_{z1} + \frac{1}{2}\omega_{a2}\hat{\sigma}_{z2} + g_1(t)\hat{\sigma}_{z1}(\hat{a}^\dagger + \hat{a}) + g_2(t)\hat{\sigma}_{z2}(\hat{a}^\dagger + \hat{a}). \tag{1}$$

In this expression, $\omega_r$ and $\omega_{ai}$ are the frequencies of the oscillator and of the $i^{th}$ qubit, respectively, while $g_2(t)$ are the corresponding longitudinal coupling strengths.

In the absence of external drives or of modulation of the coupling, the longitudinal interaction only leads to a vanishingly small displacement of the oscillator field and can safely be dropped. This interaction can be rendered resonant by modulating $g_i(t)$ at the oscillator frequency leading to a large qubit-state dependent displacement of the oscillator state. Measurement of the oscillator by homodyne detection can then be used for fast QND qubit readout. Consequently, modulating the coupling at the oscillator frequency rapidly dephases the qubits. To keep dephasing to a minimum, we instead use an off-resonant modulation of $g_2(t)$ at a frequency $\omega_m$ detuned from $\omega_r$ by many oscillator linewidths $g_2(t)=g_i \cos(\omega_m t)$, where $g_{1,2}$ are constant real amplitudes.

The oscillator-mediated qubit-qubit interaction can be made more apparent by applying a polaron transformation $\hat{U}(t)=\exp[\Sigma_{i=1,2}\alpha_i(t)\hat{\sigma}_{zi}\hat{a}^\dagger$—H.c.] with an appropriate choice of $\alpha_i(t)$. Doing this, we find in the polaron frame the simple Hamiltonian $$\hat{H}_{pol}(t)=\omega_r \hat{a}^\dagger \hat{a}+J_z(t)\hat{\sigma}_{z1}\hat{\sigma}_{z2}. \tag{2}$$

The full expression for the $\hat{\sigma}_z\hat{\sigma}_z$-coupling strength $J_z(t)$ is given "Supplemental Material for Fast and High-Fidelity Entangling Gate through Parametrically Modulated Longitudinal Coupling", which we will henceforth refer to as SM B. In the following we will, however, assume two conditions on the total gate time, $t_g$, such that this expression simplifies greatly. For $\delta t_g = n \times 2\pi$ and $\omega_m t_g = m \times \pi$, with n and in integers, we can replace $J_z(t)$ by $$\bar{J}_z = -\frac{g_1 g_2}{2}\left[\frac{1}{\delta}+\frac{1}{\omega_r+\omega_m}\right], \tag{3}$$

where $\delta \equiv \omega_r-\omega_m$ is the modulation drive detuning.

By modulating the coupling for a time $t_g=\theta/4|\bar{J}_z|$, evolution under Eq. (2) followed by single qubit Z-rotations leads to the entangling controlled-phase gate $U_{CP}(\theta)=\text{diag}[1, 1, 1, e^{i\theta}]$ Since $U_{CP}(\pi)$ together with single qubit rotations forms a universal set, we only consider this gate from now on.

Note that the conditions on the gate time used in Eq. (3) are not necessary for the validity of Eq. (2), and the gate can be realized without these assumptions. However, as we will discuss below, these conditions are important for optimal gate performance: They ensure that the oscillator starts and ends in the vacuum state, which implies that the gate does not need to be performed adiabatically. Finally, not imposing the second constraint, $\omega_m t_g=m \times \pi$, only introduces fast rotating terms to Eq. (3) which we find to have negligible effect for the parameters used later in this Letter. In other words, this constraint can be ignored under a rotating-wave approximation.

The above situation superficially looks similar to controlled-phase gates based on transversal coupling and strong oscillator driving. There are, however, several key differences. With transversal coupling, the $\hat{\sigma}_z\hat{\sigma}_z$ interaction is derived using perturbation theory and is thus only approximately valid for small $g_x/\{\Delta, \delta_d\}$, with $\Delta$ the qubit-oscillator detuning and $\delta_d$ the oscillator-drive detuning. For the same reason, it is also only valid for small photon numbers $n \ll n_{crit} = \Delta^2/4g^2_x$. Moreover, this interaction is the result of a fourth order process in $g_x/\{\Delta,\delta_d\}$, leading to slow gates. Because of the breakdown of the dispersive approximation, any attempt to speed up the gate by decreasing the detunings or increasing the drive amplitude results in low gate fidelities. In contrast, with longitudinal coupling, the $\hat{\sigma}_z\hat{\sigma}_z$ interaction is conveniently the result of a second-order process in $g_{1,2}/\delta$. In addition, since Eq. (2) is obtained after exact transformations on the system Hamiltonian, it is valid for any value of $g_{1,2}/\delta$ and is independent of the oscillator photon number. As will become clear later, this implies that the gate time and the gate infidelity can be decreased simultaneously. Finally, with longitudinal coupling, there is no constraint on the qubit frequencies, in contrast with usual oscillator-induced phase gates where the detuning between qubits should preferably be small.

Oscillator-induced qubit dephasing.—FIG. 1 illustrates, for $g_1=g_2$, the mechanism responsible for the qubit-qubit interaction. Under longitudinal coupling, the oscillator field is displaced in a qubit-state dependent way, following the dashed lines in FIG. 1(a) (Panels (b) and (c) will be discussed later). This conditional displacement leads to a non-trivial qubit phase accumulation. This schematic illustration also emphasizes the main cause of gate infidelity for this type of controlled-phase gate, irrespective of its longitudinal or transversal nature: Photons leaking out from the oscillator during the gate carry information about the qubit state, leading to dephasing.

Figure 14A:
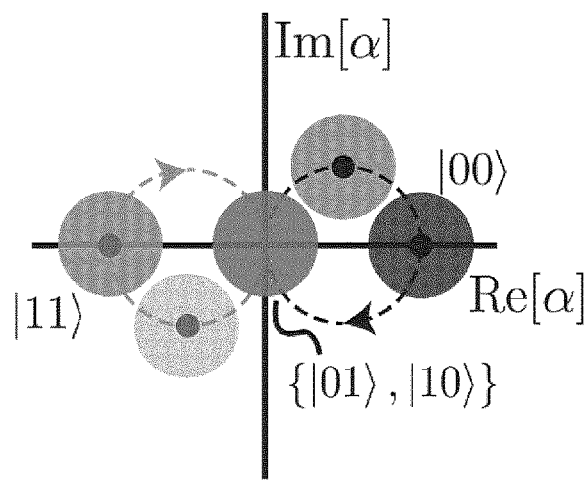
FIGS. 14A, 14B and 14D are schematic illustrations, in rotating frame, of the qubit-state dependent oscillator field in phase space.
Figure 14B:
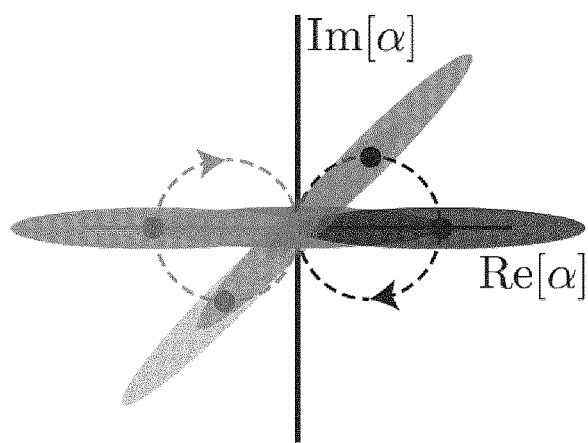
Figure 14C:
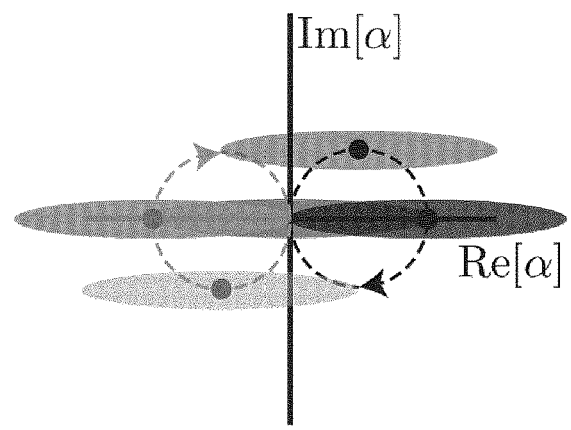

FIG. 14 (color online) is a schematic illustration, in a frame rotating at $\omega_r$, of the qubit-state dependent oscillator field in phase space for $g_1=g_2$ starting and ending in the vacuum state. The oscillator's paths for $|00\rangle$ and $|11\rangle$ are shown in dashed lines. The qubit-state dependent oscillator state is shown in light ($t=t_g/4$) and dark greys ($t=t_g/2$). The oscillator's state associated to $\{|01\rangle, |10\rangle\}$ stays in the vacuum state for the duration of the gate. (a) No squeezing. (b, c) Squeezing can help in erasing the which qubit-state information.

A quantitative understanding of the gate infidelity under photon loss can be obtained by deriving a master equation for the joint qubit-oscillator system. While general expressions are given in SM B. To simplify the discussion we assume here that $g_1=g_2 \equiv g$. Following the standard approach, the Lindblad master equation in the polaron frame reads $$\dot{\rho}(t) = -i[\hat{H}_{pol}, \rho(t)] + \kappa \mathcal{D}[\hat{a}]\rho(t) + \Gamma[1 - \cos(\delta t)]\mathcal{D}[\hat{\sigma}_{z1} + \hat{\sigma}_{z2}]\rho(t), \quad (4)$$

where $\kappa$ is photon decay rate and $\mathcal{D}[x]$ denotes the usual dissipation super-operator $\mathcal{D}[x]\bullet = x\bullet x^\dagger - 1/2\{x^\dagger x, \bullet\}$. The last term of Eq. (4) corresponds to a dephasing channel with rate $\Gamma = 2\kappa(g/2\delta)^2$. Since $\hat{H}_{pol}$ does not generate qubit-oscillator entanglement during the evolution, we can ensure that $\Gamma$ is the only source of dephasing by imposing that the initial and final polaron transformations do not lead to qubit-oscillator entanglement. This translates to the condition $\alpha_i(0) = \alpha_i(t_g) = 0$ and is realized for $\delta t_g = n \times 2\pi$, which is the constraint mentioned earlier (neglecting fast-rotating terms related to the second constraint $\omega_m t_g = m \times \pi$). More intuitively, it amounts to completing n full circles in FIG. 1, the oscillator ending back in its initial state. Note that these conclusions remain unchanged if the oscillator is initially in a coherent state. As a result, there is no need for the oscillator to be empty at the start of the gate.

Figure 15A:
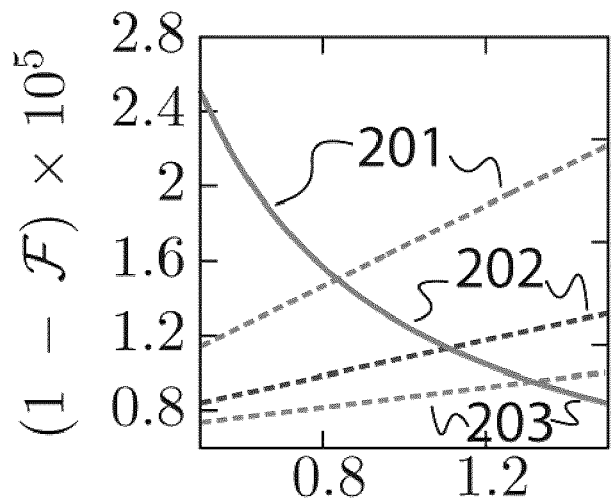
FIGS. 15A, 15B and 15C are schematic illustrations of average gate infidelity and gate time.
Figure 15B:
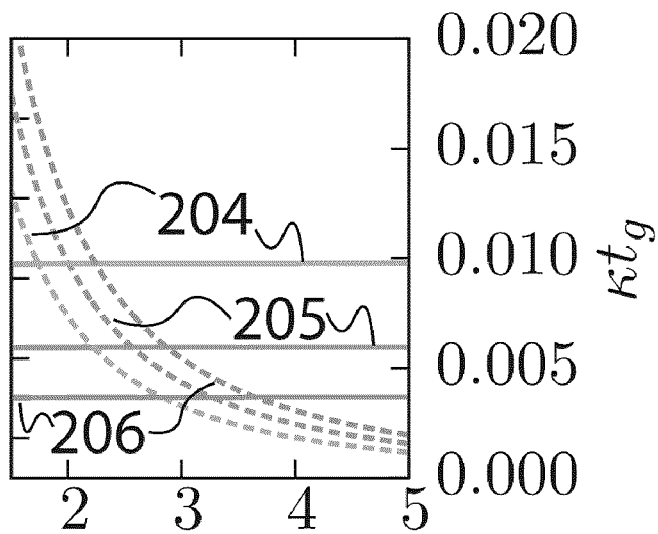
Figure 15C:
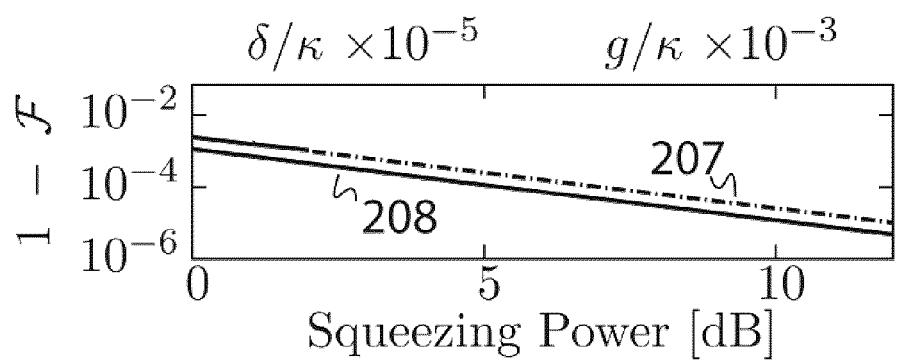

FIGS. 15a, 15b and 15c (color online) show average gate infidelity 1-$\mathcal{F}$ (full line) and gate time (dashed lines) of $U_{cp}(\pi)$ as a function of (a) detuning, (b) coupling strength and (c) squeezing power. In FIG. 15(a) $g/\kappa \times 10^{-3}$ is fixed at 2 (201), 3 (202), 4 (203). Note that the corresponding three infidelity curves are indistinguishable on this scale. In FIG. 15(b) $\delta/\kappa \times 10$-5 is fixed at 0.75 (204), 1 (205), 1.25 (206). In panel FIG. 15(c) parameters are $\delta/2\pi$=0.6 GHz, g/2$\pi$=60 MHz, $t_g$ =42.7 ns, $\kappa/2\pi$=1 MHz. (207) rotating squeezing angle as illustrated in FIG. 15(b). (208) squeezing at $\omega$ as illustrated in FIG. 15(c), and K(wm)=0 simulating a filter reducing the density of modes to zero at $\omega_m$.

Based on the dephasing rate $\Gamma$ and on the gate time $t_g$, a simple estimate for the scaling of the gate infidelity is $1-\mathcal{F} \sim \Gamma \times t_g \sim \kappa/\delta[1]$. A key observation is that this gate error is independent of g, while the gate time scales as $t_g \sim \delta/g^2$. Both the gate time and the error can therefore, in principle, be made arbitrarily small simultaneously. This scaling of the gate error and gate time is confirmed by the numerical simulations of FIG. 2, which shows the dependence of the gate infidelity on detuning $\delta$ and coupling strength g, as obtained from numerical integration of Eq. (4). As expected increase in both fidelity (full lines) and gate time (dashed lines) with increasing detuning $\delta$ are apparent in panel (a). In addition, panel (b) confirms that, to a very good approximation, the fidelity is independent of g (full lines) while the gate time decreases as $t_g \sim 1/g^2$ (dashed lines).

This oscillator-induced phase gate can be realized in a wide range of physical platforms where longitudinal coupling is possible. Examples include spin qubits in inhomogeneous magnetic field, singlet-triplet spin qubits, flux qubits capacitively coupled to a resonator and transmon-based superconducting qubits. The parameters used in FIG. 2 have been chosen following the latter references. In particular, taking $\kappa/2\pi$=0.01 MHz, g/2$\pi$=60 MHz and $\delta/2\pi$=537 MHz results in a very short gate time of $t_g$=37 ns with an average gate infidelity as small as $2\times10^{-5}$. Taking into account finite qubit lifetimes $T_1$=30 µs and $T_2$=20 µs, we find that the infidelity is increased to $\sim 10^{-3}$. In other words, the gate fidelity is limited by the qubit's natural decoherence channels with these parameters.

A crucial feature of this gate is that the circular path followed by the oscillator field in phase space maximizes qubit-state dependent phase accumulation while minimizing de-phasing, allowing for high gate fidelities. Furthermore, we show below that this also allows for exponential improvement in gate fidelity with squeezing. It is therefore desirable to minimize, or avoid completely, dispersive coupling in experimental implementations [2].

Improved fidelity with squeezing—As discussed above, for fixed g and $\delta$ the fidelity increases with decreasing n. A small oscillator decay rate $\kappa$, however, comes at the price of longer measurement time if the same oscillator is to be used for readout. This problem can be solved by sending squeezed radiation to the oscillator's readout port. As schematically illustrated in FIG. 1, by orienting the squeezing axis with the direction of the qubit-dependent displacement of the oscillator state, the which-path information carried by the photons leaving the oscillator can be erased. By carefully choosing the squeezing angle and frequency, it is thus possible to improve the gate performance without reducing $\kappa$. We now show two different approaches to realize this, referring the reader to SM B for technical details.

A first approach is to send broadband two-mode squeezed vacuum at the input of the oscillator, where the squeezing source is defined by a pump frequency $\omega_p = (\omega_r + \omega_m)/2$ and a squeezing spectrum with large degree of squeezing at $\omega_r$ and $\omega_m$. A promising source of this type of squeezing is the recently developed Josephson travelling wave amplifiers. With such a squeezed input field, a coherent state of the oscillator becomes a squeezed state with a squeezing angle that rotates at a frequency $\delta/2$. As illustrated in FIG. 1(b), this is precisely the situation where the anti-squeezed quadrature and the displacement of the oscillator's state are aligned at all times. This leads to an exponential decrease in dephasing rate $$\Gamma(r) \sim e^{-2r}\Gamma(0), \quad (5)$$

with r the squeezing parameter. This reduction in dephasing rate leads to the exponential improvement in gate fidelity with squeezing power shown by the brown line in FIG. 2(c). An interesting feature in this Figure is that increasing $\kappa$ by 2 orders of magnitude to allow for fast measurement, leads to the same $\sim 10^{-5}$ gate infidelity obtained above without squeezing here using only ~6 dB of squeezing. Since numerical simulations are intractable for large amount of squeezing, we depict the infidelity obtained from a master equation simulation by a solid line and the expected infidelity from analytical calculations by a dash-dotted line.

An alternative solution is to use broadband squeezing centered at the oscillator's frequency, i.e. a squeezing source defined by a pump frequency $\omega_p = \omega_r$. As illustrated in FIG. 1(c), using this type of input leads to a squeezing angle that is constant in time in a frame rotating at $\omega_r$. With this choice, information about the qubits' state contained in the $\hat{a}^\dagger + \hat{a}$ quadrature of the field is erased while information in the $i(\hat{a}^\dagger - \hat{a})$ quadrature is amplified (cf. FIG. 1). By itself, this does not lead to a substantial fidelity improvement. However, a careful treatment of the master equation shows that Eq. (5) can be recovered by adding a filter reducing the density of modes at $\omega_m$ to zero at the output port of the oscillator. Filters of this type are routinely used experimentally to reduce Purcell decay of superconducting qubits. As illustrated by the dark blue line in FIG. 2(c), using single-mode squeezing at $\omega_r$ and a filter at the modulation frequency, we recover the same exponential improvement found with two-mode squeezing, Eq. (5), in addition to a factor of two decrease in gate infidelity without squeezing.

Interestingly, rotating the squeezing axis by $\pi/2$ when squeezing at the oscillator frequency helps in distinguishing the different oscillator states and has been shown to lead to an exponential increase in the signal-to-noise ratio for qubit readout. In practice, the difference between performing a two-qubit gate and a measurement is thus the parametric modulation frequency (off-resonant for the gate and on resonance for measurement) and the choice of squeezing axis.

We note that Eq. (5) was derived from a master equation treatment under the standard secular approximation, which is not valid at high squeezing powers (here, ≳14 dB). At such high powers, the frequency dependence of n together with other imperfections are likely to be relevant.

Circuit QED implementation.—The proposed gate is applicable in a variety of physical systems where Eq. (1) is realizable. As examples, we mention flux qubits capacitively coupled to a resonator and spin qubits. We here propose an alternative realization based on transmon qubits, which are particularly attractive due to their excellent coherence times. The circuit we consider is illustrated in FIG. 3, and more details are given in SM B. This realization does not, in fact, give an exact realization of Eq. (1), as we show below that there are additional terms in the effective Hamiltonian, but these terms turn out to not be of any detrimental consequence for the gate. This circuit QED realization with transmon qubits is an extension to two qubits of the circuit introduced in Paper A. A detailed derivation of the Hamiltonian of this circuit yields in the two-level approximation $$\hat{H}^{circ}(t) = \omega_r \hat{a}^\dagger \hat{a} - \varepsilon(t)(\hat{a} + \hat{a}^\dagger) + \sum_i \left[ \frac{\omega_{ai}}{2} \hat{\sigma}_{zi} + g_i(t)(\hat{a} + \hat{a}^\dagger)\hat{\sigma}_{zi} + \chi_i \hat{a}^\dagger \hat{a} \hat{\sigma}_{zi} \right], \quad (6)$$

where modulation of the external fluxes indicated in FIG. 3 leads to the desired modulation of the longitudinal coupling, $g_i(t) \sim \Phi_i(t)$, in addition to a small renormalization of the qubits frequencies. A large drive on the resonator leads to a similar effect, which means that in practice the longitudinal couplings can be modulated either through external fluxes or a strong resonator drive.

This Hamiltonian is different from Eq. (1) due to the presence of the $\chi_i$ ac-Stark shifts. We have also included a drive term $\varepsilon(t)$, which includes a flux-induced contribution, but can be tuned via a gate voltage applied to the resonator (not shown in the figure). Note that the $\chi_i$-terms are not the result of a dispersive approximation to a Jaynes-Cummings Hamiltonian but appear naturally in this circuit and does not introduce any Purcell decay or unwanted resonator-qubit hybridization. For reasonable circuit parameters, we find that $\chi_i \sim g_i$, which means that these ac-Stark shifts cannot be neglected. However, a $\hat{\sigma}_{z1} \hat{\sigma}_{z2}$ interaction can be made explicit through a polaron-type transformation which leads, in the symmetric case $\chi_1 = \chi_2 \equiv \chi$, $g_1 = g_2 \equiv g$ (taken for simplicity), to the transformed Hamiltonian $$\hat{H}^{circ}_{pol}(t) = \delta \hat{a}^\dagger \hat{a} + \chi \hat{a}^\dagger \hat{a}(\sigma_{z1} + \sigma_{z2}) + J_z(t)\sigma_{z1}\sigma_{z2} + \frac{\varpi(t)}{2}(\hat{\sigma}_{z1} + \hat{\sigma}_{z2}), \quad (7)$$

where full expressions for $J_z(t)$ and $\overline{\omega}(t)$ can be found in SM B. This equation is very similar to Eq. (2) in the sense that the ac-Stark shift does not play a role since the resonator stays in its ground state in this frame (assuming an initial vacuum state). The additional single qubit Z rotations can be corrected for through standard single-qubit gates.

There are however two main differences with Eq. (2). First, we have to impose an additional condition $2\chi t_g = 2\pi \times p$ with p an integer to avoid residual resonator-qubit entanglement at the end of the gate. Then, $J_z(t)$ can be replaced by $$J_{z0} = \frac{-(g\delta + \varepsilon\chi)^2}{2\delta(\delta^2 - 4\chi^2)}, \quad (8)$$

where we have assumed the $\varepsilon(t) = \varepsilon \cos(\omega_m t)$ real, for simplicity. The second difference is that the paths in phase space differ from the paths shown in FIG. 1. Unfortunately we find that in the presence of ac-Stark shift, squeezing cannot be used to reduce the dephasing rate substantially since it is not possible to align the anti-squeezed quadrature and the displacement of the field at all times. These differences aside, the gate time and infidelity stay approximately the same in the absence of squeezing. For example, taking $\kappa/2\pi = 0.01$ MHz, $g/2\pi = 40$ MHz, $\chi/2\pi = 75$ MHz, $\varepsilon = 158$ MHz and $\delta/2\pi = 600$ MHz results in a gate time of $t_g = 40$ ns with an average gate infidelity of $5 \times 10^{-5}$, which is comparable to the numbers based on Eq. (1).

Independent control of the couplings can be used for individual qubit readout while single-qubit X and Y rotations can be realized by driving weakly coupled voltage gates (not shown in the figure). It is interesting to note that longitudinal coupling can alternatively be obtained from the dispersive regime of transveral coupling under appropriate resonator drive. This approximate realization of longitudinal coupling however suffers from all of the above mentioned drawbacks of the transversal coupling from which it emerges.

Figure 16:
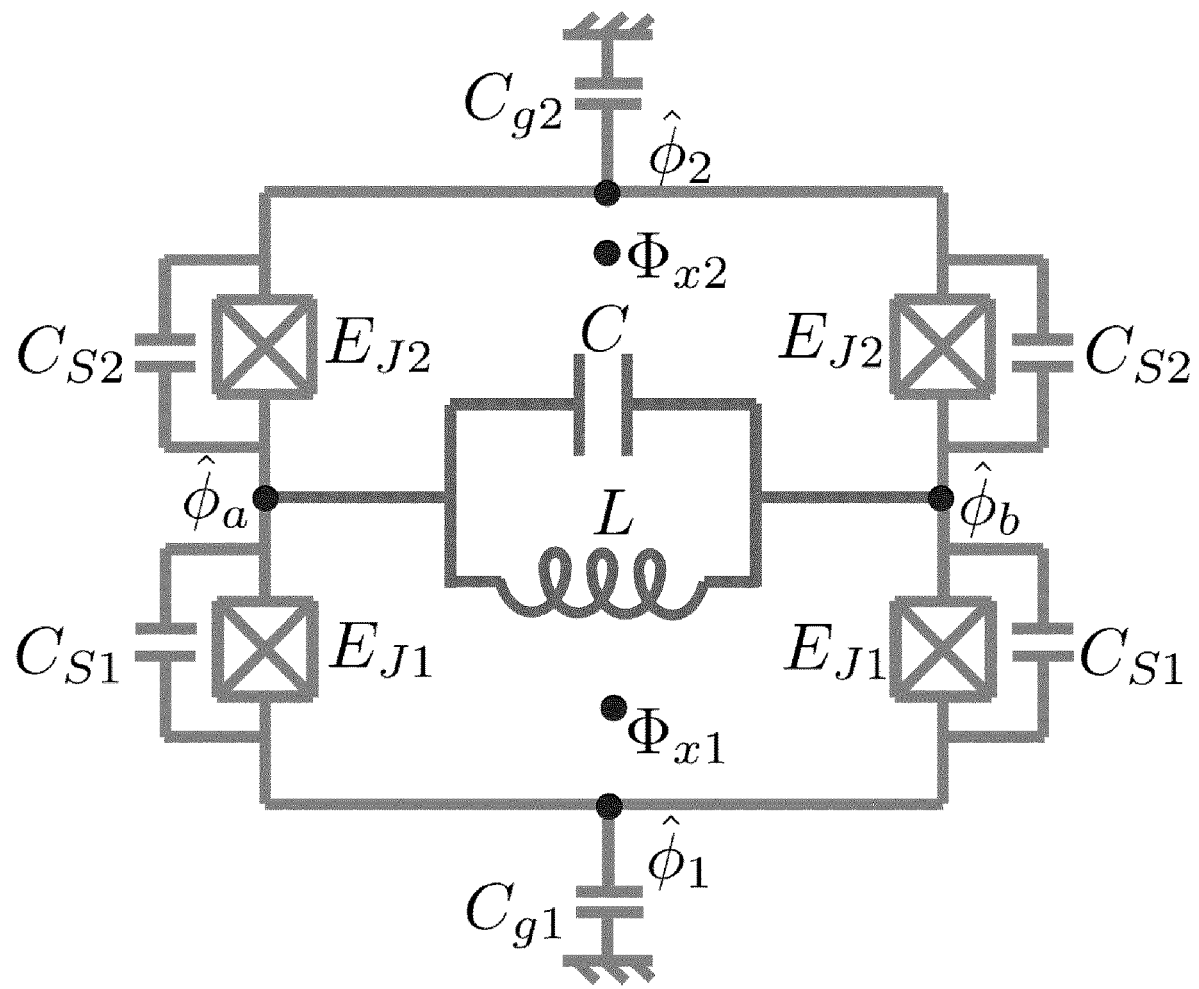
FIG. 16 is a logical representation of physical characteristics of longitudinal interaction with two qubits coupled to a common LC oscillator.
Figure 17:
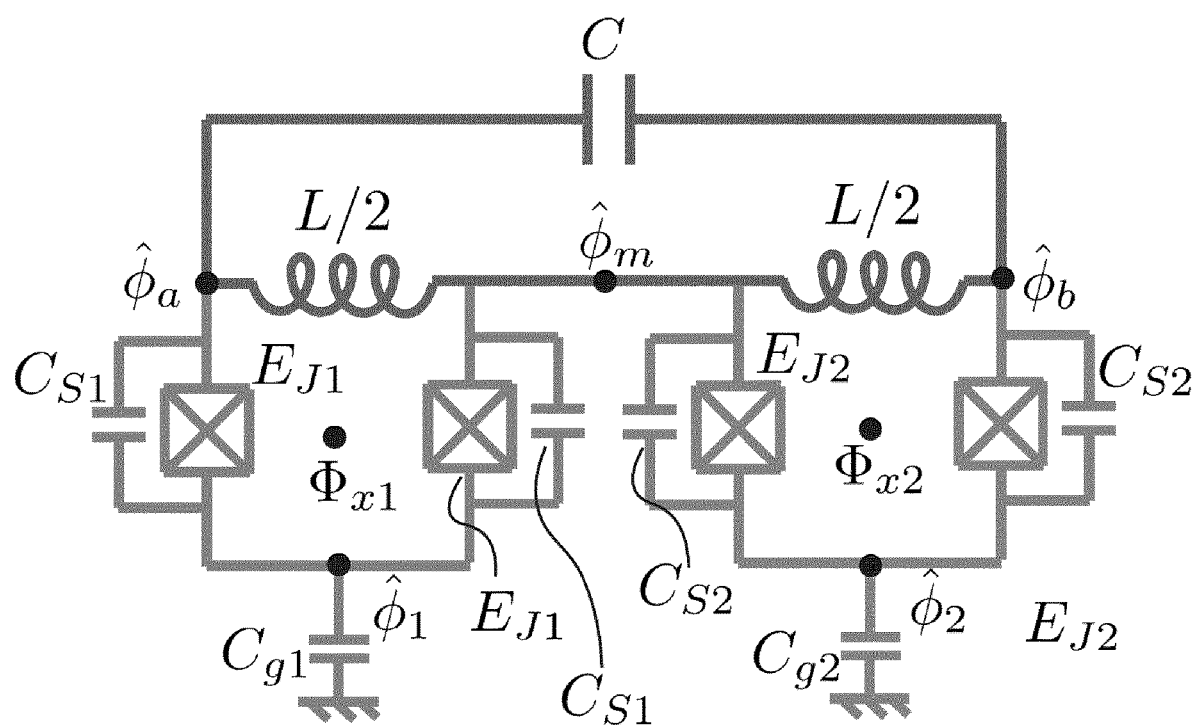
FIG. 17 is a logical representation of physical characteristics of longitudinal interaction with two qubits is series.
Figure 18A:
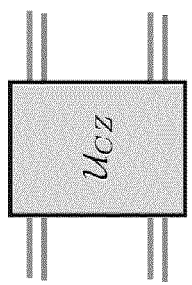
FIGS. 18A and 18B are tensor representations of a CZ gate supermatrix.
Figure 18B:
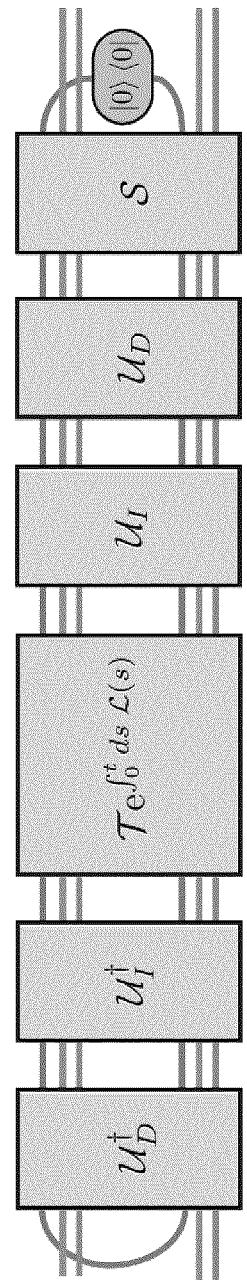

Scalability. So far we have focused on two qubits coupled to a single common oscillator, Longitudinal cou-pling of several qubits to separate oscillators that are them-selves coupled transversely has favorable scaling properties. Interestingly, the gate introduced in this Letter can also be implemented in such an architecture. Consider two qubits interacting with distinct, but coupled, oscillators with the corresponding Hamiltonian:

FIGS. 16 and 17 (Color online.) show a circuit QED implementation of longitudinal interaction with two qubits coupled to a common LC oscillator. Further details on the mapping of this circuit to Eq. (6) can be found in SM B.

$$\hat{H}_{ab} = \omega_a \hat{a}^\dagger \hat{a} + \omega_b \hat{b}^\dagger \hat{b} + \frac{1}{2}\omega_{a1}\hat{\sigma}_{z1} + \frac{1}{2}\omega_{a2}\hat{\sigma}_{z2} + \qquad (9)$$
$$g_1(t)\hat{\sigma}_{z1}(\hat{a}^\dagger + \hat{a}) + g_2(t)\hat{\sigma}_{z2}(\hat{b}^\dagger + \hat{b}) - g_{ab}(\hat{a}^\dagger - \hat{a})(\hat{b}^\dagger - \hat{b}).$$

In this expression, $\hat{a}$, $\hat{b}$ label the mode of each oscillator of respective frequencies $\omega_{a,b}$, and $g_{ab}$ is the oscillator-oscillator coupling. As above, $g_{1,2}(t)$ are modulated at the same frequency $\omega_m$, corresponding to the detunings $\delta_a \equiv \omega_a - \omega_m$ and $\delta_b \equiv \omega_b - \omega_m$. Following the same procedure as above and performing a rotating-wave approximation for simplicity, we find a Hamiltonian in the polaron frame of the same form as Eq. (2), but now with a modified $\hat{\sigma}_z \hat{\sigma}_z$ interaction strength $$\bar{J}_z = \frac{1}{2} \frac{g_1 g_2 g_{ab}}{\bar{\delta}^2 - g_{ab}^2(1+\zeta^2)}, \qquad (10)$$

where $\bar{\delta} = (\delta_a + \delta_b)/2$ and $\zeta = (\omega_b - \omega_a)/(2g_{ab})$ This implementation allows for a modular architecture, where each unit cell is composed of a qubit and coupling oscillators, used for both readout and entangling gates. Such a modular approach can relax design constraints and avoids spurious interactions with minimal circuit complexity.

Conclusion.—We have proposed a controlled-phase gate based on purely longitudinal coupling of two qubits to a common oscillator mode. The key to activating the qubit-qubit interaction is a parametric modulation of the qubit-oscillator coupling at a frequency far detuned from the oscillator. The gate infidelity and gate time can in principle be made arbitrarily small simultaneously, in stark contrast to the situation with transversal coupling. We have also shown how the gate fidelity can be exponentially increased using squeezing and that it is independent of qubit frequencies. The gate can moreover be performed remotely in a modular architecture based on qubits coupled to separate oscillators. Together with the fast, QND and high-fidelity measurement scheme presented in Paper A, this makes a platform based on parametric modulation of longitudinal coupling a promising path towards universal quantum computing in a wide variety of physical realizations.

[1] Note that $1-\mathcal{F}$ refers only to the error due to photon decay, excluding the qubits natural $T_1$ and $T_2$ times.

[2] This can be done by reducing the participation ratio, $\eta$, such that $x \leq \kappa$.

Supplemental Material

This supplemental material is organized as follows: In Sect. I we derive a general master equation for two qubits coupled to a single oscillator that is itself coupled to an external bath. We then use this result to study three cases: a standard bath at zero temperature, a bath that is two-mode squeezed at the modulation and oscillator frequency and a bath that is squeezed at the oscillator frequency. In Sect. II we give more information about possible physical implementations. In Sect. III we give details for a possible circuit QED realization. In Sect. IV we show how the gate can be realized for qubits that are in separate, but coupled, oscillators. In Sect. V we give more details about the numerical simulations and finally in Sect. VI we derive an error bound for the secular approximation made in deriving the master equation.

I. DERIVATION OF THE MASTER EQUATION

In this section, we follow the procedure outlined in the main Letter, taking damping of the oscillator into account. We start with the full Hamiltonian of two qubits longitudinally coupled to an oscillator, and a bath coupled to the oscillator ($\hbar = 1$), $$\hat{H} = \hat{H}_0 + \hat{H}_{qr} + \hat{H}_{rf}, \tag{S1}$$

$$\hat{H}_0 = \omega_r \hat{a}^\dagger \hat{a} + \tfrac{1}{2}\omega_{a1}\hat{\sigma}_{z1} + \tfrac{1}{2}\omega_{a2}\hat{\sigma}_{z2} + \int_0^\infty d\omega\, \omega \hat{b}_\omega^\dagger \hat{b}_\omega, \tag{S2}$$

$$\hat{H}_{qr} = g_1(t)\hat{\sigma}_{z1}(\hat{a}^\dagger + \hat{a}) + g_2(t)\hat{\sigma}_{z2}(\hat{a}^\dagger + \hat{a}), \tag{S3}$$

$$\hat{H}_{rf} = \int_0^\infty \frac{d\omega}{\sqrt{2\pi}} \sqrt{\kappa(\omega)}(\hat{a} + \hat{a}^\dagger)(\hat{b}_\omega + \hat{b}_\omega^\dagger), \tag{S4}$$

where $\hat{H}_{qr}$ is the qubit-oscillator coupling Hamiltonian and $\hat{H}_{rf}$ is the oscillator-bath coupling Hamiltonian. $\hat{b}_\omega$ ($\hat{b}_\omega^\dagger$) is a bath mode annihilation (creation) operator, satisfying the commutation relation $[\hat{b}_\omega, \hat{b}_{\omega'}^\dagger] = \delta(\omega - \omega')$, and $\kappa(\omega)$ is the damping rate of the oscillator at frequency $\omega$. We assume the form $g_1(t) = g_1 \cos(\omega_m t)$, $g_2(t) = g_2 \cos(\omega_m t + \phi)$ for the qubit-oscillator couplings, with $\phi = 0$ and the modulation frequency far from the oscillator frequency $\delta \equiv \omega_r - \omega_m$. Setting $\phi = \pi$ leads to a very similar derivation, with ultimately a sign difference in the $\hat{\sigma}_{z1}\hat{\sigma}_{z2}$ interaction and allowing us to choose between a ferromagnetic or an antiferromagnetic interaction.

Following the approach outlined in the Letter, we first go to a polaron frame by applying the unitary transformation $$\hat{U}(t) = \exp\left[(\alpha_1 \hat{\sigma}_{z1} + \alpha_2 \hat{\sigma}_{z2})\hat{a}^\dagger - (\alpha_1^* \hat{\sigma}_{z1} + \alpha_2^* \hat{\sigma}_{z2})\hat{a}\right], \tag{S5}$$

with $$\alpha_j(t) = \frac{g_j}{2}\left(\frac{e^{-i\omega_m t} - e^{-i\omega_r t}}{\delta} + \frac{e^{i\omega_m t} - e^{-i\omega_r t}}{\omega_r + \omega_m}\right), \tag{S6}$$

leading to the transformed Hamiltonian $$\begin{aligned}\hat{H}_{\text{pol}} &= \hat{U}^\dagger \hat{H}_R \hat{U} - i\hat{U}^\dagger \dot{\hat{U}} \\ &= \omega_r \hat{a}^\dagger \hat{a} + J_z(t)\hat{\sigma}_{z1}\hat{\sigma}_{z2} + \tfrac{1}{2}\omega_{a1}\hat{\sigma}_{z1} + \tfrac{1}{2}\omega_{a2}\hat{\sigma}_{z2} \\ &\quad + \int_0^\infty \frac{d\omega}{\sqrt{2\pi}}\sqrt{\kappa(\omega)}(\hat{a}+\hat{a}^\dagger)(\hat{b}_\omega e^{-i\omega t} + \hat{b}_\omega^\dagger e^{i\omega t}) \\ &\quad - \int_0^\infty \frac{d\omega}{\sqrt{2\pi}}\sqrt{\kappa(\omega)}(\hat{\mathcal{O}} e^{-i\omega_m t} + \hat{\mathcal{O}} e^{i\omega_m t})(\hat{b}_\omega e^{-i\omega t} + \hat{b}_\omega^\dagger e^{i\omega t}) \\ &\quad + \int_0^\infty \frac{d\omega}{\sqrt{2\pi}}\sqrt{\kappa(\omega)}(\hat{\mathcal{O}} e^{-i\omega_r t} + \hat{\mathcal{O}} e^{i\omega_r t})(\hat{b}_\omega e^{-i\omega t} + \hat{b}_\omega^\dagger e^{i\omega t}).\end{aligned} \tag{S7}$$

To simplify expressions, we have defined a two-qubit operator $$\hat{\mathcal{O}} \equiv \frac{g_1 \hat{\sigma}_{z1} + g_2 \hat{\sigma}_{z2}}{2}\left(\frac{1}{\delta} + \frac{1}{\omega_r + \omega_m}\right) \equiv \frac{g_1 \hat{\sigma}_{z1} + g_2 \hat{\sigma}_{z2}}{2\tilde{\delta}}, \tag{S8}$$

with $\tilde{\delta} = [1/\delta + 1/(\omega_r + \omega_m)]^{-1}$, and the qubit-qubit coupling strength $$J_z(t) = -\frac{g_1 g_2}{2\delta}\left\{1 - \cos(\delta t) - \cos[(\omega_m + \omega_r)t] + \frac{2\omega_r}{\omega_r + \omega_m}\cos(2\omega_m t)\right\} \\ - \frac{g_1 g_2}{2(\omega_m + \omega_r)}\left\{1 - \cos(\delta t) - \cos[(\omega_m + \omega_r)t]\right\}. \tag{S9}$$

It is important to note that, up to this point, all transformations performed are exact. Also, we have specifically chosen $\alpha(t)$ in such a way that at all times the oscillator's state is vacuum in the polaron frame. We will use this fact later in the discussion.

In practice Eq. (S9) can be simplified greatly if we impose the two conditions $\delta t_g = 2n\pi$, $2\omega_m t_g = 2m\pi$ on the modulation parameters, with n and m integers. In this case, all the cosine terms in Eq. (S9) average to zero and can be dropped exactly. We can thus use $$J_z(t) = \bar{J}_z = -\frac{g_1 g_2}{2\tilde{\delta}} \qquad \text{for } \delta t_g = n \times 2\pi, \quad \omega_m t_g = m \times \pi. \tag{S10}$$

We emphasize that in the main letter we used $\bar{J}_z$ for the qubit-qubit coupling to simplify the discussion, but in general there is no obstacle to keeping the full form of $J_z(t)$, Eq. (S9). In the numerical results presented, we always use the full form.

To derive the Lindblad Master equation, we transform to the interaction picture with the unitary transformation $$\hat{U}_I = \exp\left\{-i\int_0^t ds\, [H_0 + J_z(s)\hat{\sigma}_{z1}\hat{\sigma}_{z2}]\right\}, \tag{S11}$$

leading to $$\hat{H}_{\text{pol}}^I = \int_0^\infty \frac{d\omega}{\sqrt{2\pi}}\sqrt{\kappa(\omega)}\left[(\hat{a} + \hat{\mathcal{O}})e^{-i\omega_r t} + (\hat{a}^\dagger + \hat{\mathcal{O}})e^{i\omega_r t}\right](\hat{b}_\omega e^{-i\omega t} + \hat{b}_\omega^\dagger e^{i\omega t}) \\ - \int_0^\infty \frac{d\omega}{\sqrt{2\pi}}\sqrt{\kappa(\omega)}(\hat{\mathcal{O}}e^{-i\omega_m t} + \hat{\mathcal{O}}e^{i\omega_m t})(\hat{b}_\omega e^{-i\omega t} + \hat{b}_\omega^\dagger e^{i\omega t}). \tag{S12}$$

This expression can be simplified by defining $\hat{B}(t) \equiv \int_0^\infty d\omega\, (\hat{b}_\omega e^{-i\omega t} + \hat{b}_\omega^\dagger e^{i\omega t})$ and assuming that $\kappa(\omega)$ is independent of frequency close to $\omega_m$ and $\omega_r$ according to the usual Markov approximation. Defining $\kappa(\omega_m) \equiv \kappa_m$ and $\kappa(\omega_r) \equiv \kappa_r$, we can write $$\hat{H}_{\text{pol}}^I = \sqrt{\frac{\kappa_r}{2\pi}}\left[(\hat{a} + \hat{\mathcal{O}})e^{-i\omega_r t} + (\hat{a}^\dagger + \hat{\mathcal{O}})e^{i\omega_r t}\right]\hat{B}(t) - \sqrt{\frac{\kappa_m}{2\pi}}(\hat{\mathcal{O}}e^{-i\omega_m t} + \hat{\mathcal{O}}e^{i\omega_m t})\hat{B}(t) \tag{S13}$$

$$= \sum_n \sqrt{\frac{\kappa_n}{2\pi}}(\hat{\mathcal{C}}_n e^{-i\omega_n t} + \hat{\mathcal{C}}_n^\dagger e^{i\omega_n t})\hat{B}(t), \tag{S14}$$

where $n = r, m$ and $\hat{\mathcal{C}}_r \equiv \hat{a} + \hat{\mathcal{O}}, \hat{\mathcal{C}}_m \equiv -\hat{\mathcal{O}}$.

Using this result and following the standard approach, we find a Born-Markov master equation $$\dot{\rho}(t) = -\int_0^\infty d\tau\, \text{Tr}_f\{[\hat{H}_{\text{pol}}^I(t), [\hat{H}_{\text{pol}}^I(t-\tau), \rho(t) \otimes \rho_f]]\}, \tag{S15}$$

where $\rho(t)$ is the density matrix of the qubit-oscillator system and $\rho_f$ the density matrix of the oscillator's bath. Using Eq. (S13) and defining $S(t,\omega) \equiv \int_0^\infty d\tau\, \langle \hat{B}(t-\tau)\hat{B}(t)\rangle e^{-i\omega\tau}$, $S^*(t,\omega) \equiv \int_0^\infty d\tau\, \langle \hat{B}(t)\hat{B}(t-\tau)\rangle e^{i\omega\tau}$ results in $$\dot{\rho}(t) = \sum_{n,n'} -i[\Delta(\omega_n, -\omega_{n'}, t)\hat{\mathcal{C}}_n\hat{\mathcal{C}}_{n'}, \rho(t)] + \Gamma(\omega_n, -\omega_{n'}, t)\mathcal{D}[\hat{\mathcal{C}}_n, \hat{\mathcal{C}}_{n'}]\rho(t) \\ - i[\Delta(-\omega_n, \omega_{n'}, t)\hat{\mathcal{C}}_n^\dagger\hat{\mathcal{C}}_{n'}^\dagger, \rho(t)] + \Gamma(-\omega_n, \omega_{n'}, t)\mathcal{D}[\hat{\mathcal{C}}_n^\dagger, \hat{\mathcal{C}}_{n'}^\dagger]\rho(t) \\ - i[\Delta(-\omega_n, -\omega_{n'}, t)\hat{\mathcal{C}}_n^\dagger\hat{\mathcal{C}}_{n'}, \rho(t)] + \Gamma(-\omega_n, -\omega_{n'}, t)\mathcal{D}[\hat{\mathcal{C}}_n^\dagger, \hat{\mathcal{C}}_{n'}]\rho(t) \\ - i[\Delta(\omega_n, \omega_{n'}, t)\hat{\mathcal{C}}_n\hat{\mathcal{C}}_{n'}^\dagger, \rho(t)] + \Gamma(\omega_n, \omega_{n'}, t)\mathcal{D}[\hat{\mathcal{C}}_n, \hat{\mathcal{C}}_{n'}^\dagger]\rho(t), \tag{S16}$$

where $$\mathcal{D}[\hat{x},\hat{y}]\bullet = \hat{x}\bullet\hat{y} - \frac{1}{2}\{\hat{y}\hat{x},\bullet\},\tag{S17}$$

$$\Gamma(\omega_n,\omega_{n'},t) = \frac{\sqrt{\kappa_n\kappa_{n'}}}{2\pi}[S(t,\omega_{n'}) + S^*(t,\omega_n)]e^{-i(\omega_n-\omega_{n'})t},\tag{S18}$$

$$\Delta(\omega_n,\omega_{n'},t) = \frac{i}{2}\frac{\sqrt{\kappa_n\kappa_{n'}}}{2\pi}[S(t,\omega_{n'}) - S^*(t,\omega_n)]e^{-i(\omega_n-\omega_{n'})t}.\tag{S19}$$

The last two equations correspond to the dissipation rates $\Gamma$ and the lamb shifts $\Delta$. To get an explicit form for $S(t,\omega)$, we consider a squeezed bath at a pump frequency $\omega_p$, $$\langle \hat{b}_{\omega_1}\hat{b}_{\omega_2}\rangle = M(\omega_1)\delta(\omega_1+\omega_2-2\omega_p),\tag{S20}$$

$$\langle \hat{b}^\dagger_{\omega_1}\hat{b}^\dagger_{\omega_2}\rangle = M^*(\omega_1)\delta(\omega_1+\omega_2-2\omega_p),\tag{S21}$$

$$\langle \hat{b}^\dagger_{\omega_1}\hat{b}_{\omega_2}\rangle = N(\omega_1)\delta(\omega_1-\omega_2),\tag{S22}$$

$$\langle \hat{b}_{\omega_1}\hat{b}^\dagger_{\omega_2}\rangle = [N(\omega_1)+1]\delta(\omega_1-\omega_2).\tag{S23}$$

Using these expressions in $S(t,\omega)$, we get two different expressions for $\omega > 0$ and $\omega < 0$ $$S(t,\omega > 0) = \pi\left[M(\omega)e^{-i2\omega_p t} + N(\omega) + 1\right],\tag{S24}$$

$$S(t,\omega < 0) = \pi\left[M^*(\omega)e^{i2\omega_p t} + N(\omega)\right].\tag{S25}$$

Neglecting fast rotating terms in the usual secular approximation, the dissipation rates take the form $$\Gamma(\omega_n,-\omega_{n'},t) = \frac{\sqrt{\kappa_n\kappa_{n'}}}{2}[M^*(\omega_n) + M^*(\omega_{n'})]e^{-i(\omega_{n'}+\omega_n-2\omega_p)t},\tag{S26}$$

$$\Gamma(-\omega_n,\omega_{n'},t) = \frac{\sqrt{\kappa_n\kappa_{n'}}}{2}[M(\omega_n) + M(\omega_{n'})]e^{i(\omega_{n'}+\omega_n-2\omega_p)t},\tag{S27}$$

$$\Gamma(-\omega_n,-\omega_{n'},t) = \frac{\sqrt{\kappa_n\kappa_{n'}}}{2}[N(\omega_{n'}) + N(\omega_n)]e^{i(\omega_n-\omega_{n'})t},\tag{S28}$$

$$\Gamma(\omega_n,\omega_{n'},t) = \frac{\sqrt{\kappa_n\kappa_{n'}}}{2}[N(\omega_{n'}) + N(\omega_n) + 2]e^{-i(\omega_n-\omega_{n'})t},\tag{S29}$$

and the lamb shifts $$\Delta(\omega_n,-\omega_{n'},t) = \frac{i\sqrt{\kappa_n\kappa_{n'}}}{4}[M^*(\omega_{n'}) - M^*(\omega_n)]e^{-i(\omega_n+\omega_{n'}-2\omega_p)t},\tag{S30}$$

$$\Delta(-\omega_n,\omega_{n'},t) = \frac{i\sqrt{\kappa_n\kappa_{n'}}}{4}[M(\omega_{n'}) - M(\omega_n)]e^{i(\omega_n+\omega_{n'}-2\omega_p)t},\tag{S31}$$

$$\Delta(-\omega_n,-\omega_{n'},t) = \frac{i\sqrt{\kappa_n\kappa_{n'}}}{4}[N(\omega_{n'}) - N(\omega_n)]e^{i(\omega_n-\omega_{n'})t},\tag{S32}$$

$$\Delta(\omega_n,\omega_{n'},t) = \frac{i\sqrt{\kappa_n\kappa_{n'}}}{4}[N(\omega_{n'}) - N(\omega_n)]e^{-i(\omega_n-\omega_{n'})t}.\tag{S33}$$

See Sect. VI for a discussion on the validity of the secular approximation here. In the next sections we consider three relevant cases: A) No squeezing: $N(\omega) = M(\omega) = 0$, B) squeezing at $\omega_p = (\omega_m + \omega_r)/2$ and C) squeezing at $\omega_p - \omega_r$ with a filter at $\omega_m$: $\kappa_m \to 0$.

A. No squeezing

The first case is a bath at zero temperature, corresponding to $M(\omega) = N(\omega) = 0$. The generalization to a finite temperature bath is simply obtained by setting $N(\omega) \neq 0$. The master equation Eq. (S16) then reduces to the Lindblad form $$\dot{\rho}(t) = \mathcal{D}[\sqrt{\kappa_r}(\hat{a}+\hat{\mathcal{O}}) - \sqrt{\kappa_m}e^{i\delta t}\hat{\mathcal{O}}]\rho(t).\tag{S34}$$

where $\mathcal{D}[\hat{x}]\bullet = \hat{x}\bullet\hat{x}^\dagger - \frac{1}{2}\{\hat{x}^\dagger\hat{x},\bullet\} = \mathcal{D}[\hat{x},\hat{x}^\dagger]\bullet$ is the usual dissipation superoperator. In this frame, the oscillator starts and stays in vacuum which means that the terms $\mathcal{D}[a,\hat{\mathcal{O}}]\rho(t)$ and $\mathcal{D}[\hat{\mathcal{O}},\hat{a}^\dagger]\rho(t)$ will be zero at all times. We can thus rewrite the equation in a way that makes the qubit dephasing rate explicit $$\dot{\rho}(t) = \kappa_r \mathcal{D}[\hat{a}]\rho(t) + [\kappa_r + \kappa_m - 2\sqrt{\kappa_r \kappa_m}\cos(\delta t)]\mathcal{D}[\hat{\mathcal{O}}]\rho(t). \tag{S35}$$

Moving out of the interaction picture and setting $g_1 = g_2 \equiv g$, $\kappa_r = \kappa_m \equiv \kappa$, $1/\tilde{\delta} \approx 1/\delta$ for simplicity, we recover Eq. (1) of the main Letter. We also see from this equation that we can use a filter at the modulation frequency to lower the dephasing rate. Setting $\kappa_m \to 0$, we get $\Gamma = \kappa(g/2\delta)^2$ which is on average a factor two decrease over the initial dephasing rate.

B. Squeezing at the average frequency

The second case we consider is a bath with a broadband squeezing spectrum centred at the average of the oscillator and modulation frequency $\omega_p = (\omega_r + \omega_m)/2$. We assume a flat squeezing spectrum over the relevant bandwidth such that $M \equiv M(\omega_m) = M(\omega_r)$ and $N \equiv N(\omega_m) = N(\omega_r)$. In the limit of perfect squeezing, we can write $M = \sqrt{N(N+1)}e^{2i\theta}$ with $\theta$ the squeezing angle and $N = \sinh^2 r$ with $r$ the squeezing parameter. As explained in the main Letter, the condition on $\theta$ is that the anti-squeezed quadrature is aligned with the displacement direction at all time. Note that here we set the displacement direction by fixing the phase reference of the first qubit modulation drive, so that $\theta$ is also referenced to the modulation. Setting $\theta = 0$ and assuming a flat spectrum in the output field density of modes $\kappa_r = \kappa_m \equiv \kappa$, we get after some algebra that Eq. (S16) can be written in Lindblad form $$\dot{\rho}(t) = \kappa\,\mathcal{D}\left[\cosh(r)\hat{a}e^{\frac{i\delta t}{2}} + \sinh(r)\hat{a}^\dagger e^{\frac{i\delta t}{2}} - ie^r \sin\left(\frac{\delta t}{2}\right)\hat{\mathcal{O}}\right]\rho(t). \tag{S36}$$

The last term in the dissipation operator clearly shows that phase information is completely hidden at high squeezing power. Assuming that the squeezing interaction has been turned on long before the gate, the oscillator starts in a squeezed vacuum state ($\alpha_j(0) = 0$ in Eq. (S5)). In the polaron frame, the oscillator is at all times in a squeezed vacuum state, which means that the dephasing rate is given by the prefactor in front of the qubit ($\hat{\mathcal{O}}$) operator $$\Gamma = 2\kappa\left(\frac{g}{2\tilde{\delta}}\right)^2 [1 - \cos(\delta t)]e^{-2r}, \tag{S37}$$

for $g_1 = g_2 \equiv g$.

This equation indicates that we dephasing can be reduced exponentially for arbitrarily high squeezing levels $r$, but one must keep in mind the approximations that were made in order to get the final master equation Eq. (S36). In particular, we neglected fast-rotating terms in the secular approximation when calculating the dephasing rates of the master equation, Eq. (S26). Since $N$ and $M$ grow exponentially with squeezing power, there will be a point where the secular approximation is no longer valid. In general the error made due to the secular approximation can be upper bounded by $$\varepsilon_{\text{secular}} \lesssim \left[2\kappa\left(\frac{g}{2\tilde{\delta}}\right)^2 e^{2r}\right]^2 \frac{2\pi t_g}{(2\omega_m)}, \tag{S38}$$

following the approach outlined in Sect. VI. The physical intuition behind this error bound is that the real path in phase space of the oscillator, given by $\alpha(t)$ in Eq. (S6), is not a perfect circle due to the fast rotating terms. Thus, the anti-squeezed quadrature cannot be aligned with the displacement at all times and small deviations from the circle will eventually lead to an increase in dephasing at very high squeezing power.

For the parameters used in Fig. 2 (c) of the main letter, $\delta/(2\pi) = 0.6$ GHz, $g/(2\pi) = 60$ MHz, $t_g = 42.7$ ns, $\kappa/(2\pi) = 1.0$ MHz and $\omega_r/(2\pi) = 10$ GHz, the right-hand side of Eq. (S38) evaluates to $\sim 10^{-5}$ for $S = 10$ dB of squeezing. Hence we expect that we cannot be confident about a gate error smaller than this number based on evaluating Eq. (S36) with this set of parameters. This confidence bound is marked by a full circle in Fig. 2 (c) of the letter.

We also assumed an equal squeezing spectrum and equal decay rates at the two frequencies $\omega_r$ and $\omega_m$. It is not shown in Eq. (S36), but a discrepancy in the decay rates and/or squeezing spectrum will lead to an additional dephasing that grows exponentially with squeezing.

C. Squeezing at the oscillator frequency

The third case we consider is a bath squeezed at the resonator frequency, $\omega_p = \omega_r$. We set $N(\omega_m) = M(\omega_m) = 0$ and define $M \equiv M(\omega_r)$, $N \equiv N(\omega_r)$, which corresponds to a squeezing spectrum much larger than $\kappa_r$, but much narrower than $\delta$. Furthermore, we will assume a filter at the oscillator's output so that $\kappa_m = 0$, leading to $$\dot\rho(t) = \kappa_r(N+1)\mathcal{D}[\hat{a} + \hat{\mathcal{O}}]\rho(t) + \kappa_r N \mathcal{D}[\hat{a}^\dagger + \hat{\mathcal{O}}]\rho(t) + \kappa_r M \mathcal{S}[\hat{a}^\dagger + \hat{\mathcal{O}}]\rho(t) + \kappa_r M^* \mathcal{S}[\hat{a} + \hat{\mathcal{O}}]\rho(t). \quad (S39)$$

In this expression, $\mathcal{S}[\hat{x}]\bullet = \hat{x}\bullet\hat{x} - \frac{1}{2}\{\hat{x}\hat{x}, \bullet\} = \mathcal{D}[\hat{x}, \hat{x}]\bullet$ is a squeezing superoperator. The gain in fidelity appears when we rewrite this in Lindblad form and set $\theta = \pi/2$ $$\dot\rho(t) = \kappa_r \mathcal{D}[\cosh(r)\hat{a} - \sinh(r)\hat{a}^\dagger + e^{-r}\hat{\mathcal{O}}]\rho(t). \quad (S40)$$

The dephasing rate is then exponentially reduced $$\Gamma = \kappa_r \left(\frac{g}{2\tilde\delta}\right)^2 e^{-2r}, \quad (S41)$$

for $g_1 = g_2 \equiv g$. Phase information is completely hidden for large squeezing.

Since this equation is derived the same way as Eq. (S36), this exponential gain also has a confidence bound similar to Eq. (S38).

II. EXAMPLES OF PHYSICAL IMPLEMENTATION

In this section we give a very brief summary of how we can achieve a longitudinal coupling modulation in various platforms, as well as references on how to perform single qubit control.

*Transmons*—More details about transmons longitudinally-coupled to resonators can be found in Sect. III. Arbitrary single qubit $X = \hat\sigma_x$ and $Y = \hat\sigma_y$ rotations can be performed in the standard way by applying a microwave drive at a side gate voltage. Fidelities for these gates are now above 99.9%. The longitudinal coupling $g_z(t)$ can be modulated via an AC flux drive $\Phi_x(t)$ in the middle of the qubit squid loop: The frequency and the amplitude of the coupling modulation are then directly related to the frequency and amplitude of the flux drive.

The longitudinal interaction can also me performed by applying a coherent voltage drive on the resonator on resonance. In the absence of flux modulation on the qubit, the qubit junctions provide a residual dispersive interaction $\chi_z$ given by higher-order terms in the qubit-resonator interaction. Under a resonant coherent drive, the qubit-resonator hamiltonian picks up an effective parametric longitudinal interaction in the rotating frame of strength $g'_z = \chi_z \epsilon/\kappa$. In the limit where the drive strength $\epsilon \gg \kappa$, the strongly driven dispersive system simulates the parametric longitudinal interaction as $g'_z \gg \chi_z$, mitigating any undesired dispersive effects. Since there is no Purcell decay nor any critical photon number, large drive amplitudes can be realized in practice. This scheme is simpler to implement as it requires less qubit-control lines and is less prone to excite other modes in the circuit.

An alternative implementation for transmons is to use a 3-Wave mixing Josephson dipole element to couple the transmon and the resonator. The 3-Wave mixing then gives rise to the desired coupling. The coupling can furthermore be modulated by modulating the flux through the 3-Wave mixing element.

*Flux qubits*—In this implementation, X and Y single-qubit gates can be realized via modulation of the flux inside the qubit loop with over 99.8% fidelity. Modulation of the longitudinal coupling can be realized via modulation of the reduced gate charge on the superconducting island.

*Spin qubits*—In this implementation the longitudinal coupling could be modulated by controlling the inter-dot tunnelling. Single-qubit gates with average fidelities of 99.6% have been demonstrated.

*Singlet-triplet spin qubits*—For this implementation, single qubit operations with 99% have been demonstrated. Similar to the previous implementation, longitudinal coupling to a resonator can be modulated through the inter-dot tunnelling.

*Majorana qubits*—Readout and two-qubit gates can be implemented for a Majorana qubit where two topological superconducting nanowires meet at a gate-defined topological Josephson junction. If placed in a microwave resonator, a longitudinal coupling arises between the Majorana qubit and the resonator. The coupling is proportional to the overlap of the Majorana wavefunctions localized at the two nanowire ends meeting at the junction, and the resonator mode function. Since this overlap can be controlled through a gate voltage, it is possible to modulate the coupling at microwave frequencies and thus realize both the longitudinal readout and longitudinal two-qubit gate schemes we have presented.

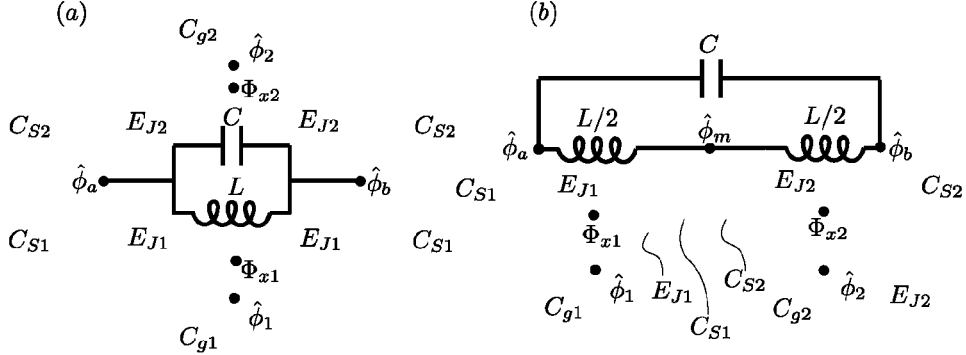

FIG. S1. Two possible lumped element implementation of the presented scheme. (a) The two qubits are placed in parallel across the LC oscillator. This configuration gives maximal coupling strength because the qubits couple to the phase bias across the entire LC oscillator. (b) An alternative configuration with the qubits in series. This reduces the obtainable coupling strength by one half due to reduced inductive participation ratio for each qubit $\eta = (L/2)/L = 1/2$.

III. CIRCUIT QED REALIZATION

Fig. S1 illustrates two possible lumped element implementation of the scheme, where two transmon-type qubits are coupled to a common LC oscillator via their $\hat{\sigma}_z$ degree of freedom. The two circuit designs differ in terms of the maximal attainable longitudinal coupling strength, but are otherwise similar. The scheme depicted in Fig. S1(a) allows for larger coupling strength because the qubits couple to the phase bias across the entire oscillator. In contrast, the scheme depicted in Fig. S1(b) has a reduced participation ratio $\eta$, defined as the inductance across one qubit divided by the total inductance of the LC, reducing the attainable longitudinal coupling strength by one half. In this section we focus on the circuit of Fig. S1(a) and show how it realizes a longitudinal coupling of the form of Eq. (1) of the main Letter. The derivation for the alternative scheme in Fig. S1(b) follows similar steps.

The circuit Lagrangian written in terms of the node fluxes indicated in Fig. S1 reads $$\hat{L} = \frac{C}{2}\dot{\hat{\phi}}_r^2 - \frac{1}{2L}\hat{\phi}_r^2 + \frac{C_{gr}}{2}\left(\dot{\hat{\phi}}_r - V_{gr}\right)^2$$
$$+ \sum_{i=1}^{2}\left\{\frac{C_{Si}}{2}(\dot{\hat{\phi}}_r - \dot{\hat{\phi}}_i - \dot{\Phi}_x)^2 + \frac{C'_{Si}}{2}\dot{\hat{\phi}}_i^2 + \frac{C_{gi}}{2}\left(\dot{\hat{\phi}}_i - V_{gi}\right)^2 \right.$$
$$\left. + E_{Ji}\cos\left[\frac{2\pi}{\Phi_0}\left(\hat{\phi}_r - \hat{\phi}_i - \Phi_x\right)\right] + E_{Ji}\cos\left(\frac{2\pi}{\Phi_0}\hat{\phi}_i\right)\right\}. \quad (S42)$$

The capacitances $C_{gr}$ and $C_{gi}$ are not shown in Fig. S1 but represents couplings to external gate voltages, $V_{gr}$ and $V_{gi}$, respectively, which can be used to directly drive the qubit and oscillator degrees of freedom, as will become clear below.

We next do a change of variables and identify $\hat{\phi}_r$ as the oscillator degree of freedom, and $$\hat{\theta}_i = \frac{\hat{\phi}_r - \Phi_x}{2} - \hat{\phi}_i \quad (S43)$$

as qubit $i$, such that the Lagrangian can be written as $$\hat{L} = \frac{C}{2}\dot{\hat{\phi}}_r^2 - \frac{1}{2L}\hat{\phi}_r^2 + \frac{C_{gr}}{2}\left(\dot{\hat{\phi}}_r - V_{gr}\right)^2$$
$$+ \sum_i \left\{\frac{C_{Si}}{2}\left(\dot{\hat{\theta}}_i + \frac{\dot{\hat{\phi}}_r - \dot{\Phi}_{xi}}{2}\right)^2 + \frac{C'_{Si}}{2}\left(\dot{\hat{\theta}}_i - \frac{\dot{\hat{\phi}}_r - \dot{\Phi}_{xi}}{2}\right)^2 + \frac{C_{gi}}{2}\left(\dot{\hat{\theta}} - \frac{\dot{\hat{\phi}}_r - \dot{\Phi}_x}{2} + V_{gi}\right)^2 \right. \quad (S44)$$
$$\left. + E_{Ji}\cos\left[\frac{2\pi}{\Phi_0}\left(\hat{\theta}_i + \frac{\hat{\phi}_r - \Phi_{xi}}{2}\right)\right] + E_{Ji}\cos\left[\frac{2\pi}{\Phi_0}\left(\hat{\theta}_i - \frac{\hat{\phi}_r - \Phi_{xi}}{2}\right)\right]\right\},$$

We see that the capacitive coupling between $\dot{\hat{\theta}}_i$ and $\dot{\hat{\phi}}_r$ can be cancelled out exactly if we balance the capacitances such that $C_{Si} = C'_{Si} + C_{gi}$. Continuing with this choice we have a Lagrangian that simplifies to $$\hat{L} = \frac{C_r}{2}\dot{\hat{\phi}}_r^2 - \frac{1}{2L}\hat{\phi}_r^2 - \left[C_{gr}V_{gr} + \frac{1}{2}\sum_i \left(C_{gi}V_{gi} + C_{Si}\dot{\Phi}_x\right)\right]\dot{\hat{\phi}}_r \\ + \sum_i \left\{ C_{Si}\dot{\hat{\theta}}_i^2 + C_{gi}V_{gi}\dot{\hat{\theta}}_i + 2E_{Ji}\cos\left(\frac{2\pi}{\Phi_0}\hat{\theta}_i\right)\cos\left[\frac{2\pi}{\Phi_0}\frac{\hat{\phi}_a - \Phi_x}{2}\right)\right]\right\}, \tag{S45}$$

where $$C_r = C_{gr} + C + \frac{C_{S1} + C_{S2}}{2} \tag{S46}$$

and throughout the derivation we drop constant terms whenever convenient. At this stage we do a Legendre transform and change to a Hamiltonian, $$\hat{H} = \frac{\hat{q}_r^2}{2C_r} + \frac{1}{2L}\hat{\phi}_r^2 + \frac{2C_{gr}V_{gr} + \sum_i \left(C_{gi}V_{gi} + C_{Si}\dot{\Phi}_{xi}\right)}{2C_r}\hat{q}_r \\ + \sum_i \left\{ \frac{\hat{q}_i^2}{4C_{Si}} - \frac{C_{gi}V_{gi}}{2C_{Si}}\hat{q}_i - 2E_{Ji}\cos\left(\frac{2\pi}{\Phi_0}\hat{\theta}_i\right)\cos\left[\frac{2\pi}{\Phi_0}\frac{\hat{\phi}_r - \Phi_{xi}}{2}\right)\right]\right\}. \tag{S47}$$

where $\hat{q}_r = \partial\hat{L}/\partial\dot{\hat{\phi}}_r$ and $\hat{q}_i = \partial\hat{L}/\partial\dot{\hat{\theta}}_i$ are the canonical momenta.

So far the treatment is exact. To proceed we consider the fields to be small and expand the cosine potential dropping terms smaller than $\mathcal{O}(\hat{\theta}_i^4)$, $\mathcal{O}(\hat{\phi}_i^2)$, $\mathcal{O}(\Phi_x)$. This gives a Hamiltonian that can be written $$\hat{H} = \hat{H}_r + \sum_i \left(\hat{H}_i + \hat{H}_{ri}\right), \tag{S48}$$

where $$\hat{H}_r = \frac{\hat{q}_r^2}{2C_r} + \frac{1}{2L_r}\hat{\phi}_r^2 + \frac{2C_{gr}V_{gr} + \sum_i \left(C_{gi}V_{gi} + C_{Si}\dot{\Phi}_{xi}\right)}{2C_r}\hat{q}_r - \sum_i \frac{E_{Ji}}{2}\left(\frac{2\pi}{\Phi_0}\right)\varphi_{xi}\hat{\phi}_r \tag{S49}$$

$$\hat{H}_i = \frac{\hat{q}_i^2}{4C_{Si}} + E_{Ji}\left(\frac{2\pi}{\Phi_0}\right)^2\hat{\theta}_i^2 - \frac{E_{Ji}}{12}\left(\frac{2\pi}{\Phi_0}\right)^4\hat{\theta}_i^4 - \frac{C_{gi}V_{gi}}{2C_{Si}}\hat{q}_i \tag{S50}$$

$$\hat{H}_{ri} = \frac{E_{Ji}}{4}\left(\frac{2\pi}{\Phi_0}\right)^3\varphi_{xi}\hat{\phi}_r\hat{\theta}_i^2 - \frac{E_{Ji}}{8}\left(\frac{2\pi}{\Phi_0}\right)^4\hat{\phi}_r^2\hat{\theta}_i^2, \tag{S51}$$

where $\varphi_{xi} = 2\pi\Phi_{xi}/\Phi_0$ is the dimensionless external flux and $$L_r = \left[\frac{1}{L} + \sum_i \frac{E_{Ji}}{2}\left(\frac{2\pi}{\Phi_0}\right)^2\right]^{-1}. \tag{S52}$$

We recognize $\hat{H}_r$ as the Hamiltonian of a (driven) Harmonic oscillator, and $\hat{H}_i$ as that of a weakly anharmonic transmon. Note that keeping terms only to fourth order in $\hat{\theta}_i$ means that we are assuming a large $2E_{Ji}/E_{Ci}$ ratio, where $E_{Ci} = e^2/4C_{Si}$ is the transmon's charging energy. We can express the canonical variables in terms of creation and annihilation operators, $$\hat{\phi}_r = \sqrt{\frac{\hbar Z_r}{2}}(\hat{a} + \hat{a}^\dagger), \tag{S53}$$

$$\hat{q}_r = -i\sqrt{\frac{\hbar}{2Z_r}}(\hat{a} - \hat{a}^\dagger), \tag{S54}$$

$$\hat{\theta}_i = \sqrt{\frac{\hbar Z_{qi}}{2}}(\hat{b}_i + \hat{b}_i^\dagger), \tag{S55}$$

$$\hat{q}_i = -i\sqrt{\frac{\hbar}{2Z_{qi}}}(\hat{b}_i - \hat{b}_i^\dagger), \tag{S56}$$

where $[\hat{a}, \hat{a}^\dagger] = [\hat{b}_i, \hat{b}_i^\dagger] = 1$ (while other commutators vanish) and $$Z_r = \sqrt{\frac{L_r}{C_r}}, \tag{S57}$$

$$Z_{qi} = \frac{R_K}{4\pi}\sqrt{\frac{2E_{Ci}}{E_{Ji}}}, \tag{S58}$$

where $R_K = 2\pi\hbar/e^2 \simeq 25$ k$\Omega$ is the quantum of resistance. With this, we can write for the Hamiltonian $$\hat{H} = \hat{H}_r + \sum_i \left(\hat{H}_{q_i} + \hat{H}_{rq_i}\right), \tag{S59}$$

where we now redefine $$\hat{H}_r/\hbar = (\omega_r + \chi_1 + \chi_2)\hat{a}^\dagger\hat{a} - i\varepsilon_{ry}(t)(\hat{a} - \hat{a}^\dagger) - \varepsilon_{rx}(t)(\hat{a} + \hat{a}^\dagger) \tag{S60}$$

$$\hat{H}_{q_i}/\hbar = (\omega_{ai} + \chi_i)\hat{b}_i^\dagger\hat{b}_i - K_i(\hat{b}_i^\dagger)^2\hat{b}_i^2 + i\varepsilon_{q_iy}(\hat{b}_i - \hat{b}_i^\dagger), \tag{S61}$$

$$\hat{H}_{rq_i}/\hbar = 2g_i(t)(\hat{a} + \hat{a}^\dagger)(\hat{b}_i^\dagger\hat{b}_i + 1) + 2\chi_i\hat{a}^\dagger\hat{a}\hat{b}_i^\dagger\hat{b}_i, \tag{S62}$$

and we have dropped fast-rotating terms and defined system parameters $$\omega_r = \frac{1}{\sqrt{L_r C_r}}, \tag{S63}$$

$$\omega_{ai} = \frac{1}{\hbar}\sqrt{8E_{Ci}E_{Ji}}, \tag{S64}$$

$$K_i = \frac{E_{C_i}}{\hbar}, \tag{S65}$$

$$g_i(t) = \frac{E_{J_i}}{2\hbar}\sqrt{\frac{\pi Z_r}{R_K}}\sqrt{\frac{2E_{C_i}}{E_{J_i}}}\varphi_{xi}(t), \tag{S66}$$

$$\chi_i = -\frac{E_{J_i}}{\hbar}\frac{\pi Z_r}{R_K}\sqrt{\frac{2E_{C_i}}{E_{J_i}}}, \tag{S67}$$

and drives $$\varepsilon_{rx}(t) = \sum_i \frac{E_{J_i}}{\hbar}\sqrt{\frac{\pi Z_r}{R_K}}\varphi_{xi}(t), \tag{S68}$$

$$\varepsilon_{ry}(t) = \sqrt{\frac{1}{2\hbar Z_r}}\frac{2C_{gr}V_{gr} + \sum_i\left(C_{gi}V_{gi} + C_{Si}\dot{\Phi}_{xi}\right)}{2C_r}, \tag{S69}$$

$$\varepsilon_{q_iy}(t) = \sqrt{\frac{2\pi}{\hbar R_K}}\left(\frac{E_{J_i}}{2E_{C_i}}\right)^{1/4}\frac{C_{gi}V_{gi}}{2C_{Si}}. \tag{S70}$$

In the two-level approximation we replace $\hat{b}_i^\dagger\hat{b}_i \to (\hat{\sigma}_{zi} + 1)/2$, $\hat{b}_i + \hat{b}_i^\dagger \to \hat{\sigma}_{xi}$, $i(\hat{b}_i - \hat{b}_i^\dagger) \to \hat{\sigma}_{yi}$ where $\hat{\sigma}_z = |e\rangle\langle e| - |g\rangle\langle g|$, $\hat{\sigma}_x$ and $\hat{\sigma}_y$ denote the usual Pauli operators. We thus get oscillator and qubit Hamiltonians $$\hat{H}_r/\hbar = (\omega_r + 2\chi_1 + 2\chi_2)\hat{a}^\dagger\hat{a} - (\varepsilon(t)\hat{a} + \varepsilon^*(t)\hat{a}^\dagger) \tag{S71}$$

$$\hat{H}_{q_i}/\hbar = \frac{\omega_{ai} + \chi_i}{2}\hat{\sigma}_{zi} + \varepsilon_{q_iy}(t)\hat{\sigma}_{yi}, \tag{S72}$$

$$\hat{H}_{rq_i}/\hbar = g_i(t)(\hat{a} + \hat{a}^\dagger)\hat{\sigma}_{zi} + \chi_i\hat{a}^\dagger\hat{a}\hat{\sigma}_{zi}, \tag{S73}$$

where we have defined $\varepsilon'_{rx}(t) = \varepsilon_{rx}(t) - 3[g_1(t) + g_2(t)] - i\varepsilon_{ry}(t)$ and redefined the Hamiltonian contributions such that $\hat{H}_r$ includes all the terms involving the resonator only.

To see what parameter ranges we can expect for the the Hamiltonian, consider as an example a resonator impedance of $Z_r = 50$ $\Omega$. This gives $\sqrt{\pi Z_r/R_K} \simeq 0.08$, which we can assume is of the same order as the maximal flux excursion $\varphi_{xi}$. Hence we expect $g_i \sim \chi_i/2$. As an example, consider values $E_{J_i}/h = (40\text{--}60)$ GHz, $E_{J_i}/E_{C_i} = 50$, giving $$\frac{g_i(t)}{2\pi} = (320\text{--}480) \text{ MHz} \times \varphi_x(t), \tag{S74}$$

$$\frac{\chi_i}{2\pi} = -(50\text{--}75) \text{ MHz}, \tag{S75}$$

$$\frac{\varepsilon'_{rx}(t)}{2\pi} = (1300\text{--}1900) \text{ MHz} \times \varphi_x(t). \tag{S76}$$

With a flux drive $\varphi_{xi}(t) = 0.1 \times \cos(\omega_m t)$ we thus get a value of $g_i/(2\pi) = (32\text{--}48)$ MHz.

The Hamiltonian $\hat{H}$ that we have found differs from the Hamiltonian in Eq. (1) of the Letter in two ways: The drive term $\varepsilon_{rx}(t)$, which is a flux-induced drive that do not vanish even in the absence of any externally applied voltage, $V_{gi} = V_{gr} = 0$, and the terms $\chi_i \hat{a}^\dagger \hat{a} \hat{\sigma}_{zi}$. However, this is not detrimental for the gate, and a similar analysis as what we performed can be done for this Hamiltonian, with only minor modifications. The fact that these additional terms are not detrimental is not surprising, as an off-resonant drive together with terms of the form $\chi_i \hat{a}^\dagger \hat{a} \hat{\sigma}_{zi}$ are precicely what is used in conventional resonator induced phase gates.

To show how $\hat{H}$ can be used to perform a resonator induced phase gate, we consider a displacement transformation of the form $$\hat{U}_2(t) = \exp\left[ (\beta + \alpha(\hat{\sigma}_{z1} + \hat{\sigma}_{z2}) + \gamma \hat{\sigma}_{z1}\hat{\sigma}_{z2}) \hat{a}^\dagger - \text{H.c.} \right]. \tag{S77}$$

Assuming symmetric couplings $g_i(t) = g\cos(\omega_m t)$, $\chi_1 = \chi_2 \equiv \chi$ and a drive of the form $\varepsilon(t) = \varepsilon\cos(\omega_m t)$, we set $$\alpha(t) = \frac{e^{-it(\delta+2\chi)}}{4(\delta^2 - 4\chi^2)} \left[ (\delta \frac{\epsilon^*}{2} - 2g\chi)(e^{it4\chi} - 1) + (\chi\epsilon^* - g\delta)(1 + e^{it4\chi} - 2e^{it(\delta+2\chi)}) \right],$$

$$\beta(t) = \frac{e^{-it(\delta+2\chi)}}{4\delta(\delta^2 - 4\chi^2)} \left[ (g\delta^2 - \delta\chi\epsilon^*)(e^{it4\chi} - 1) + 2\chi g\delta(1 + e^{it4\chi} - 2e^{it(\delta+2\chi)}) \right.$$
$$\left. - \frac{\epsilon^*}{2}\delta^2(1 + e^{it4\chi} + 2e^{it2\chi} - 4e^{it(\delta+2\chi)}) - 4\chi^2\epsilon^*(e^{it\delta} - 1) \right], \tag{S78}$$

$$\gamma(t) = \frac{e^{-it(\delta+2\chi)}}{4\delta(\delta^2 - 4\chi^2)} \left[ (g\delta^2 - \delta\chi\epsilon^*)(e^{it4\chi} - 1) + 2\chi g\delta(1 + e^{it4\chi} - 2e^{it(\delta+2\chi)}) \right.$$
$$\left. - \frac{\epsilon^*}{2}\delta^2(1 + e^{it4\chi} - 2e^{it2\chi}) + 4\chi^2\epsilon^*(e^{it(\delta+2\chi)} - e^{2it\chi}) \right].$$

We note that here the detuning $\delta$ is defined with respect to the renormalized resonator frequency $\omega'_r \equiv \omega_r + 2\chi_1 + 2\chi_2$. With this particular transformation, we ensure that the resonator state is at all times projected onto vacuum, yielding the Hamiltonian $$\hat{H}^{\text{circ}}_{\text{pol}}(t) = \delta \hat{a}^\dagger \hat{a} + \chi \hat{a}^\dagger \hat{a}(\hat{\sigma}_{z1} + \hat{\sigma}_{z2}) + J_z(t)\hat{\sigma}_{z1}\hat{\sigma}_{z2} + \frac{\varpi(t)}{2}(\hat{\sigma}_{z1} + \hat{\sigma}_{z2}). \tag{S79}$$

In this form the $\hat{\sigma}_{z1}\hat{\sigma}_{z2}$ term needed to perform the controlled-phase gate becomes explicit. In this frame the resonator stays in its ground state, which means that the first two terms do not affect the qubits. The last term adds single qubit $Z$ rotations for which it is easy to correct.

Although the coefficients inside Eq. (S77) have complicated expressions, we recognize that the resonator's path ends up in its initial state, $\alpha(t_g) = \beta(t_g) = \gamma(t_g) = 0$, if we impose $\delta t_g = 2\pi n$ and $\chi t_g = \pi m$ with $n, m$ integers. The full expressions for $J_z(t), \varpi(t)$ are also complicated, but under the previous conditions most terms integrate out to zero after a time $t_g$, which means that only the constant parts have a non-trivial effect and we can use $$J_{z0} = \frac{-(g\delta + \text{Re}[\varepsilon]\chi_z)^2 + 3\chi_z^2 \text{Im}[\varepsilon]^2}{2\delta(\delta^2 - 4\chi_z^2)}, \tag{S80}$$

$$\varpi_0 = \frac{\chi_z(4g^2 + \text{Re}[\varepsilon]^2) + 2\delta g \, \text{Re}[\varepsilon] - 6\chi_z \text{Im}[\varepsilon]^2}{2(\delta^2 - 4\chi_z^2)}. \tag{S81}$$

IV. COUPLED OSCILLATORS

In this section we derive the effective $\hat{\sigma}_z\hat{\sigma}_z$-coupling induced when the two qubits are in different but coupled oscillators. Similar to the single oscillator case, both couplings are modulated at the same frequency $\omega_m$. The Hamiltonian corresponding to this situation with capacitively coupled oscillators is $$\hat{H} = \omega_a \hat{a}^\dagger \hat{a} + \omega_b \hat{b}^\dagger \hat{b} + \tfrac{1}{2}\omega_{a1}\hat{\sigma}_{z1} + \tfrac{1}{2}\omega_{a2}\hat{\sigma}_{z2} + g_1(t)\hat{\sigma}_{z1}(\hat{a}^\dagger + \hat{a}) + g_2(t)\hat{\sigma}_{z2}(\hat{b}^\dagger + \hat{b}) - g_{ab}(\hat{a}^\dagger - \hat{a})(\hat{b}^\dagger - \hat{b}). \tag{S82}$$

Following the same approach as in the single oscillator case, we first move to a frame rotating at $\omega_m$ for both oscillators and $\omega_{ai}$ for the respective qubits. To simplify the discussion, we also perform a rotating wave approximation and neglect fast-rotating terms leading to $$\hat{H}_R = \delta_a \hat{a}^\dagger \hat{a} + \delta_b \hat{b}^\dagger \hat{b} + \frac{g_1}{2}\hat{\sigma}_{z1}(\hat{a}^\dagger + \hat{a}) + \frac{g_2}{2}\hat{\sigma}_{z2}(\hat{b}^\dagger + \hat{b}) + g_{ab}(\hat{a}^\dagger \hat{b} + \hat{a}\hat{b}^\dagger). \tag{S83}$$

The second step is to diagonalize the oscillator part of the Hamiltonian $\hat{H}_r = \delta_a \hat{a}^\dagger \hat{a} + \delta_b \hat{b}^\dagger \hat{b} + g_{ab}(\hat{a}^\dagger \hat{b} + \hat{a}\hat{b}^\dagger)$ and to express the longitudinal coupling in terms of the resulting hybridized modes. For this purpose, we define the eigenmode operators $$\hat{c} = \cos\xi\,\hat{a} + \sin\xi\,\hat{b}, \tag{S84}$$

$$\hat{d} = -\sin\xi\,\hat{a} + \cos\xi\,\hat{b}, \tag{S85}$$

where $\tan 2\xi = 2g_{ab}/(\omega_a - \omega_b)$. Expressing the Hamiltonian Eq. (S83) in terms of these eigenmodes yields $$\hat{H}_R = \delta_c \hat{c}^\dagger \hat{c} + \delta_d \hat{d}^\dagger \hat{d} + \left\{ \frac{1}{2}\left[g_1 \cos\xi\,\hat{\sigma}_{z1} + g_2 \sin\xi\,\hat{\sigma}_{z2}\right]\hat{c}^\dagger + \frac{1}{2}\left[-g_1 \sin\xi\,\hat{\sigma}_{z1} + g_2 \cos\xi\,\hat{\sigma}_{z2}\right]\hat{d}^\dagger + \text{H.c.}\right\}, \tag{S86}$$

where the detunings are $$\delta_c = \frac{\delta_a + \delta_b}{2} + \frac{g_{ab}}{\sin 2\xi}, \qquad \delta_d = \frac{\delta_a + \delta_b}{2} - \frac{g_{ab}}{\sin 2\xi}. \tag{S87}$$

Following the same approach as in Sect. I we finally apply the unitary transformation $$\hat{U}_D = e^{\hat{\mathcal{O}}_c \hat{c}^\dagger - \hat{\mathcal{O}}_c^\dagger \hat{c}} e^{\hat{\mathcal{O}}_d \hat{d}^\dagger - \hat{\mathcal{O}}_d^\dagger \hat{d}} \equiv \hat{U}_c \hat{U}_d, \tag{S88}$$

with $\hat{\mathcal{O}}_c = (g_1 \cos\xi\,\hat{\sigma}_{z1} + g_2 \sin\xi\,\hat{\sigma}_{z2})/2\delta_c$ and $\hat{\mathcal{O}}_d = (-g_1 \sin\xi\,\hat{\sigma}_{z1} + g_2 \cos\xi\,\hat{\sigma}_{z2})/2\delta_d$. Because $[\hat{U}_c, \hat{U}_d] = 0$, the transformation does not generate a coupling between the eigenmodes. The resulting Hamiltonian is then $$\hat{H}_{\text{pol}} = \delta_c \hat{c}^\dagger \hat{c} + \delta_d \hat{d}^\dagger \hat{d} + J_z(t)\hat{\sigma}_{z1}\hat{\sigma}_{z2}, \tag{S89}$$

with the $\hat{\sigma}_z\hat{\sigma}_z$-coupling strength $$\bar{J}_z = \frac{\delta_c - \delta_d}{\delta_c \delta_d} \frac{g_1 g_2}{4} \sin 2\xi. \tag{S90}$$

Defining $\bar{\delta} = (\delta_a + \delta_b)/2$ and $\zeta = 1/\tan 2\xi$, we can write this as $$\bar{J}_z = \frac{1}{2}\frac{g_1 g_2 g_{ab}}{\bar{\delta}^2 - g_{ab}^2(1+\zeta^2)} \tag{S91}$$

corresponding to the result stated in the main Letter.

V. DETAILS ON THE SIMULATIONS

To calculate the average gate fidelity, we compare full master equation simulations to the ideal channel $\mathcal{U}_{CZ}\bullet = \hat{U}_{CZ} \bullet \hat{U}_{CZ}^\dagger$ with $\hat{U}_{CZ} = \text{diag}[1,1,1,-1] = \hat{U}_{CP}(\pi)$. The master equation is defined over the system

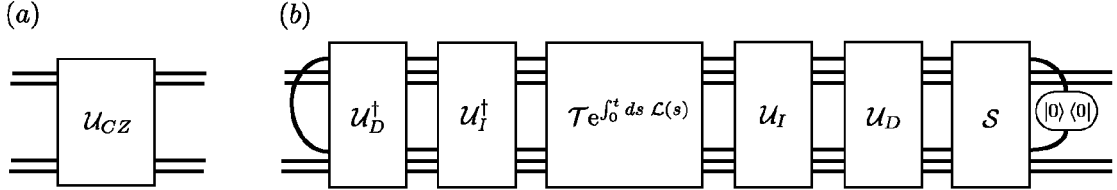

FIG. S2. Tensor representation of the CZ gate supermatrix. Here the blue lines represent the oscillator degree of freedom and the green (brown) lines represent the first (second) qubit. (a) Ideal controlled-Z channel. (b) Simulated quantum channel over two qubits. We project onto an initial vacuum state of the oscillator at the beginning (right) and trace over the oscillator degree of freedom at the end (left). The superoperator $\mathcal{T}e^{\bullet}$ denotes the time-ordering exponential.

oscillator-qubit and we therefore eliminate the oscillator degree of freedom. We define the channel $\mathcal{E}_{q_1 q_2}$ acting on the qubits as $$\mathcal{E}_{q_1 q_2}(\bullet) = \mathcal{T}_r \, \mathcal{U}_D^\dagger \, \mathcal{U}_I^\dagger \, \mathcal{E}^{t_g} \, \mathcal{U}_I \, \mathcal{U}_D \, \mathcal{S} \left( |0\rangle\langle 0|_r \otimes \bullet \right), \tag{S92}$$

where the superoperator $\mathcal{T}_r \bullet \equiv \mathrm{Tr}_r(\bullet)$ is the trace over the oscillator degree of freedom and the superoperators $\mathcal{U}_D \bullet \equiv \hat{U} \bullet \hat{U}^\dagger$, $\mathcal{U}_D^\dagger \bullet \equiv \hat{U}^\dagger \bullet \hat{U}$ are the unitary displacement transformations defined in Eq. (S5). We also defined the interaction picture superoperators $\mathcal{U}_I \bullet \equiv \hat{U}_I \bullet \hat{U}_I^\dagger$ and $\mathcal{U}_I^\dagger \bullet \equiv \hat{U}_I^\dagger \bullet \hat{U}_I$ with $\hat{U}_I$ defined in Eq. (S11). The squeezing superoperator is given by $\mathcal{S} \equiv \hat{S}(re^{2i\theta})^\dagger \bullet \hat{S}(re^{2i\theta})$ with the standard definition $\hat{S}(re^{2i\theta}) = \exp\left[re^{-2i\theta}\hat{a}^2/2 - \mathrm{H.c.}\right]$.

Finally, $\mathcal{E}^{t_g}$ is the oscillator-qubit channel calculated from numerical integration of the differential equation $$\dot{\mathcal{E}}^t = \mathcal{L}\mathcal{E}^t. \tag{S93}$$

where $\mathcal{L}$ is a Liouvillian derived in Sect. I. If we impose the initial condition $\mathcal{E}^0 = \mathrm{Id}$, then $\mathcal{E}^t$ denotes the channel resulting from evolution under the Liouvillian $\mathcal{L}$ for a time $t$. This whole procedure is illustrated in terms of tensor diagrams in Fig. S2.

In the case where we include intrinsic qubit decay and dephasing, we add additional terms to the calculated Liouvillian $$\dot{\rho}(t) = \mathcal{L}'\rho(t) = \mathcal{L}\rho(t) + \sum_i \gamma_1^{(i)} \mathcal{D}[\hat{\sigma}_{-i}]\rho(t) + \gamma_\phi^{(i)} \mathcal{D}[\hat{\sigma}_{zi}]\rho(t), \tag{S94}$$

where the decay rates are given by $\gamma_1^{(i)} = 1/T_1^{(i)}$, $1/T_2^{(i)} = \gamma_\phi^{(i)} + \gamma_1^{(i)}/2$.

Although we take the oscillator to initially be in a vacuum squeezed state in our numerical calculations, we emphasize that any initial displacement could have been added without change to the resulting fidelity.

Knowing the effective channel over two qubits, the average gate fidelity $\mathcal{F}$ is obtained by averaging over all two-qubit initial states according to the uniform (Haar) measure.

$$\mathcal{F} = \int d\psi \langle \psi | U_{CZ}^\dagger \mathcal{E}_{q_1 q_2}(|\psi\rangle\langle\psi|) U_{CZ} |\psi\rangle. \tag{S95}$$

VI. ERROR BOUND FOR ROTATING TERMS IN THE MASTER EQUATION

In this section, we estimate an upper bound on the error made by neglecting fast-rotating terms in the master equation. More precisely, we want to estimate where the secular approximation made in Eqs. (S26) to (S33) is no longer valid.

We start with a general Lindbladian $\mathcal{L}(t) = \mathcal{L}_0 + \gamma(t)\mathcal{L}_1$ and we will assume that $\mathcal{L}_0, \mathcal{L}_1$ do not depend on time and that $\gamma(t)$ is some fast-oscillating function. In particular, we are interested in the case where $$\int_0^{\Delta t} dt \, \gamma(t) = 0, \tag{S96}$$

with $\Delta t$ the smallest time increment for which Eq. (S96) is respected. In our case, we have $\Delta t \sim 2\pi/(2\omega_m)$.

The problem we address is the following: What is the error we make when we replace $\mathcal{L}(t)$ by $$\mathcal{L}_{av} \equiv \frac{1}{\Delta t} \int_0^{\Delta t} dt \mathcal{L}(t) = \mathcal{L}_0. \tag{S97}$$

In other words, what is the error we make by doing a Suzuki-Trotter decomposition and at each time step we replace the linbladian by its average. We define an average channel $\mathcal{E}_{av}(t) \equiv e^{\mathcal{L}_{av} t}$, which replaces the full evolution channel $\mathcal{E}(t) = \mathcal{T} e^{\int_0^t ds \, \mathcal{L}(s)}$. To estimate the error for a single time step, we look at the norm of the superoperator $X(\Delta t) \equiv \mathbb{I} - \mathcal{E}_{av}^{-1}(\Delta t) \mathcal{E}(\Delta t)$. Knowing that $X(0) = 0$, we write $$\begin{aligned} X(\Delta t) &= \int_0^{\Delta t} ds \, \dot{X}(s) \\ &= -\int_0^{\Delta t} ds \, \dot{\mathcal{E}}_{av}^{-1}(s) \mathcal{E}(s) + \mathcal{E}_{av}^{-1}(s) \dot{\mathcal{E}}(s) \\ &= \int_0^{\Delta t} ds \, \mathcal{E}_{av}^{-1}(s) \mathcal{L}_{av} \mathcal{E}(s) - \mathcal{E}_{av}^{-1}(s) \mathcal{L}(s) \mathcal{E}(s) \end{aligned} \tag{S98}$$

where we used the differential equation for the channel $\dot{\mathcal{E}} = \mathcal{L}\mathcal{E}$ and we directly differentiated $\dot{\mathcal{E}}_{av}^{-1} = \partial_t(e^{-\mathcal{L}_{av}t}) = -\mathcal{E}_{av}^{-1}\mathcal{L}_{av}$. We replace $\mathcal{L}_{av}$ by its explicit expression Eq. (S97) and change the integration variables to get $$X(\Delta t) = \frac{1}{\Delta t} \int_0^{\Delta t} ds \int_0^{\Delta t} d\tau \, \mathcal{E}_{av}^{-1}(s) \mathcal{L}(\tau) \mathcal{E}(s) - \mathcal{E}_{av}^{-1}(\tau) \mathcal{L}(\tau) \mathcal{E}(\tau). \tag{S99}$$

We now evaluate the norm and use the triangle inequality to get $$\|X(\Delta t)\| \leq \frac{1}{\Delta t} \int_0^{\Delta t} ds \int_0^{\Delta t} d\tau \, \left\| \mathcal{E}_{av}^{-1}(\tau)\mathcal{L}(\tau) \left[\mathcal{E}(s) - \mathcal{E}(\tau)\right] \right\| + \left\| \left[\mathcal{E}_{av}^{-1}(s) - \mathcal{E}_{av}^{-1}(\tau)\right] \mathcal{L}(\tau)\mathcal{E}(\tau) \right\|. \tag{S100}$$

We know that a physical channel is norm contractive and we will choose a norm respecting $\|\mathcal{E}\| \leq 1$ so that we can use the Schwartz inequality and write $$\|X(\Delta t)\| \leq \frac{\|\mathcal{L}\|}{\Delta t} \int_0^{\Delta t} ds \int_0^{\Delta t} d\tau \, \left\| \mathcal{E}_{av}^{-1}(\tau) \right\| \|\mathcal{E}(s) - \mathcal{E}(\tau)\| + \left\| \mathcal{E}_{av}^{-1}(s) - \mathcal{E}_{av}^{-1}(\tau) \right\|, \tag{S101}$$

where we defined $\|\mathcal{L}\| = \max_s \|\mathcal{L}(s)\|$. The first term in the integral is upper bounded by $$\begin{aligned} \|\mathcal{E}(s) - \mathcal{E}(\tau)\| &= \left\| \int_s^\tau dt \, \dot{\mathcal{E}}(t) \right\| \\ &= \left\| \int_\tau^s dt \, \mathcal{L}(t) \mathcal{E}(t) \right\| \\ &\leq \|\mathcal{L}\| \, |s - \tau|, \end{aligned} \tag{S102}$$

and the second term by $$\begin{aligned} \left\| \mathcal{E}_{av}^{-1}(s) - \mathcal{E}_{av}^{-1}(\tau) \right\| &= \left\| \int_s^\tau dt \, \dot{\mathcal{E}}_{av}^{-1}(t) \right\| \\ &= \left\| \mathcal{L}_{av} \int_s^\tau dt \, \mathcal{E}_{av}^{-1}(t) \right\| \\ &\leq \|\mathcal{L}\| \, \left\| \mathcal{E}_{av}^{-1}(\Delta t) \right\| |s - \tau|. \end{aligned} \tag{S103}$$

In the last line we used that fact that if a physical channel contracts the norm, then its inverse must necessarily increase it which means that for $t_1 > t_2$ we have $\|\mathcal{E}^{-1}(t_1)\| \geq \|\mathcal{E}^{-1}(t_2)\|$ Putting back Eqs. (S102) and (S103) into Eq. (S101), we get $$\begin{aligned} \|X(\Delta t)\| &\leq \frac{2\|\mathcal{L}\|^2}{\Delta t} \left\| \mathcal{E}_{av}^{-1}(\Delta t) \right\| \int_0^{\Delta t} ds \int_0^{\Delta t} d\tau \, |s - \tau| \\ &\leq \frac{2}{3} \|\mathcal{L}\|^2 \Delta t^2 \left\| \mathcal{E}_{av}^{-1}(\Delta t) \right\| \\ &\lesssim \frac{2}{3} \|\mathcal{L}\|^2 \Delta t^2. \end{aligned} \tag{S104}$$

In general, the norm of the average inverse channel can be large, but in our specific case $\Delta t$ is much smaller than any evolution time scale of the average channel, which means that we can approximate $\left\|\mathcal{E}_{av}^{-1}(\Delta t)\right\| \approx 1$. Knowing the error made for each $\Delta t$ step, we get an upper bound for the full evolution $$\|X(t_g)\| \lesssim \frac{2}{3} \|\mathcal{L}\|^2 t_g \Delta t. \tag{S105}$$

What is claimed is:

1. A circuit quantum electrodynamics (circuit QED) implementation of a control-phase quantum logic gate $U_{CP}(\theta)=\text{diag}[1,1,1,e^{i\theta}]$, the circuit QED implementation comprising:

two qubits $Q_i$, where i=1 corresponds to a first qubit $Q_1$ and i=2 corresponds to a second qubit $Q_2$, each having a frequency $\omega_{qi}$ and being characterized by $\hat{\sigma}_{zi}$;

a first resonator $R_a$, associated with the qubit $Q_1$, defined by:
- a resonator frequency $\omega_{ra}$;
- a resonator electromagnetic field characterized by $\hat{a}^\dagger$ and $\hat{a}$;
- a longitudinal coupling strength $g_{1z}$ with the qubit $Q_1$;
- a first longitudinal coupling $g_{1z}\hat{\sigma}_{1z}(\hat{a}^\dagger+\hat{a})$;

wherein a second resonator $R_b$, such that, when the second resonator $R_b$ is independent from $R_a$:

$R_b$ is associated with the qubit $Q_2$;
a longitudinal resonator-resonator coupling $g_{ab}$ is defined and $R_b$ is further defined by:
- a second resonator frequency $\omega_{rb}$;
- a second resonator electromagnetic field characterized by $\hat{b}^\dagger$ and $\hat{b}$;
- a second longitudinal coupling strength $g_{2z}$ with the qubit $Q_2$;
- a second longitudinal coupling $g_{2z}\hat{\sigma}_{2z}(\hat{b}^\dagger+\hat{b})$; and when the second optional resonator $R_b$ is not independent from $R_a$ and integrated into $R_a$:
$R_a$ is associated with the qubit $Q_2$;
the longitudinal resonator-resonator coupling $g_{ab}=1$;
the second resonator electromagnetic field is characterized by $\hat{a}^\dagger$ and $\hat{a}$ where $\hat{b}^\dagger=\hat{a}^\dagger$ and $\hat{b}=\hat{a}$;
the second resonator frequency $\omega_{rb}=\omega_{ra}$;
the second longitudinal coupling strength $g_{2z}$ is between the qubit $Q_2$ and $R_a$;
the second first longitudinal coupling $g_{2z}\hat{\sigma}_{2z}(\hat{b}^\dagger+\hat{b})$ is defined by $R_a$ as $g_{2z}\hat{\sigma}_{2z}(\hat{a}^\dagger+\hat{a})$; and a modulator periodically modulating, at a frequency $\omega_m$ during a time t, the longitudinal coupling strengths $g_{1z}$ and $g_{2z}$ with respective signals of respective amplitudes $\tilde{g}_1$ and $\tilde{g}_2$, wherein selecting a defined value for each of t, $g_{1z}$ and $g_{2z}$ determines $\theta$ to specify the quantum logical operation performed by the control-phase quantum logic gate and wherein when the qubit $Q_1$ and the qubit $Q_2$ are decoupled when either one of the defined value of $g_{1z}$ and the defined value of $g_{2z}$ is to set to 0.

2. The circuit QED implementation of claim 1, further comprising a transmitter for selectively providing a modulator activation signal to the modulator for activating the modulator for the duration t.

3. The circuit QED implementation of claim 1, further comprising a signal injector providing a squeezed input to diminish a which-qubit-state information.

4. The circuit QED implementation of claim 3, wherein the squeezed input is a single-mode squeezed input.

5. The circuit QED implementation of claim 3, wherein the squeezed input is a two-mode squeezed input.

6. The circuit QED implementation of claim 3, wherein the signal injector relies on broadband squeezed centered at $\omega_{rb}$ and/or $\omega_{ra}$.

7. The circuit QED implementation of claim 1, wherein the qubit $Q_1$ and the qubit $Q_2$ are transmons each comprising two Josephson junctions with respectively substantially equivalent capacitive values and the modulator comprises an inductor-capacitor (LC) oscillator, the longitudinal coupling resulting from mutual inductance between the oscillator and the transmons, the oscillator varying a flux $\Phi_1$ in the qubit $Q_1$ and a flux $\Phi_2$ in the qubit $Q_2$.

8. The circuit QED implementation of claim 7, wherein a 3-Wave mixing Josephson dipole element is used to couple the qubit $Q_1$ and the resonator $R_a$.

9. A method for specifying a quantum logical operation performed by a control-phase quantum logic gate $U_{CP}(\theta)=\text{diag}[1,1,1,e^{i\theta}]$, wherein the circuit QED implementation comprises (I) two qubit $Q_i$, where i=1 corresponds to a first qubit $Q_1$ and i=2 corresponds to a second qubit $Q_2$, each having a frequency $\omega_{qi}$ and being characterized by $\hat{\sigma}_{zi}$; (II) a first resonator $R_a$, associated with the qubit $Q_1$, defined by a first resonator frequency $\omega_{ra}$, a first resonator electromagnetic field characterized by $\hat{a}^\dagger$ and $\hat{a}$, a first longitudinal coupling strength $g_{1z}$ with the qubit $Q_1$ and a first longitudinal coupling $g_{1z}\hat{\sigma}_{1z}(\hat{a}^\dagger+\hat{a})$; (III) a second resonator $R_b$, such that, when the second resonator $R_b$ is independent from $R_a$, $R_b$ is associated with the qubit $Q_2$, a longitudinal resonator-resonator coupling $g_{ab}$ is defined and $R_b$ is further defined by: a second resonator frequency $\omega_{rb}$, a second resonator electromagnetic field characterized by $\hat{b}^\dagger$ and $\hat{b}$, a second longitudinal coupling strength $g_{2z}$ with the qubit $Q_2$, a second first longitudinal coupling $g_{2z}\hat{\sigma}_2(\hat{b}^\dagger+\hat{b})$ and (IV), when the second optional resonator $R_b$ is not independent from $R_a$ and integrated into $R_a$, $R_a$ is associated with the qubit $Q_2$, the longitudinal resonator-resonator coupling $g_{ab}=1$, the second resonator electromagnetic field is characterized by $\hat{a}^\dagger$ and $\hat{a}$ where $\hat{b}^\dagger=\hat{a}^\dagger$ and $\hat{b}=\hat{a}$, the second resonator frequency $\omega_{rb}=\omega_{ra}$, the second longitudinal coupling strength $g_{2z}$, is between the qubit $Q_2$ and $R_a$, the second longitudinal coupling $g_{2z}\hat{\sigma}_{2z}(\hat{b}^\dagger+\hat{b})$ is defined by $R_a$ as $g_{2z}\hat{\sigma}_{2z}(\hat{a}^\dagger+\hat{a})$, the method comprising:

periodically modulating, at a frequency $\omega_m$ during a time t, the longitudinal coupling strengths $g_{1z}$ and $g_{2z}$ with respective signals of respective amplitudes $\tilde{g}_1$ and $\tilde{g}_2$;

selecting a defined value for each of t, $g_{1z}$ and $g_{2z}$, thereby fixing $\theta$ to specify the quantum logical operation performed by the control-phase quantum logic gate; and setting at least one of the defined value of $g_{1z}$ and the defined value of $g_{2z}$, is to 0 to decouple the qubit $Q_1$ from the qubit $Q_2$.

10. The method of claim 9, wherein selecting the defined value for each of t, $g_{1z}$ and $g_{2z}$ comprise a selectively providing a modulator activation signal to the modulator for activating the modulator for the duration t.

11. The method of claim 9 or claim 10, further comprising providing a squeezed input to diminish a which-qubit-state information.

12. The method of claim 11, wherein the squeezed input is a single-mode squeezed input.

13. The method of claim 11, wherein the squeezed input is a two-mode squeezed input.

14. The method of claim 11, wherein the squeezed input relies on broadband squeezed centered at $\omega_{rb}$ and/or $\omega_{ra}$.

15. The method of claim 9, wherein the qubit $Q_1$ and the qubit $Q_2$ are transmons each comprising two Josephson junctions with respectively substantially equivalent capacitive values and the modulator comprises an inductor-capacitor (LC) oscillator, the longitudinal coupling resulting from mutual inductance between the oscillator and the transmons, the oscillator varying a flux $\Phi_1$ in the qubit $Q_1$ and a flux $\Phi_2$ in the qubit $Q_2$.

16. The method of claim 15, wherein a 3-Wave mixing Josephson dipole element is used to couple the qubit $Q_1$ and the resonator $R_a$.

* * * * *